(12) United States Patent
Norman

(10) Patent No.: US 11,010,800 B2
(45) Date of Patent: May 18, 2021

(54) MADE-TO-ORDER DIRECT DIGITAL MANUFACTURING ENTERPRISE

(71) Applicant: KRAFTWÜRX, INC., Cypress, TX (US)

(72) Inventor: Bryan C. Norman, Hempstead, TX (US)

(*) Notice: Subject to any disclaimer, the term of this patent is extended or adjusted under 35 U.S.C. 154(b) by 0 days.

(21) Appl. No.: 16/134,717

(22) Filed: Sep. 18, 2018

(65) Prior Publication Data
US 2019/0102815 A1 Apr. 4, 2019

Related U.S. Application Data

(63) Continuation of application No. 15/893,179, filed on Feb. 9, 2018, now Pat. No. 10,089,662, which is a continuation of application No. 13/374,062, filed on Dec. 9, 2011, now abandoned, which is a continuation of application No. 13/134,581, filed on Jun. 10, 2011, now Pat. No. 8,515,826, which is a continuation-in-part of application No. 11/750,499, filed on May 18, 2007, now abandoned.

(60) Provisional application No. 60/747,601, filed on May 18, 2006.

(51) Int. Cl.
| | |
|---|---|
| G06Q 30/00 | (2012.01) |
| G06Q 30/06 | (2012.01) |
| B33Y 80/00 | (2015.01) |
| B33Y 50/00 | (2015.01) |

(52) U.S. Cl.
CPC ......... *G06Q 30/06* (2013.01); *G06Q 30/0621* (2013.01); *B33Y 50/00* (2014.12); *B33Y 80/00* (2014.12)

(58) Field of Classification Search
CPC ............... G06Q 30/0601–0645; G06Q 30/80

USPC ..... 705/26.1, 26.2, 26.25, 26.3, 26.35, 26.4, 705/26.41, 26.42, 26.43, 26.44, 26.5, 705/26.6, 26.61, 26.62, 26.63, 26.64, 705/26.7, 26.8, 26.81, 26.82, 26.9, 27.1, 705/27.2

See application file for complete search history.

(56) References Cited

U.S. PATENT DOCUMENTS

| | | |
|---|---|---|
| 6,489,957 B1 | 12/2002 | Han et al. |
| 6,985,876 B1 | 1/2006 | Lee |
| 8,285,678 B2 | 10/2012 | Moore, Jr. et al. |
| 8,583,272 B2 | 11/2013 | Spector |
| 8,762,173 B2 | 6/2014 | Wasson et al. |
| 9,229,674 B2 | 1/2016 | Tapley et al. |
| 9,623,578 B1 | 4/2017 | Aminpour et al. |
| 2002/0032573 A1 | 3/2002 | Williams et al. |
| 2002/0156694 A1 | 10/2002 | Christensen et al. |

(Continued)

OTHER PUBLICATIONS

Tinham, Brian, "Jewel in the crown technology plus craft," Manufacturing Computer Solutions, Apr. 2004, pp. 16-18.

*Primary Examiner* — Brandy A Zukanovich

(57) ABSTRACT

Methods and systems for designing and producing a three-dimensional object selection of a base three-dimensional object from a customer device. A base three-dimensional model corresponding to the object is displayed on the customer device, and one or more custom modifications are received. A modified three-dimensional model corresponding to the modified object is prepared and displayed. Once confirmation to produce the modified object is received, data corresponding to the modified three-dimensional model is transmitted to a manufacturing device for production of the object, using the data to do so, such that the object corresponds directly to the modified three-dimensional model.

20 Claims, 32 Drawing Sheets

(56) References Cited

U.S. PATENT DOCUMENTS

| | | |
|---|---|---|
| 2002/0161668 A1 | 10/2002 | Lutz et al. |
| 2003/0035138 A1 | 2/2003 | Schilling |
| 2004/0133431 A1 | 7/2004 | Udiljak et al. |
| 2005/0023710 A1 | 2/2005 | Brodkin et al. |
| 2005/0043835 A1 | 2/2005 | Christensen |
| 2005/0133955 A1 | 6/2005 | Christensen |
| 2005/0162689 A1 | 7/2005 | Rortocil |
| 2005/0289018 A1 | 12/2005 | Sullivan et al. |
| 2006/0188145 A1 | 8/2006 | Song et al. |
| 2006/0253214 A1 | 11/2006 | Gross |
| 2007/0156540 A1 | 7/2007 | Koren et al. |
| 2007/0283275 A1 | 12/2007 | Azam |
| 2011/0145100 A1 | 6/2011 | Berger et al. |
| 2011/0282476 A1 | 11/2011 | Hegemier et al. |

INPUT/OUTPUT CONTROL SYSTEM

- Associate customer with tracking method for design session
- Process search/browse request(s) from customer session
- Process product selection request(s) for customer session
- Process customer-specific 3D file(s) to write to temp storage
- Process request for design interface for product(s)
- Push design modifications to 3D engine iteratively
- Process iterative customization requests as needed
- Process order upon customer confirmation route for mfg.

FIG. 5B

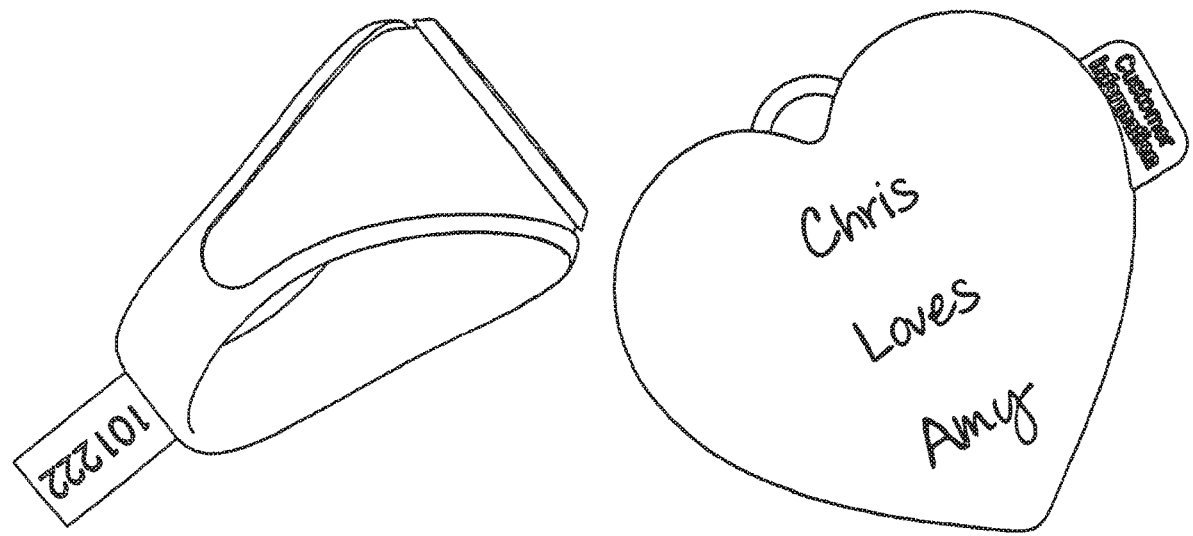
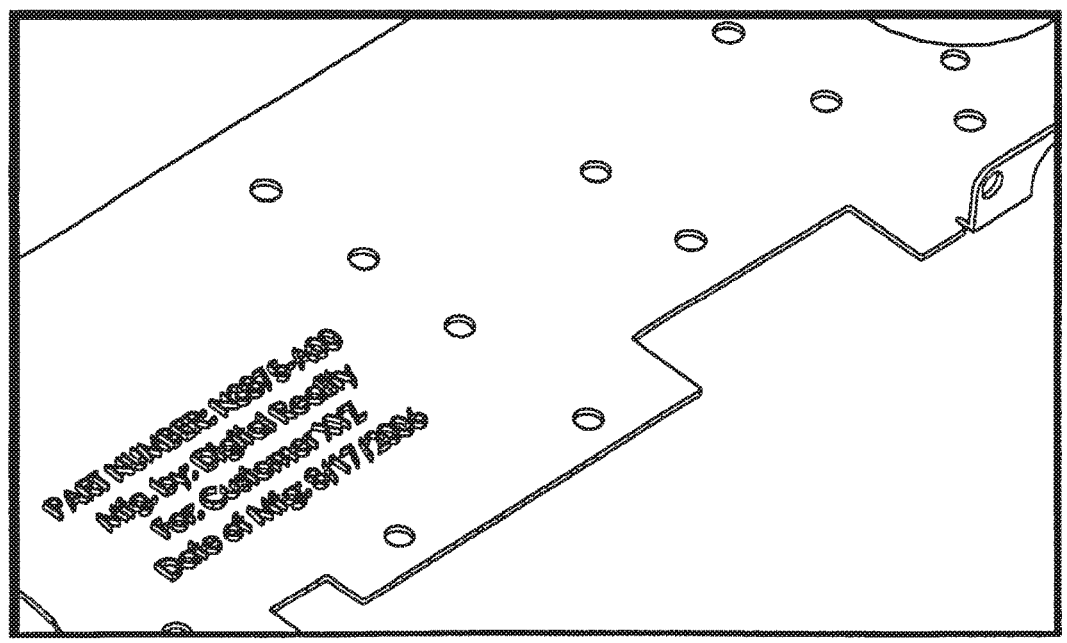
FIG. 14

MADE-TO-ORDER DIRECT DIGITAL MANUFACTURING ENTERPRISE

CROSS REFERENCE TO RELATED APPLICATIONS

The present application is a continuation application of U.S. Ser. No. 15/893,179, filed Feb. 9, 2018, which is a continuation application of U.S. Ser. No. 13/374,062, filed Dec. 9, 2011, which claims priority to U.S. Pat. No. 8,515,826, filed Jun. 10, 2011, which claims priority to U.S. Ser. No. 11/750,499, filed May 18, 2007, which in turn claims priority to the U.S. Provisional Ser. No. 60/747,601, filed May 18, 2006. Each of the above-referenced applications is incorporated by reference herein in their entirety.

Pursuant to 37 CFR 1.84(s) the named inventor and copyright holder on patent application Ser. No. 16/134,717 makes the following statement:

A Portion of the disclosure of this patent document contains material which is subject to (copyright or mask work) protection. The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever.

FIELD OF THE INVENTION

The present invention relates to the design, sale and manufacture of made-to-order or mass-customized products. More specifically to a computer-based method and system for customer-driven design, sale and manufacturing of unique or custom-made product(s) exclusively through a highly efficient sales & manufacturing system which advantageously combines key elements of computer aided design methodologies, the internet and Additive Fabrication methodologies to personalize or customize said products.

BACKGROUND OF THE INVENTION

The customization of durable goods products is a desirable characteristic that many retail markets would enjoy being able to broadly utilize and many consumers would enjoy broadening their product selection and bringing what they buy closer to what they want. Unfortunately sales, distribution and manufacturing systems designed to deliver mass-manufactured goods to consumers and or job-shops that do custom manufacturing are not positioned to effectively deliver mass-customization, generally placing custom-designed products out of the reach of consumers. Additionally, the machines, methods and labor are ineffective at delivering customization cost-effectively. An example is the manufacture of class rings or other jewelry. The diversity of these products is defined by the selection of molds and tooling used to inject wax which is used to cast the final product. A manufacturer cannot provide an infinite product selection or face the challenge of also producing and storing an infinite number of molds and tooling parts.

The customization characteristics desired by individuals are diverse and therefore, the method is applicable to a wide array of products. For example; a customer may desire a custom-designed broach or ring that contains a 3D representation of a family crest or insignia. To obtain this custom product requires specialized training including 3D CAD modeling and design experience or at the very least CNC programming experience. Other customizable products might include custom valve covers for a hotrod. Designing these products and having them manufactured by CNC machining would be expensive and, the equipment necessary is not normally available to the general public nor are the operating procedures of the equipment. Therefore; customization options for consumers are often limited and access to customization of products is difficult. The result is that individual needs and or desires are not always met and customers therefore settle for less than what they wanted or desired.

Computer-based networks, access systems, websites, databases, processing speeds and 3D geometry manipulation have reached a sufficient level of performance to provide consumers with the ability to drive changes to products themselves in many aspects. Consumer capabilities to understand such systems have also reached a level sufficient for consumers to realistically be involved in at least some aspects of a design process, for example those that do not cause risk to a customer or liability to a manufacturer as defined by constraints preventing a customer from violating the constraints during design for personalization or customization.

Computer-based geospatial/3D design & design implementation systems are based on point-of-use deployment models. Such systems are also intended for use by someone skilled in the art of CAD/CAM and design methodologies. This effectively means that manipulation of the geospatial/3D geometries commonly called CAD models requires advanced knowledge and significant time to develop. When properties such as structural integrity or thermal properties are involved, even basic design skills for 3D move out of the realm of consumers with basic skills in this area, often to an advanced engineer-level which is beyond the comprehension of the general public. CAD systems are also precise and unforgiving in many aspects of their use. Some examples of 3D design tools include Autodesk Inventor, Solidworks, Unigraphics, CATIA, Mechanical Desktop, MAYA, Rhino 3D, 3D Studio Max and more.

Computer-based 3D design and design implementation systems are required to produce a product by additive fabrication methods. Such systems are costly and must be purchased by a user and added to the user's computer. The user must also learn how to use the system, the engineering behind designing a product and finally, locate a facility to produce the product. Also, designing a product from scratch is time consuming, even for someone skilled in the art of CAD/CAM design, engineering and manufacturing.

Rapid Prototyping and Additive Freeform Fabrication are used interchangeably to describe technologies that have been developed to create or "manifest" 3D objects representative of computer-based geospatial/3D geometry through the process of depositing materials in an additive or layered process, resulting in a net or near-net shaped product conforming to the dimensions of the 3D computer-based geometry upon which such an object is based without tooling or molds or much of the labor required in traditional subtractive methods of manufacture. At present there are approximately 25 additive fabrication processes covered by various patents. Each technology has inherent limitations and benefits including the feature resolution, materials that the technology can use, speed, surface finish and a plethora of other parameters by which a part can be measured however; the deployment model of such technology is, for the most part, considered for prototyping and not for direct digital manufacturing. For example; a wax polymer is ideal for the manufacture, by lost wax investment casting, of custom jewelry. Solid-Scape additive fabrication technology is ideally suited for the manufacture of jewelry. Solid-Scape hardware is capable of printing or manifesting, at high resolution in a relatively small build envelope. Other technologies, such as Selective Laser Sintering from EQS are suited for the manufacture of larger components made from nylon materials or a limited selection of metals however the surface finish of the SLS process is considered rough when compared to other processes.

Current deployment methodologies in use for both CAD/CAM systems and additive fabrication technologies limit the widespread use of the aforementioned technologies. For example, manufacturing more than a small lot of products on any given machine in a reasonable timeframe is thwarted by throughput. However, if machines in one location were linked to machines in multiple distributed locations, the effective capacity would be greatly increased. The net result of these differences is that all of the various additive fabrication processes may be required to provide the net result of a finished product consistent with expectations for a particular product.

Since it is prohibitive for any one facility to own every machine of every type from every manufacturer, it is advantageous to link many facilities together, further realizing the full potential of additive fabrications.

Computer-based implementations of Product Lifecycle Management (PLM), Product Data Management (PDM), Master Production Scheduling, part routing and part nesting systems are capable of intelligent and automated actions to manage decisions for operations in a production capacity and planning system and can include other intelligent decision-making abilities such as procurement and inventory management but they are designed to move "real" products, not virtual products through the system.

It is therefore beneficial to effectively combine additive fabrication, Computer Aided Design methods, capacity planning and the Internet with automated PDM!PLM production scheduling and routing systems in a manner that enable deployment of additive fabrication methods and technologies as an Enterprise Resource Planning (ERP) production system. As such, embodiments of the present invention advantageously create a disruptively competitive and efficient system for the design, sale and manufacture of individualized or customized products by synergistically combining facets of many technologies into a more productive method and tool.

SUMMARY OF THE INVENTION

In light of the preceding background, embodiments of the present invention provide methods and systems for user/customer selection, design, sale and manufacture of customized/personalized products through a streamlined and/or automated or semi-automated process combining computers, the internet, 3D modeling (also called CAD modeling), a customization interface including an interactive controls suite connected to the 3D modeling system for the purpose of allowing a user/customer to personalize or customize a product represented by a 3D geometry or multiple 3D geometries, whereby the user/customer is connected to the Cad modeling system through a website or web portal along with a 3D viewer connected to the 3D CAD geometry manipulation system for the purpose of providing design feedback and pre-purchase visualization to said user/customer accessing the system through said website or web portal, whereby said product is manifested in an automated or semi-automated fashion via additive fabrication methodologies. Embodiments of the present invention improve operational performance in a design, sale and manufacturing system to design, manufacture and sell a wide variety of products which can be adequately defined by one or more computer-based design and design implementation methods to 3D geometry manipulation where said geometry can be properly manifested by any additive fabrication technique.

According to one embodiment of the present invention, the method is carried out by a computer-based system which includes at a minimum; a computer, a software-based geospatial/3D modeling engine (a CAD engine), input/output controls to the 3D modeling engine, a 3D viewer engine, a database or file system and a production routing and scheduling system interconnected with additive fabrication hardware.

Embodiments of the invention are designed to interface a customer directly with the digital representation of their intended physical manifestation, thereafter referred to as a product. In essence, the customer is peering through an internet "portal" at the customer's unique product and can interact with it during the design process. Any changes made by the user of the system that occur to the product become unique facets of the particular product the user/customer is building or creating for purchase. Embodiments of the system are capable of interfacing with a plurality of customers simultaneously and are designed to do so.

Another embodiment of the invention can automate most, and in some cases all, of the post-sale production operation, thereby removing most, if not all, of the human factor requirements from the system and thereby removing or minimizing the number of people involved within production environment, further optimizing the manufacturing process, maximizing productivity and minimizing labor needs.

Advantageously, embodiments of the system are conceived to be capable of assembling and modifying 3D components of a customer's unique product in increments measured in milliseconds while the product exists as a mathematically-derived 3D model or models. This is many orders of magnitude faster than any other known production system available today.

Embodiments of the method and system can utilize additive fabrication for manifestation of a unique product or component(s) of a product, thereby making the systems' inventory highly flexible. Embodiments of the system are designed to use the full gamut of available Additive Freeform Fabrication technologies collectively making possible production of products with diverse materials. Since embodiments methods and systems are developed around the concept of 3D geometry and CAD modeling, the methods described herein can include future Additive Freeform Fabrication technologies as the intended output technique inasmuch as the additive fabrication technique relies on 3D data as the basis for output through the additive methodology.

Furthermore, embodiments of the present system provide a completely flexible and scalable production operation. Deployment models may include an "in-house" model where all additive fabrication hardware resides in a single facility or at multiple facilities including diverse and/or divergent locations. Capacity within a locally deployed system can be expanded by purchasing additional Additive Freeform Fabrication hardware and adding it to the system or by taking advantage of distributed networking, the internet and available additive fabrication hardware available at other facilities. These facilities may include bureaus or other manufacturers using one or more embodiments of the present system(s).

Furthermore, embodiments of the present invention may make use of multiple types of additive fabrication hardware simultaneously or concurrently to manifest a plurality of components of an assembly for a product that is, by design or by desire, necessary to be made of different materials and assembled from the various components. The system in this situation would be responsible for routing components that must be manifested out of differing materials to several or many local or remote locations for fabrication via additive fabrication processes that support fabrication of the desired or required material substance. Examples of this material might include metals of varying natures, plastics or polymers of varying nature, waxes or even composites or slurries. Such varying needs can require use of the entire gamut of Additive Freeform Fabrication hardware.

In another embodiment, the method and system can be accessed by a user/customer via one or more communication methods whereby the user/customer accesses the system over the communication network, the method providing the user a plurality of product selections to said user/customer back through the communication method, receiving from said user/customer via the communication method a selection of a product or products, and providing said user a customization/personalization interface, the customization/personalization interface providing at least one personalization/customization tool or option to said user/customer to create an individually customized product and whereby said customization/personalization option does not violate any parameter prevention its manifestation through Additive Fabrication methodologies.

Wherein the summary of the invention provided, including certain aspects, advantages and novelty of the invention have been described herein. It is thoroughly understood to one skilled in the art, that not necessarily all such advantages may be achieved in accordance with any particular embodiment of the invention. Thus; the invention may potentially be carried out in one or more manners that optimize one or more advantages as described herein without achieving other advantages as described herein.

These and other embodiments of the present invention shall become apparent to anyone skilled in the art whom review the detailed description of the embodiments herein including but not limited to figures, features, or other descriptions disclosed.

DESCRIPTION OF RELATED ART

Software applications for CAD modeling exemplified by those from Solidworks Corporation and Autodesk, Inc., include tools designed to provide for mechanical deformation and or mechanical assembly of a plurality of individual 3D parts to create an "assembly" where each discrete component is represented in the assembly as a 3D model and therefore the assembly is also a 3D model. The purpose of said software is mechanical design and design validation. Said software was intended to be utilized for the purpose of design and design validation by a designer or more specifically a design engineer who is someone that understands the intricacies of mechanical fit and function.

Manipulating a single file that is part of an assembly in Solidworks, Inventor and other mechanical design software can impact an assembly of parts and therefore the assembly will also reflect the modifications including feedback on collisions of parts and an inability for the combination to exist physically. Solidworks patent U.S. Pat. No. 6,308,144 encompasses some of the concepts of moving and or repositioning objects in an electronic manner representative of mechanical assembly of physical products. Autodesk also has a similar assembly method within their software that electronically "bonds" 3D objects in the computer in a manner similar to Solidworks. Such is the nature of mechanical design software, to validate and help drive accurate and meaningful reduction in design cycle times by allowing an engineer to design the product virtually. Without this assembly methodology, the design and analysis would not be possible.

All 3D design and modeling software is built on a commercially available 3D CAD engine. The most popular 3D CAD engine today is made by Parasolid and embodied in U.S. Pat. No. 6,489,957; "Three dimensional geometric modeling system with multiple concurrent geometric engines". Other 3D CAD engines exist such as an older system called ASIS. Other CAD systems exist. Most products including Parasolid are available commercially for purchase and licensing, just as they are to Solidworks.

3D viewer technology exists in a plethora of formats including the most popular format, Open GL. 3D viewers exist and render 3D geometries represented by mathematics on a computer screen, often seen at CAD workstations, in video games or other graphics applications for the purpose of providing the design engineer or artist the ability to see feedback of a 3D model on their design choices iteratively. 3D rendering and viewer engines are also used on the internet to provide, interactive catalogues of 3D models that a user can download and then use in their own designs or modify mechanically via software including Solidworks. These systems are used to provide only CAD models that are used by design engineers.

Solidworks 3D parts Stream is an interactive catalogue. It is a supplemental application of the Solidworks product which utilizes API-calls to the Solidworks software application to cause the software to manipulate geometry and deliver the results through a visualization system of products through a networked or internet-based system. The intended use of this system is to create 3D models that can then be downloaded and embedded in 3D designs during product design and validation processes as a time-saving tool. Furthermore, the 3D parts Stream product relies on the Solidworks software which in and of itself has limited or rigid functionality such as a very rudimentary ability to manipulate textual information. Furthermore; the output of the Solidworks application terminates as a 3D model which can then be embedded into a product development design. The product and process is intended as a time-saving apparatus for product design and validation. This is analogous to providing a way so that the design engineer does not have to re-draw a washer or castor or screw or some other part every time they need such a part for a new product they are designing. Solidworks brochure for the product states; "A 3D-powered catalog that allows components to be quickly downloaded and "designed in" offers greater convenience for the product designer." Thus is the scope of the 3D parts Stream intended use.

Rapid Prototyping or Additive Freeform Fabrication hardware of many types exist and are used today to provide prototype and limited-production output of 3D models to be used in visualization and low-cost, high-accuracy sample production during the design process, hence the name Rapid Prototyping. To date, some companies are also utilizing Rapid Prototyping or Additive Freeform Fabrication hardware for limited production of products intended for functional end use directly from, or with minimal post processing, directly from the product manifestation via Additive Freeform Fabrication.

Available CAD systems for purchase today are either mechanical design in nature or artistic in nature. Both systems have their merits and both systems have their drawbacks. Mechanical systems lack many of the aesthetic or Industrial Design elements of product design and manipulation software. Industrial Design or artistic software lacks the exacting controls necessary to define a mechanical system. Neither system is developed nor intended to be accessed and driven by a typical consumer wherein the consumer is one not skilled in the art of 3D design. The limitations of mechanical design systems extend to text information, fonts, complex or ergonomic or aesthetically please design elements.

Furthermore the systems and methods described as prior art above are not known to be combined in any manner or similar nature for the purpose or spirit of use as a complete manufacturing enterprise system in any resemblance of the method described herein, a Made-To-Order Digital Manufacturing Enterprise System which; combines one or more computer based design or design implementation methods (CAD/CAM) systems, the internet, websites, or web portals, e-commerce systems, Product Data management, product lifecycle management, master production scheduling, routing & nesting systems into a consolidated system designed exclusively for customer-driven design or design modification to geospatial/3D files which represent the final product.

U.S. Pat. No. 7,216,092 Weber, Et Al embodies a patent related to mass-customization of products in a vague similarity as the patent embodied herein however; the primary differentiator is that U.S. Pat. No. 7,216,092 is obviously, to one skilled in the art, intended for 2-dimensional printed merchandise and not geospatial/3D products. Furthermore, U.S. Pat. No. 7,216,092 embodies at least some techniques and concepts already in practice, for example, www.vistaprint.com has been using a website-based user/customer driven design system for approximately 7 years in customer-driven design and manufacture of custom printed business cards and stationary including; a database for storing and retrieving designs created by a customer through the system. Furthermore; U.S. Pat. No. 7,216,092 discloses a purpose for design by an individual and not a collaborative group.

There is no known prior art combining the methods and systems described herein including; geospatial/3D CAD/CAM data, presented to a user/customer, whereby the actual geospatial/3D geometry presented to the customer is used for purchase intent, including modification or customization for the purpose of modifying to suit individual tastes or preferences is done so through the website or web portal with the intent is purchase by the user who is considered to also be a user/customer and the product is produced in an automated or semi-automated production method including scheduling, routing and automation or semi-automatic manifestation of said part or assembly via Additive Freeform Fabrication where the output of the Additive Fabrication process or processes is considered the final product or where parts together, produced by Additive Fabrication methods collectively comprise a product for purchase through such a system.

Finally, there is no know practiced application of said method or system registered or in use through the internet by consumers which shows prior art as described herein.

BRIEF DESCRIPTION OF THE DRAWINGS

Figure 1:
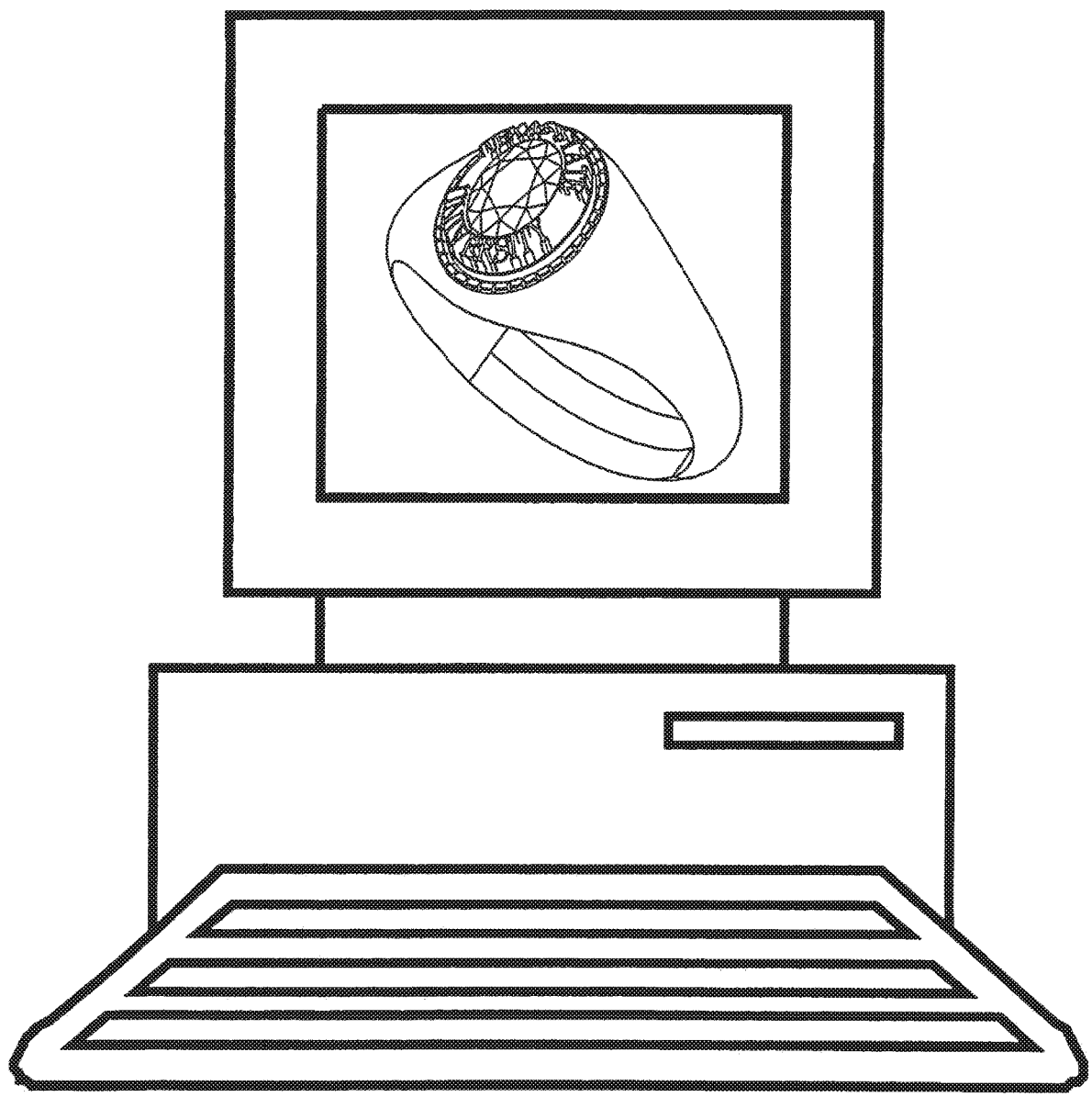

Having thus described the invention in general terms, reference will now be made to the accompanying drawings by example where the drawings are intended to illustrate and not limit the invention wherein;

FIG. 1 depicts the creation of a geospatial/3D CAD model representing a product is established within a CAD system.

Figure 2:
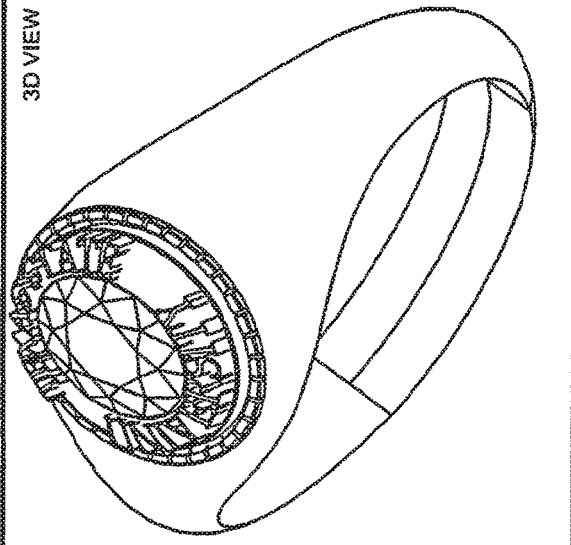

FIG. 2 depicts a website or web portal as part of the method and system for user/customer-driven selection, design, purchase and manufacture.

Figure 3:
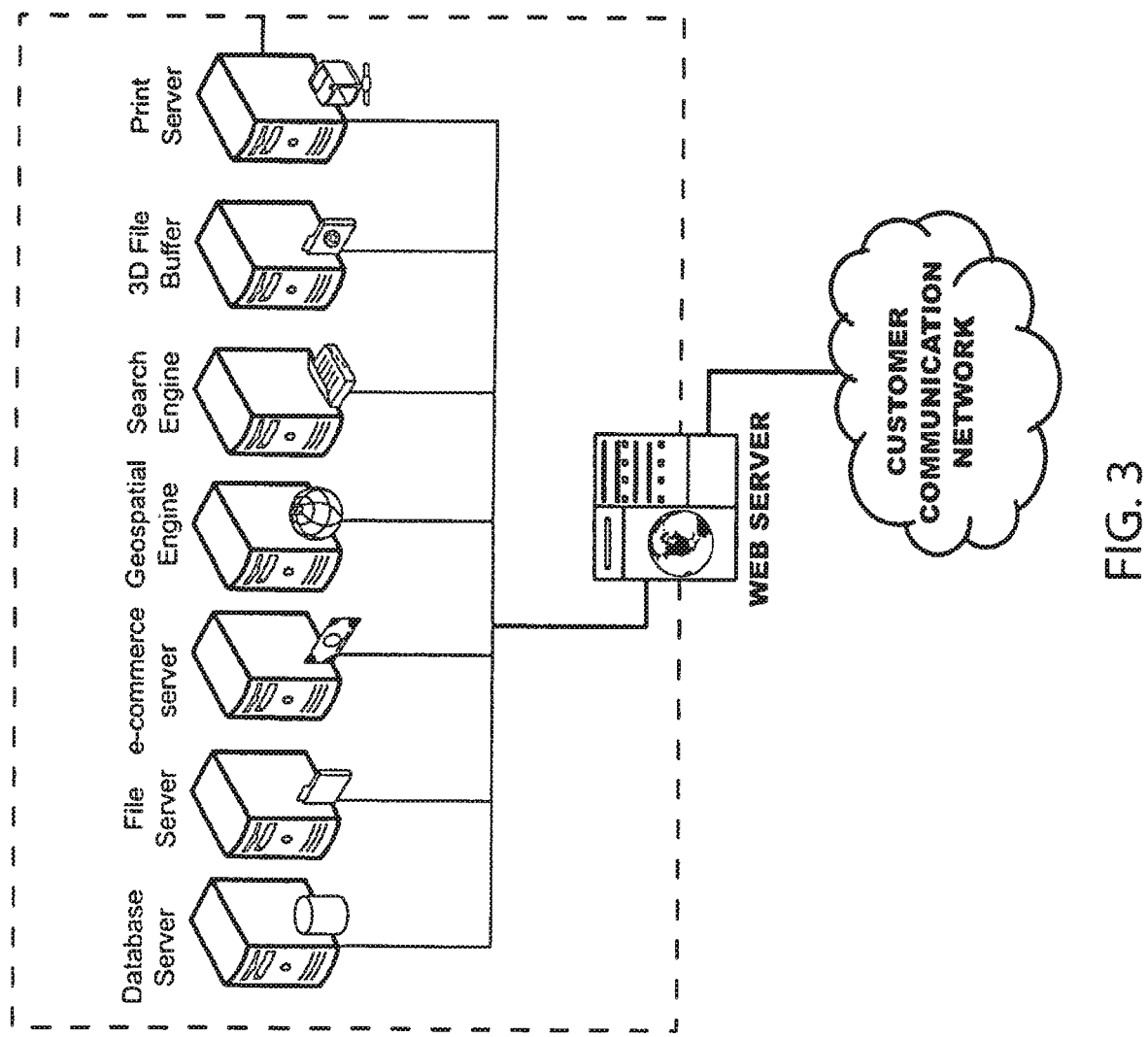

FIG. 3 depicts the computer-based system carrying out a preferred embodiment of the present method.

Figure 4:
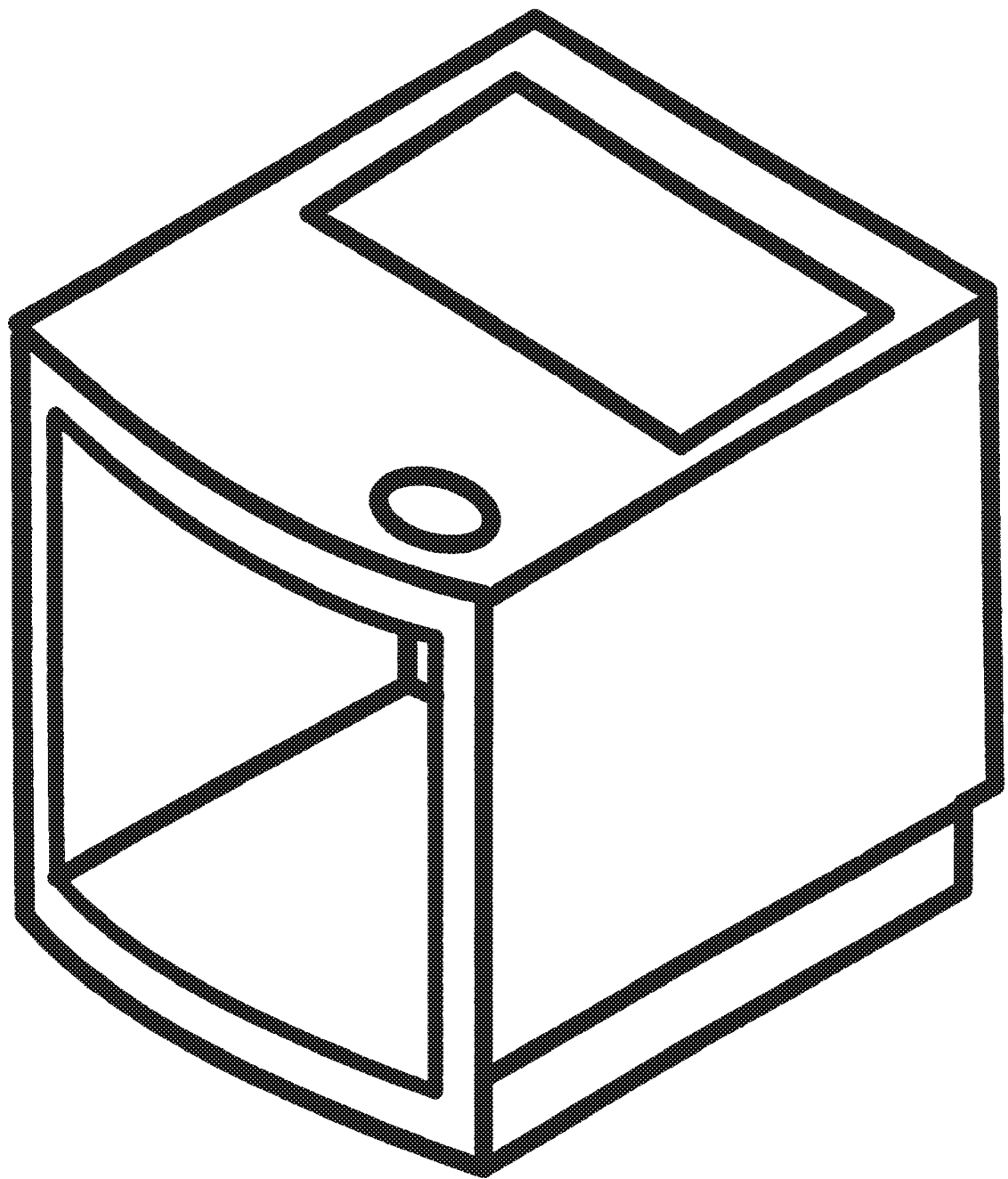

FIG. 4 depicts an additive fabrication machine or 3D printer.

Figure 5:
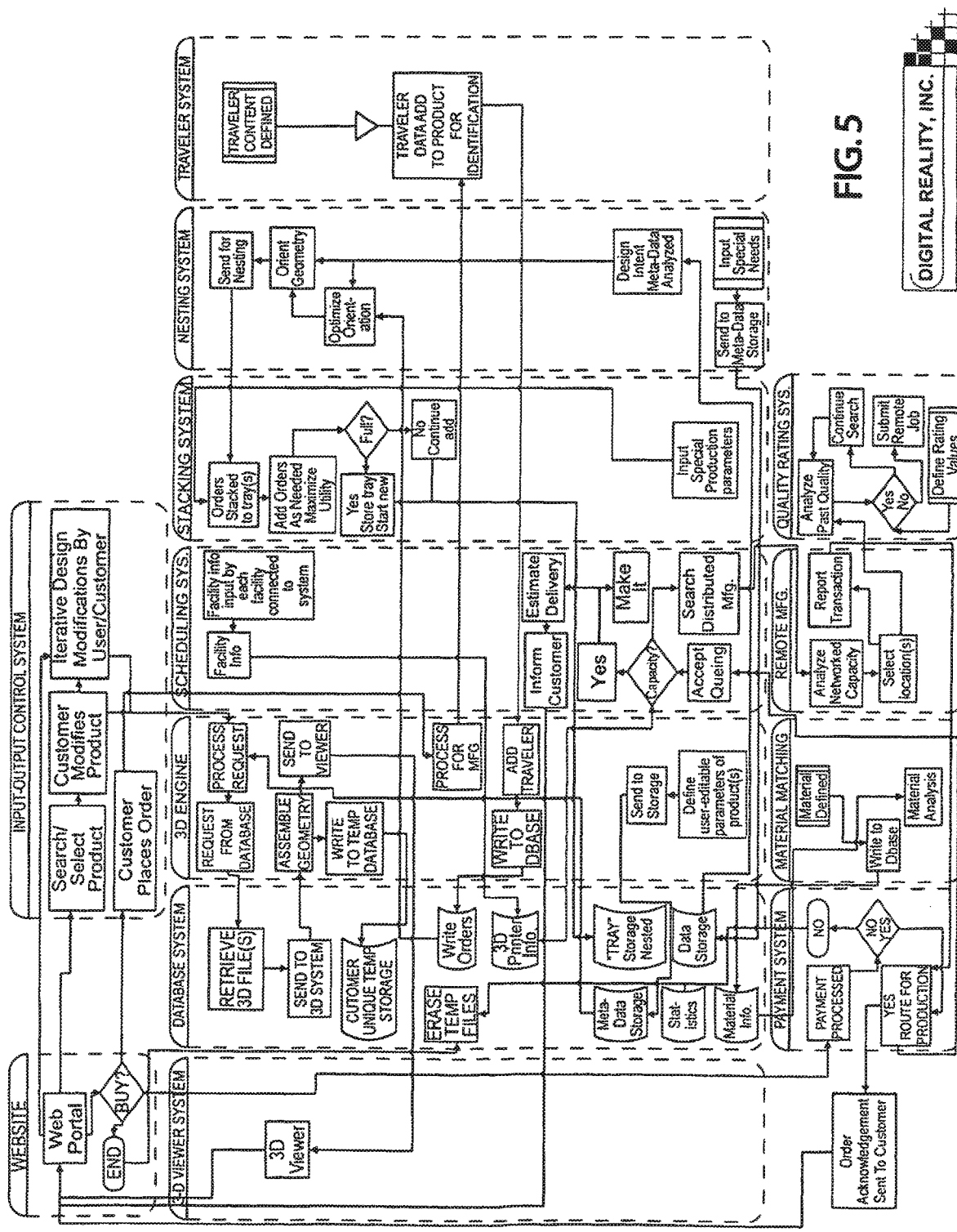

FIG. 5 is a flow diagram depicting an embodiment of the present method.

Figure 5A:
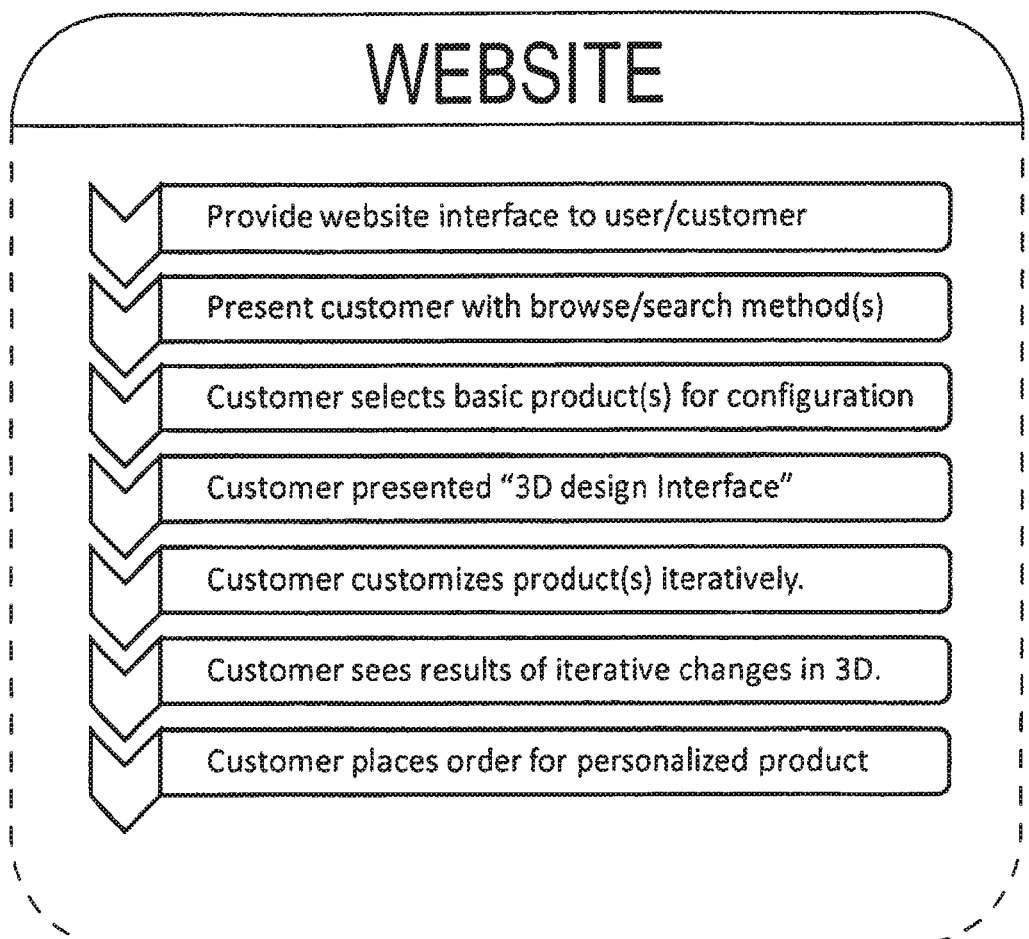

FIG. 5A depicts an embodiment of a method for using a web portal or website system.

FIG. 5B depicts an embodiment of a method for using the interface providing user/customers the ability to interact with and drive iterative design changes to their product into a 3D engine.

Figure 5C:
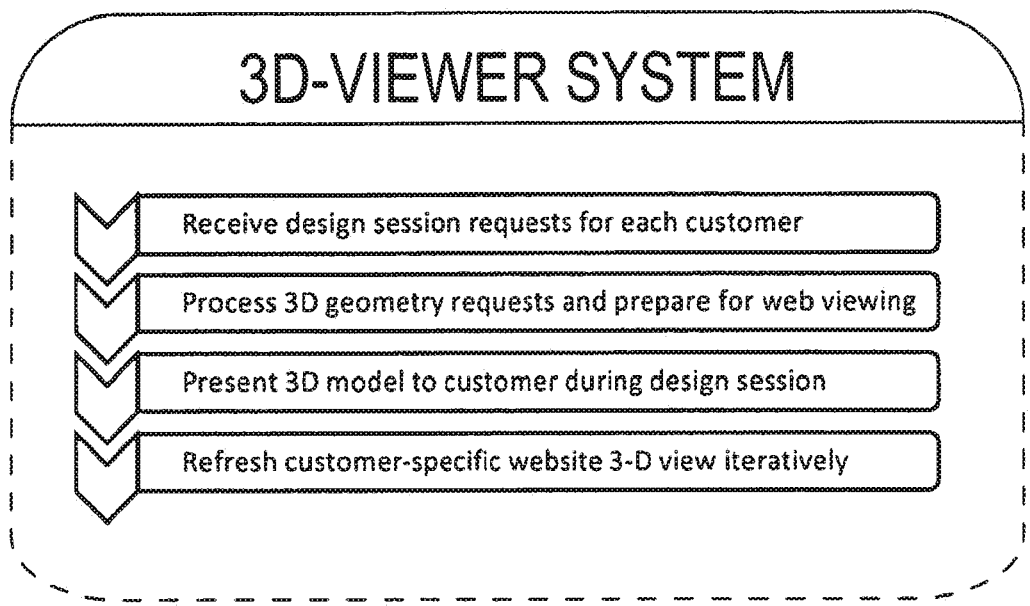

FIG. 5C depicts an embodiment of a method for using a 3D viewer or rendering engine.

Figure 5D:
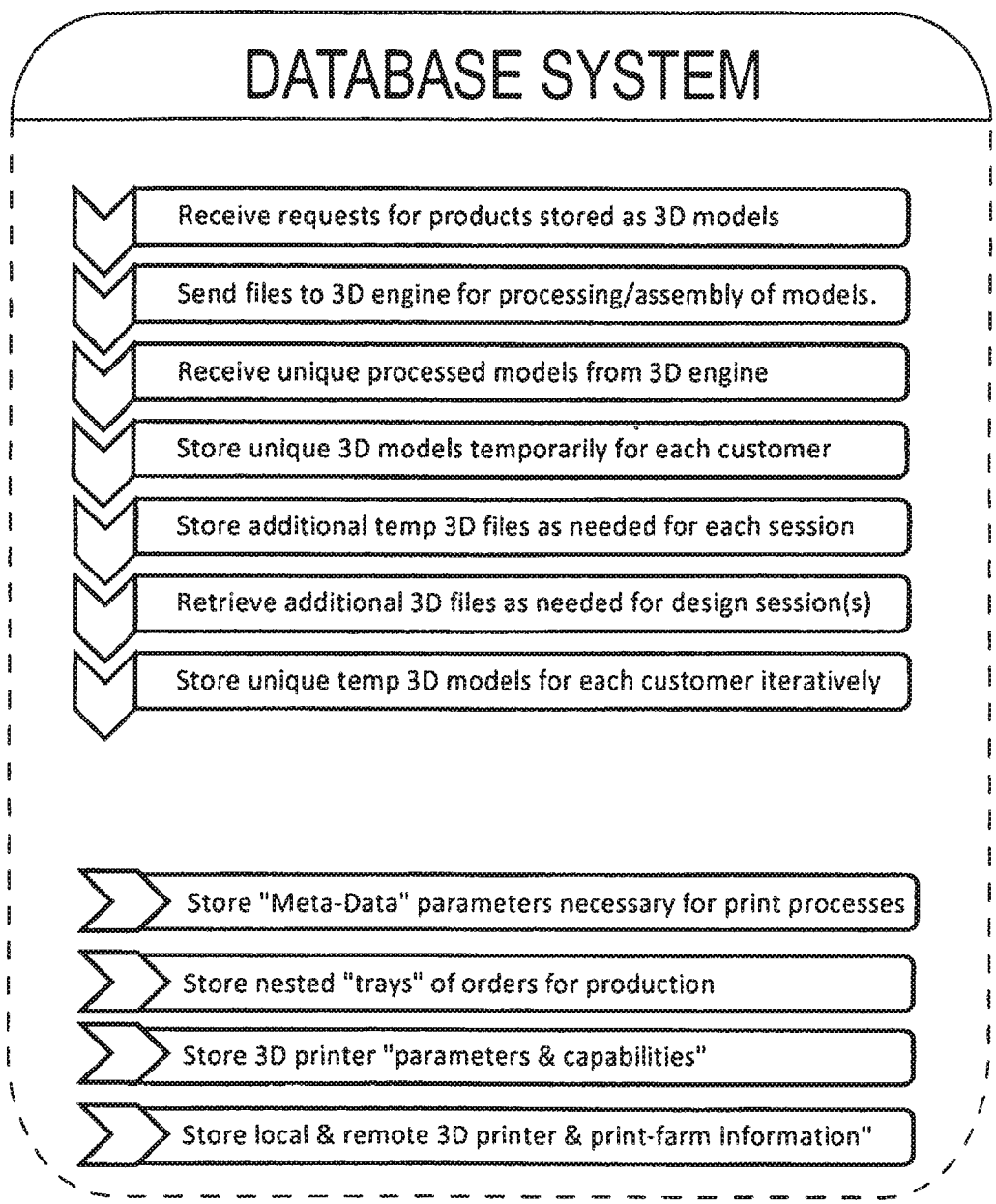

FIG. 5D depicts an embodiment of a method for using database(s) and/or file system(s) responsible for storing product models, product data, temporary files, metadata or other data usable to carry out embodiments of the method of the present invention.

Figure 5E:
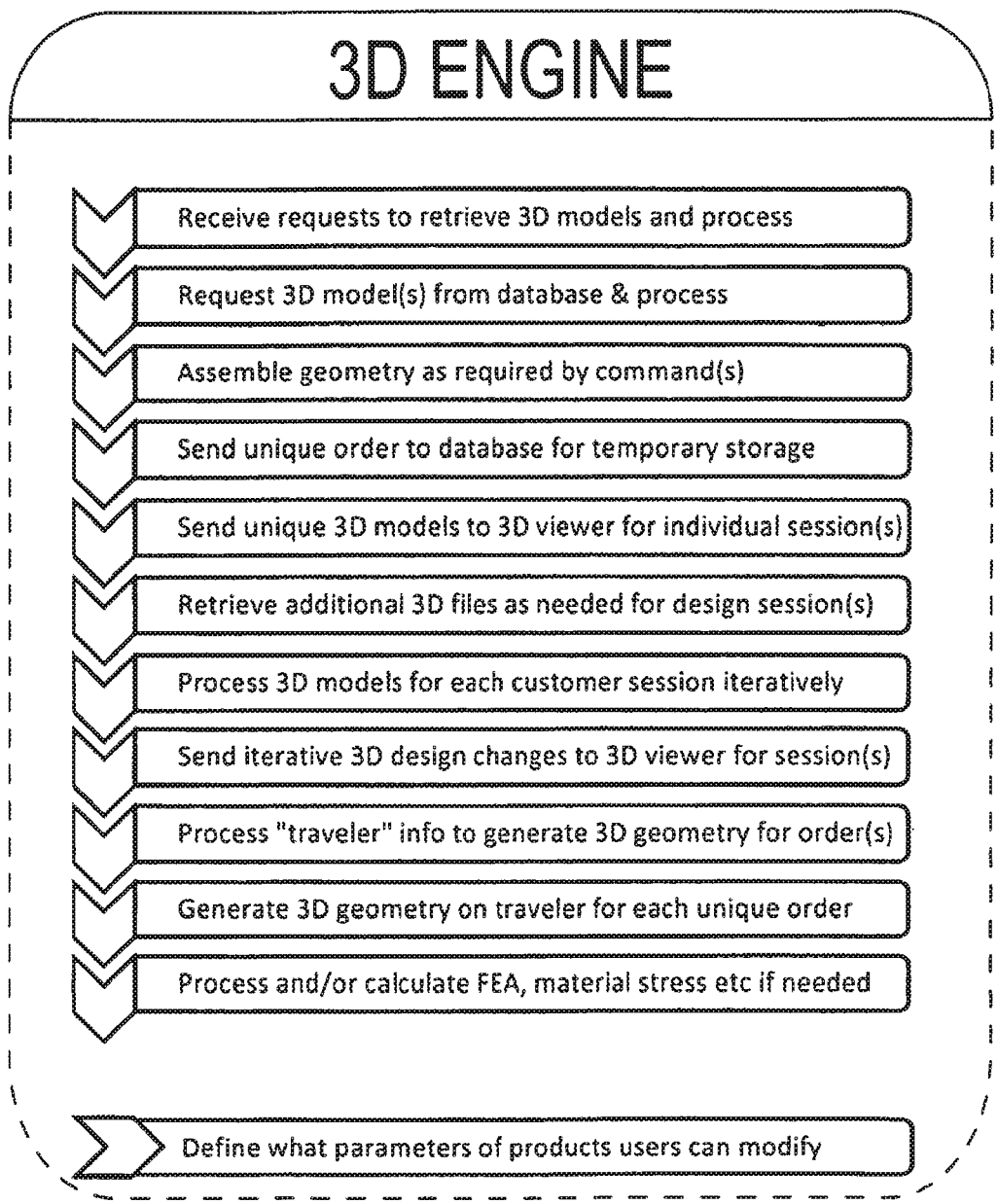

FIG. 5E depicts an embodiment of a method for using one or more 3D modeling or CAD engines that are responsible for manipulating the 3D data according to inputs by a customer through the relational control system depicted in FIG. 5B and connected to the customer via the 3D viewer system depicted in FIG. 5C and ultimately viewed through the Web Portal depicted in FIG. 5A.

Figure 5F:
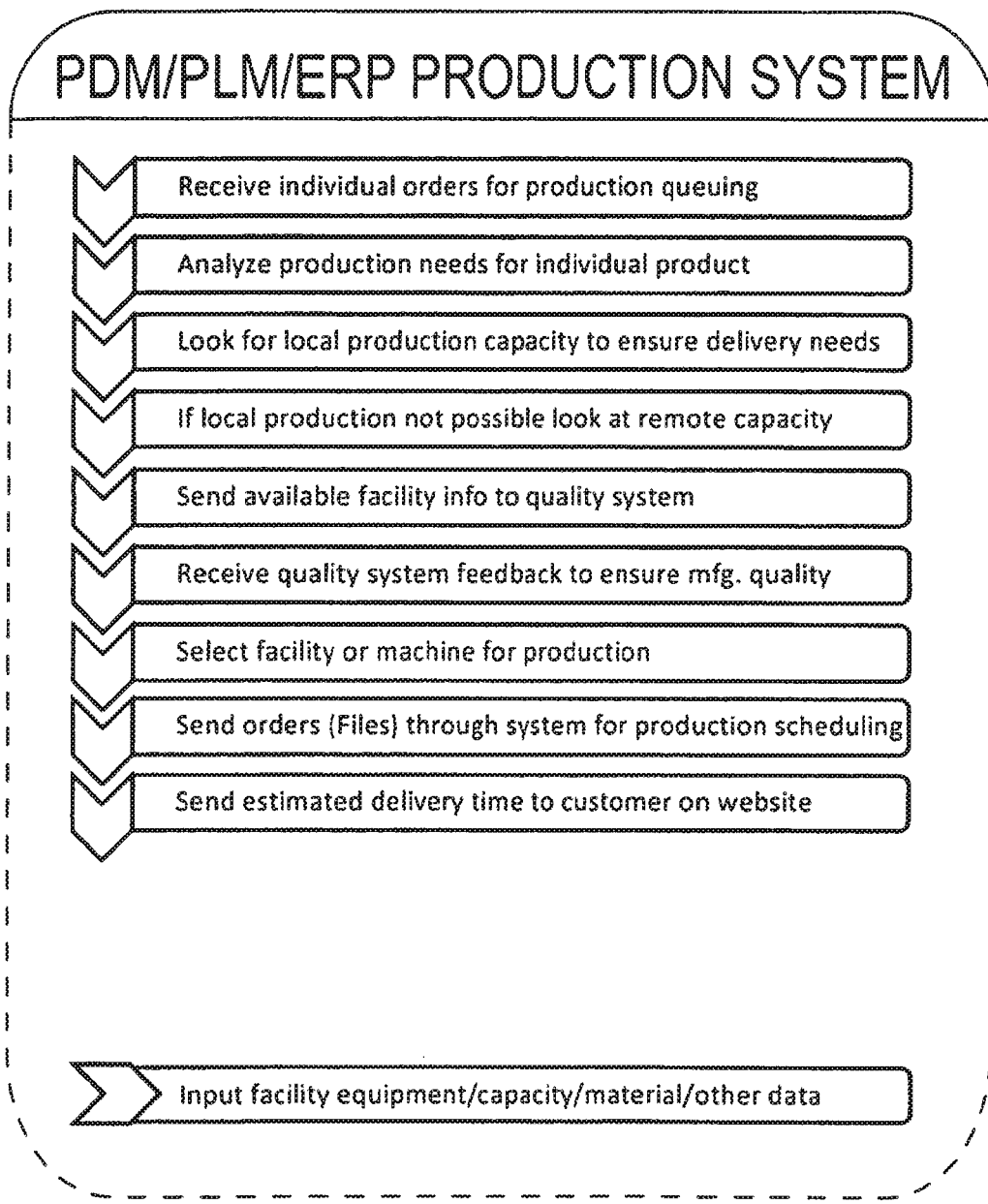

FIG. 5F depicts an embodiment of a method for using a PDM/PLM/master production scheduling system responsible for managing an automated or semi-automated production process.

Figure 5G:
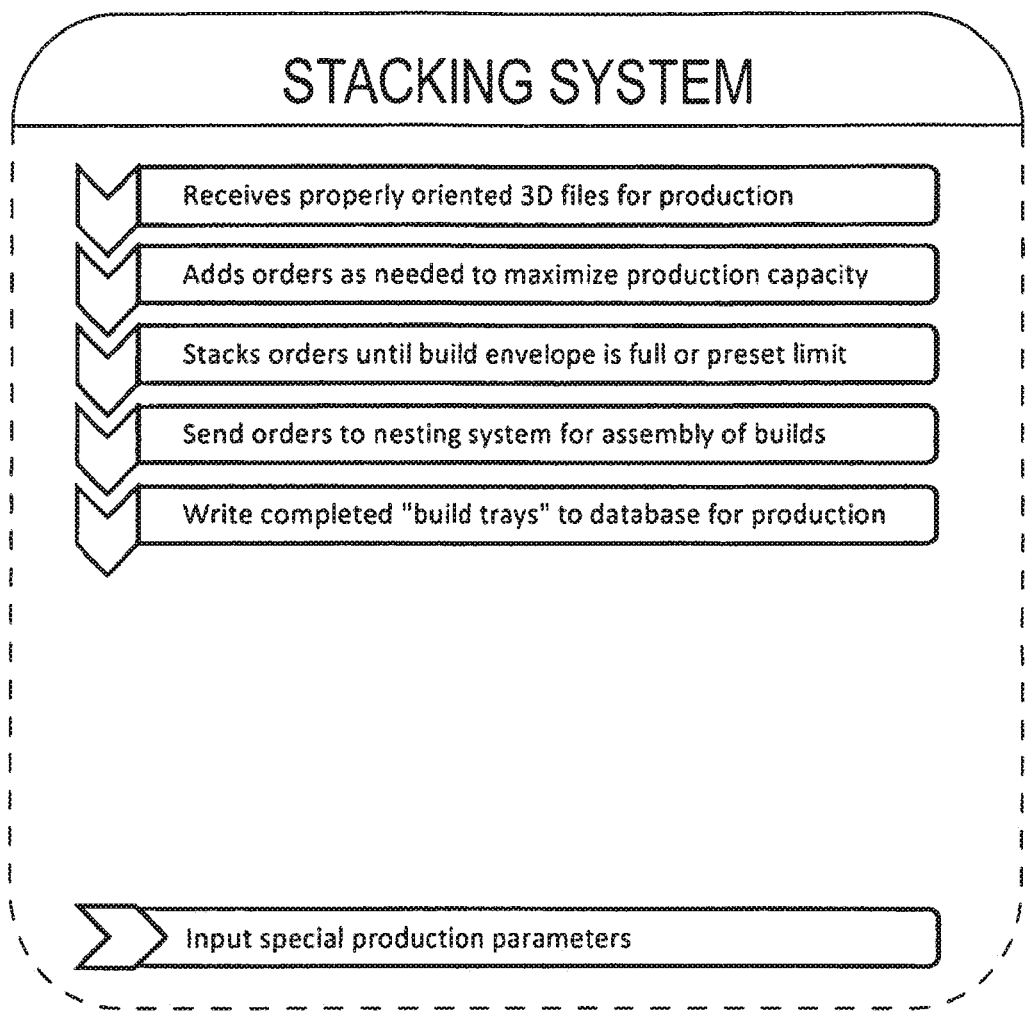

FIG. 5G illustrates an embodiment of a method for using a product stacking system.

Figure 5H:
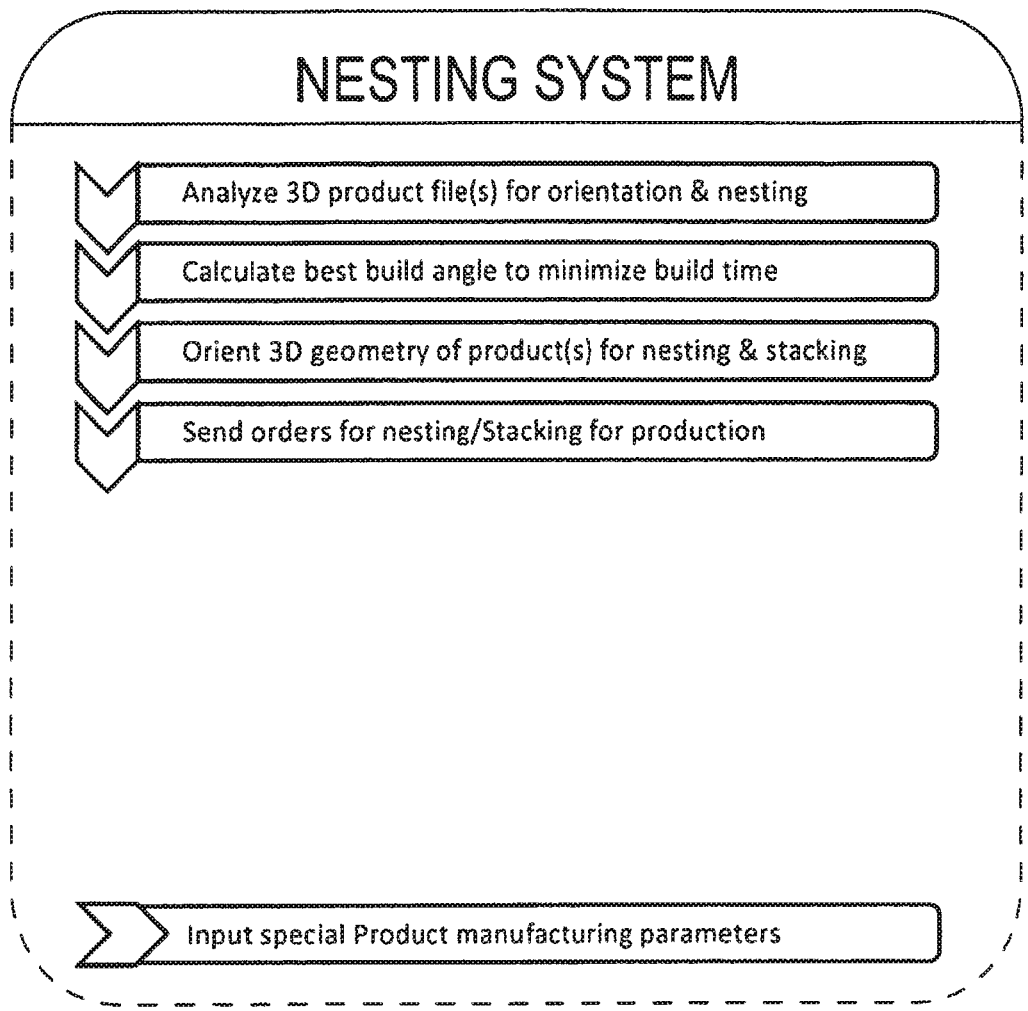
Figure 51:
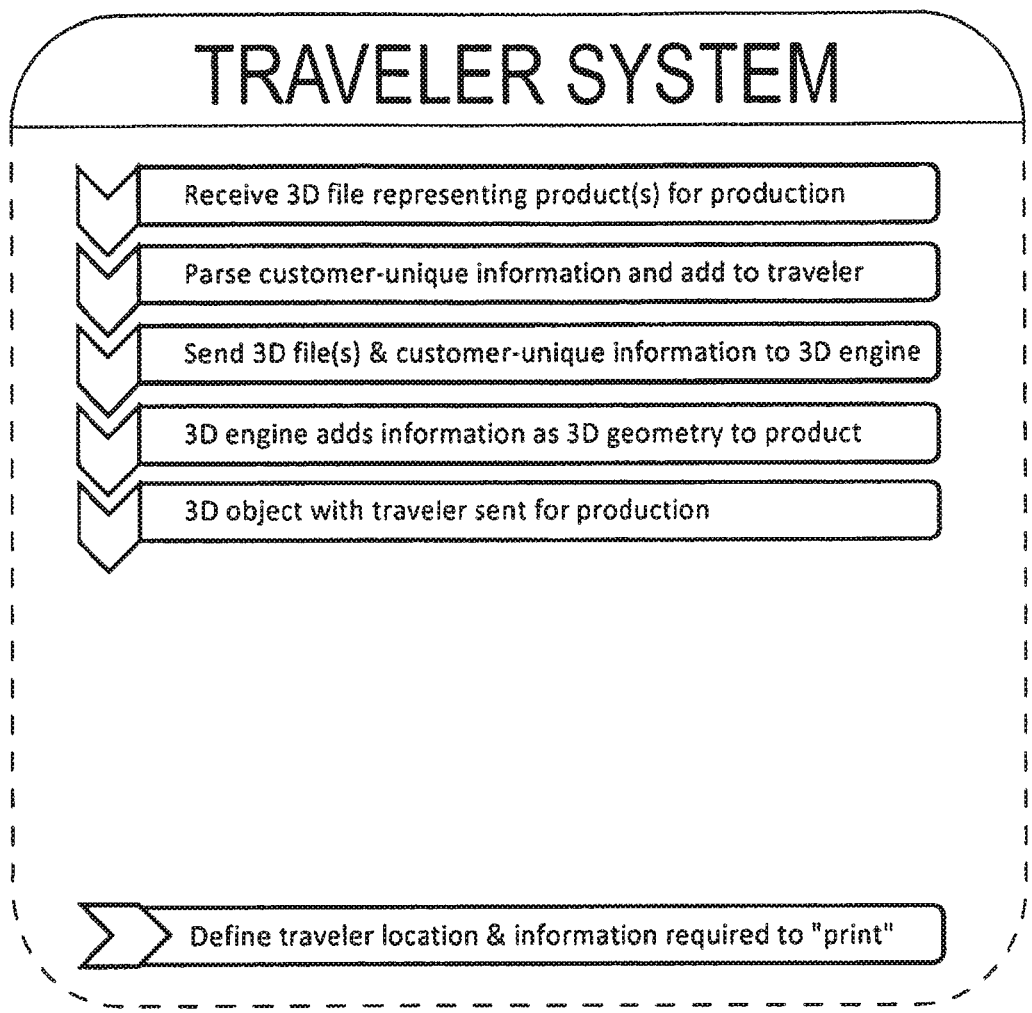

FIG. 5H illustrates an embodiment of a method for using a part nesting system.

FIG. 5I illustrates an embodiment of a method for the addition of identification markings on a product represented by 3D geometry.

Figure 5J:
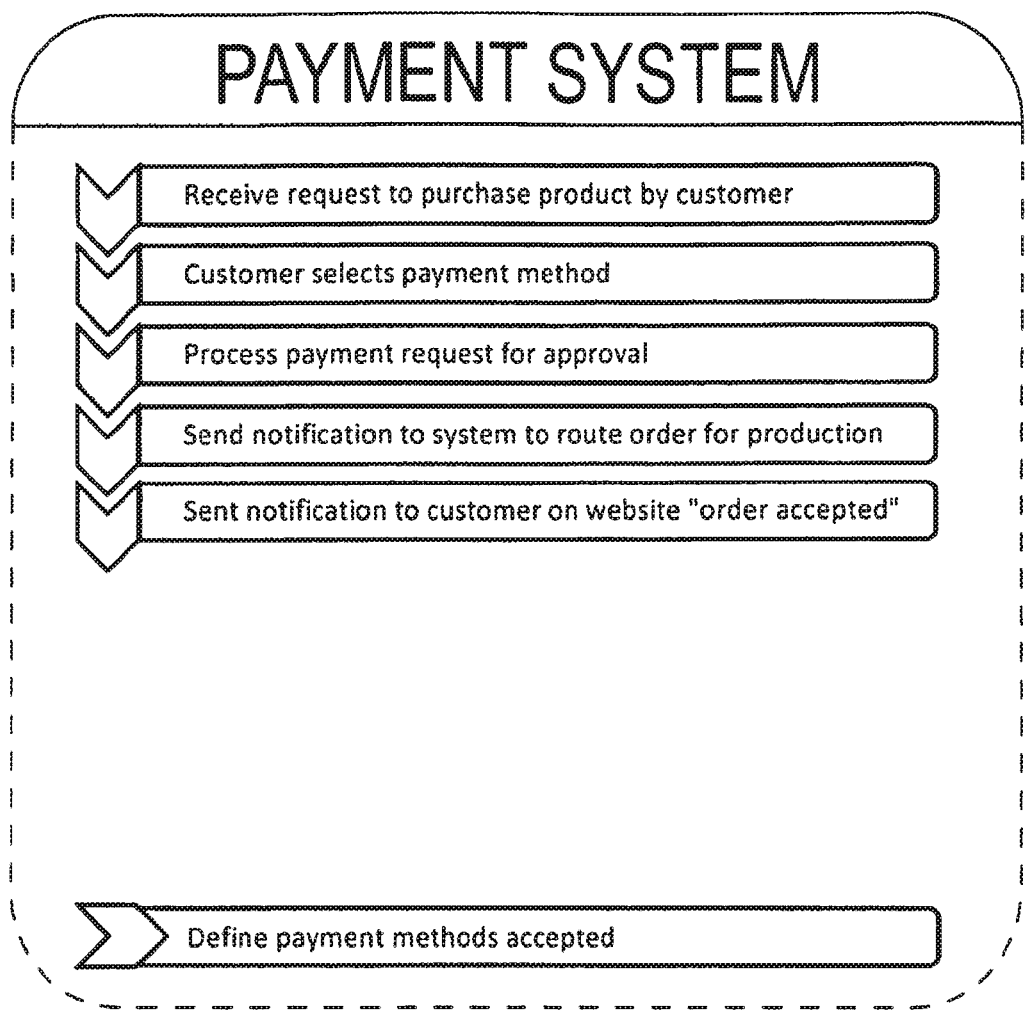

FIG. 5J illustrates an embodiment of a method for using payment processing system.

Figure 5K:
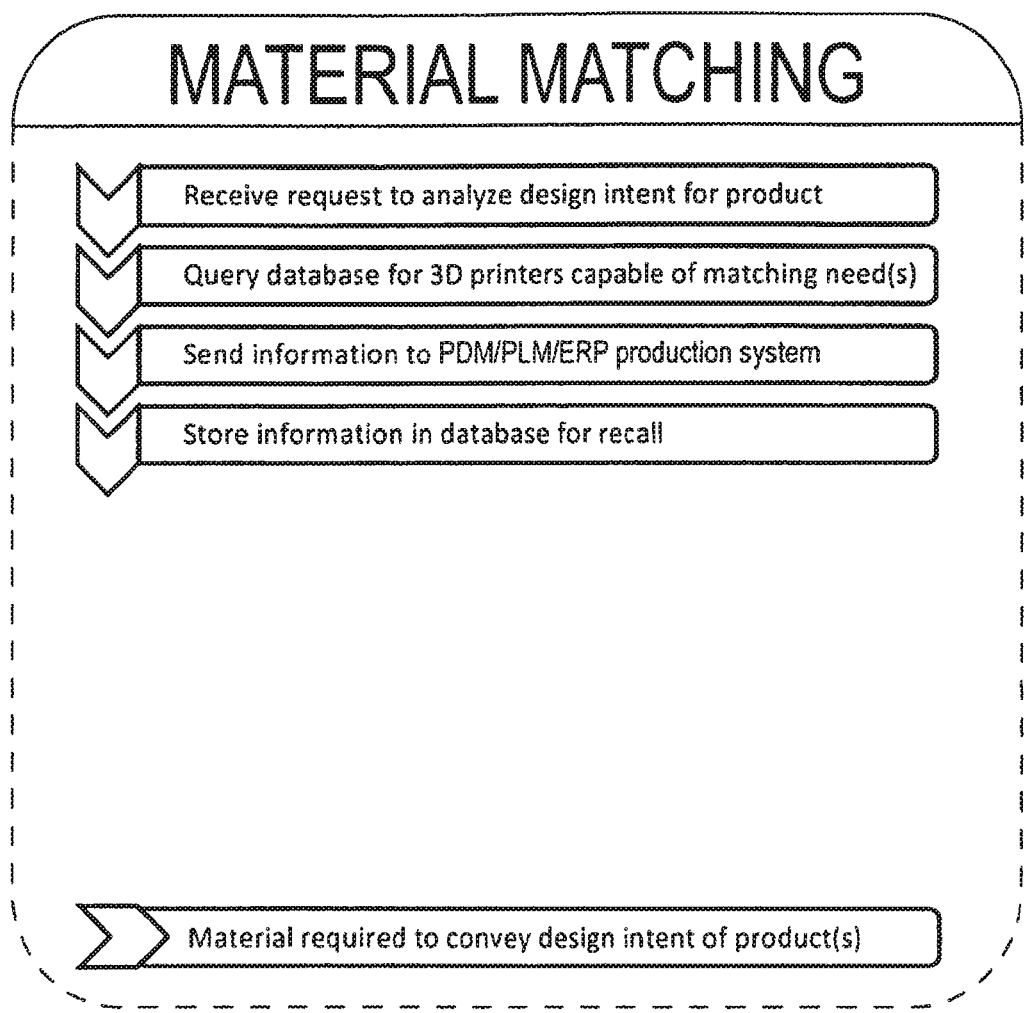

FIG. 5K illustrates an embodiment of a method for using an intelligent material selection system.

Figure 5L:
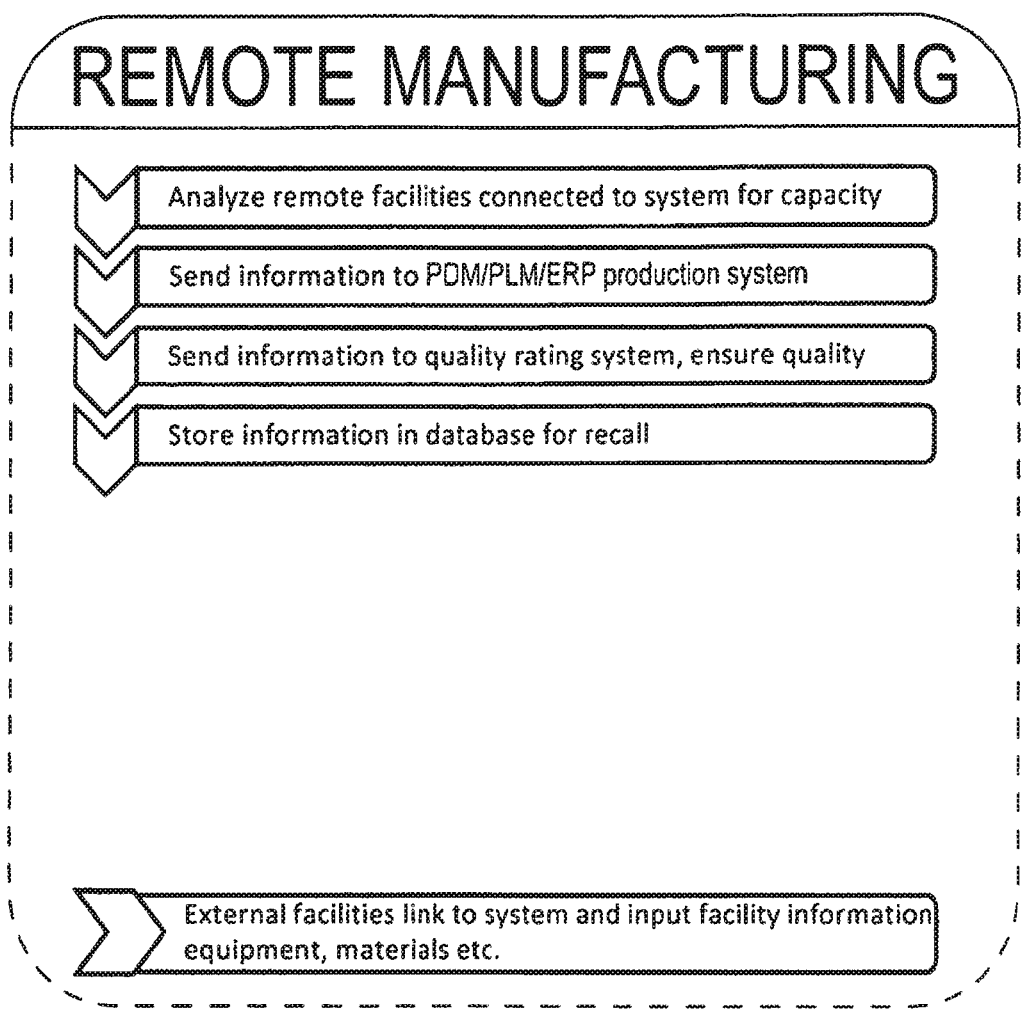

FIG. 5L illustrates an embodiment of a method for using a distributed manufacturing system.

Figure 5M:

FIG. 5M illustrates an embodiment of a method for using a quality rating system for a distributed manufacturing system.

Figure 6:
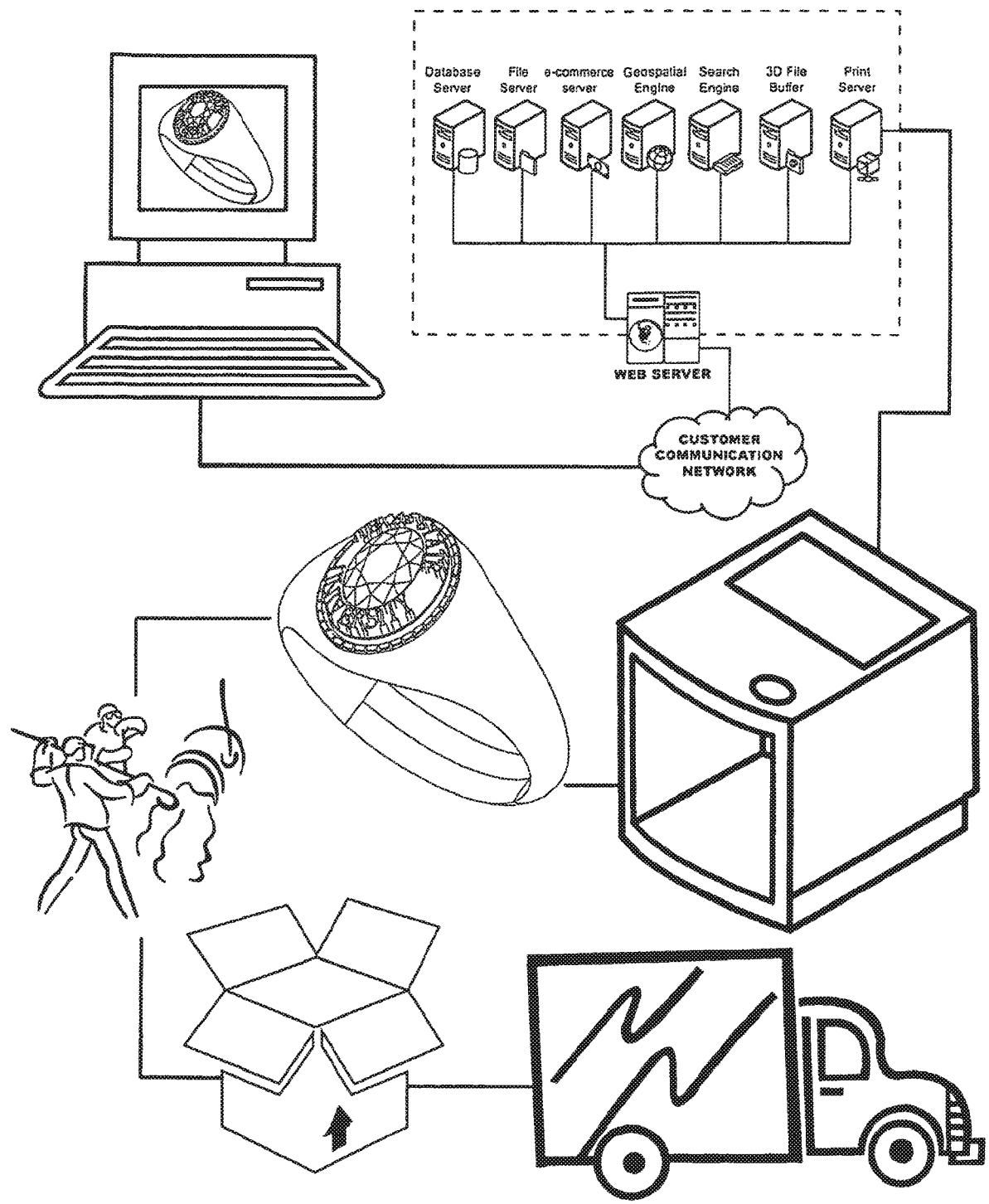

FIG. 6 is a flowchart depicting the use of the preferred embodiment of the present invention whereby the system in this example depicts the manufacture, by manifestation, of a wax pattern for a custom class ring, designed through the present invention by a user/customer.

Figure 7:
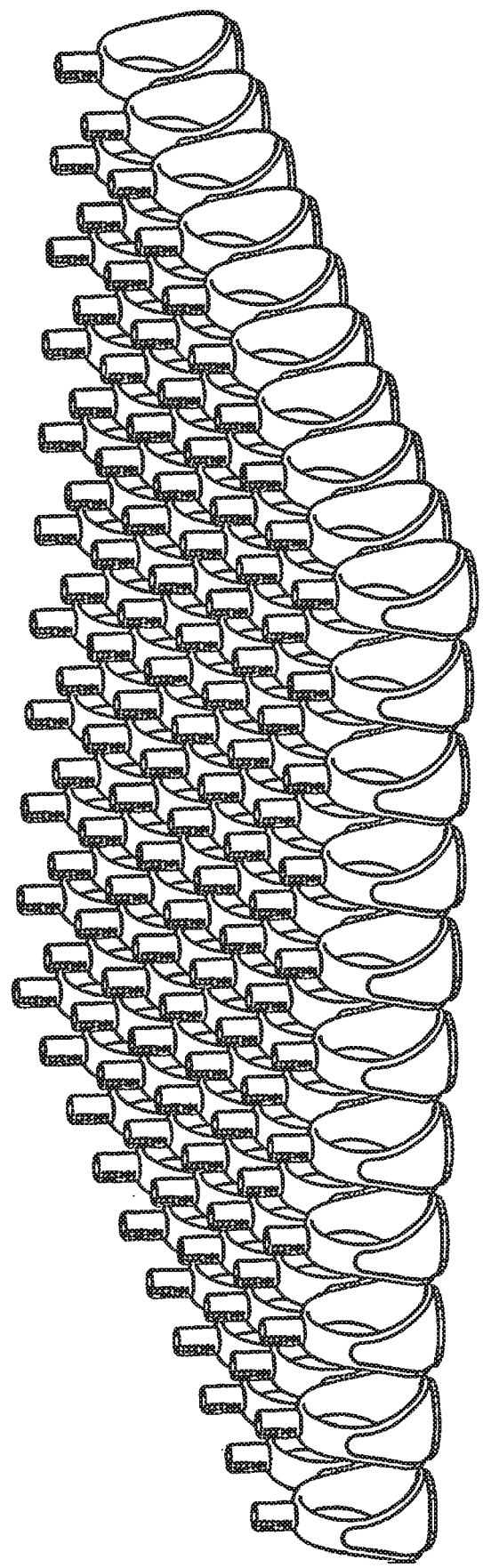

FIG. 7 illustrates a lot or "tray" of digitally routed and nested individual orders ready to be manifested via Additive Fabrication methodology including a sprue containing information to identify aspects of each unique product.

Figure 8:
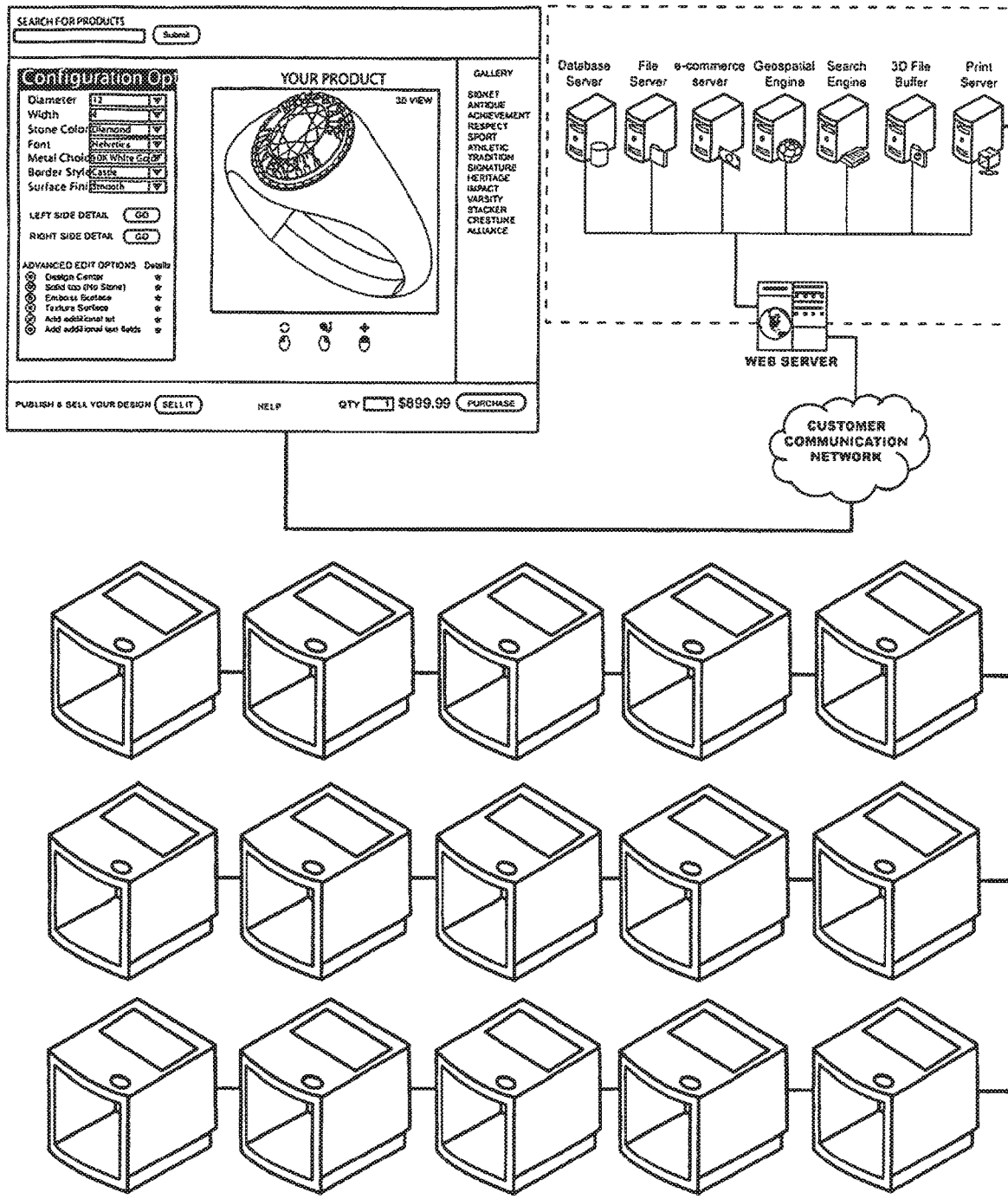

FIG. 8 illustrates process flow of the method in a preferred embodiment, representing the scalability of the system by adding additional additive fabrication machines.

Figure 9:
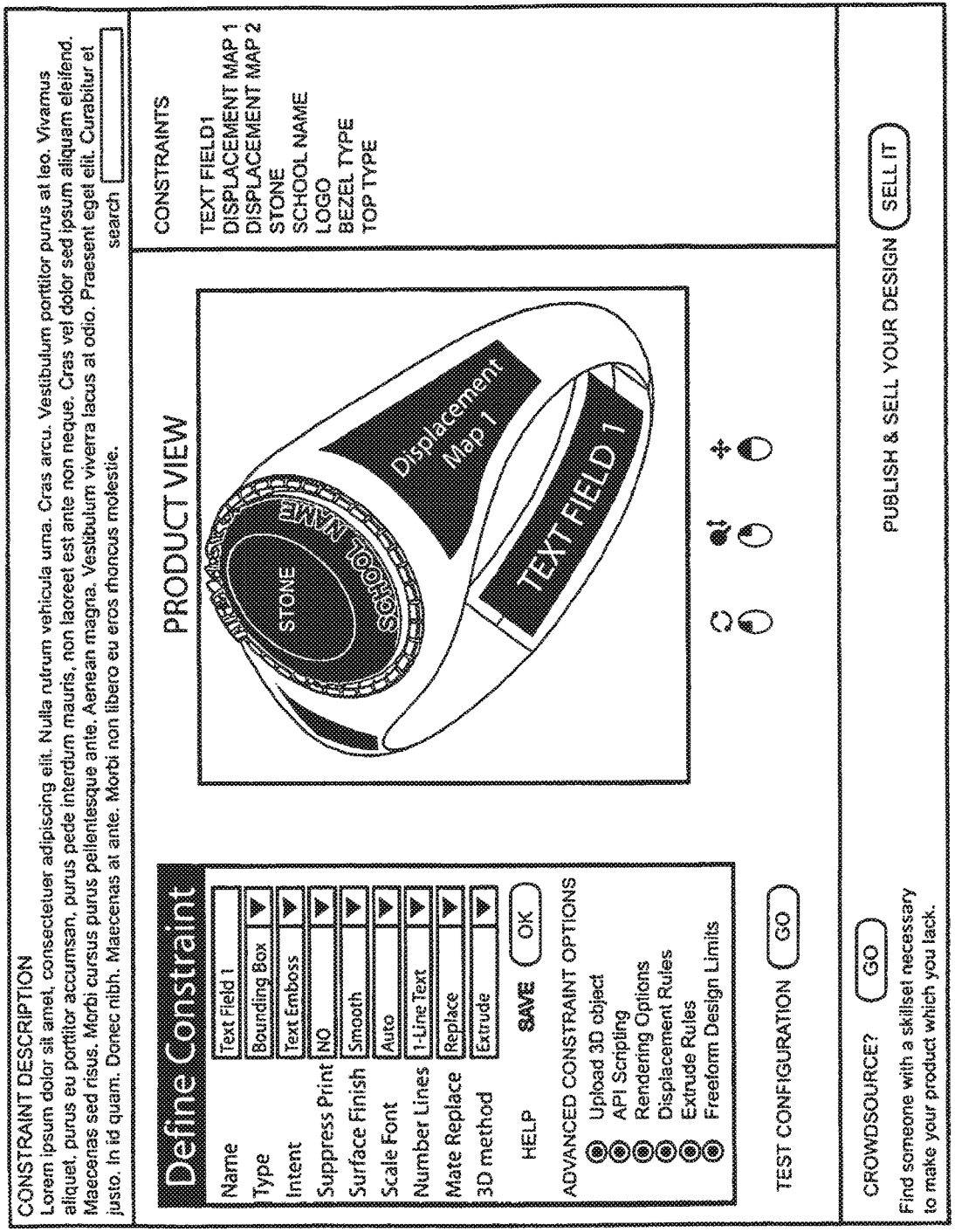

FIG. 9 depicts an embodiment of a website or web portal for using a local or remote CAD system containing tools for defining product interactions, and limits on configuration and user/customer inaction, hereafter referred to as constraints.

Figure 10:
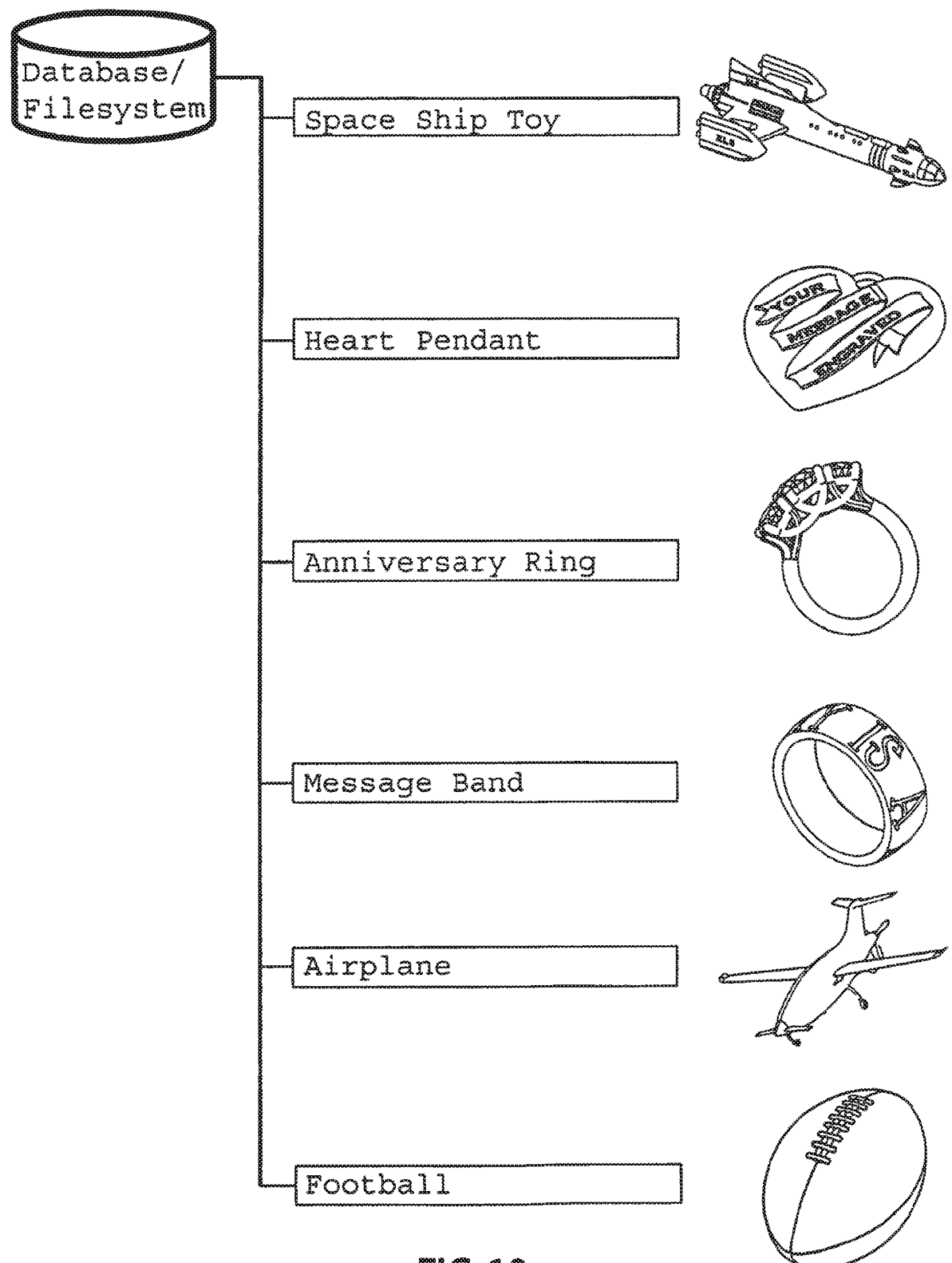

FIG. 10 depicts a diagrammatic view of an embodiment of a database or file system containing a plurality of individual products.

Figure 11:
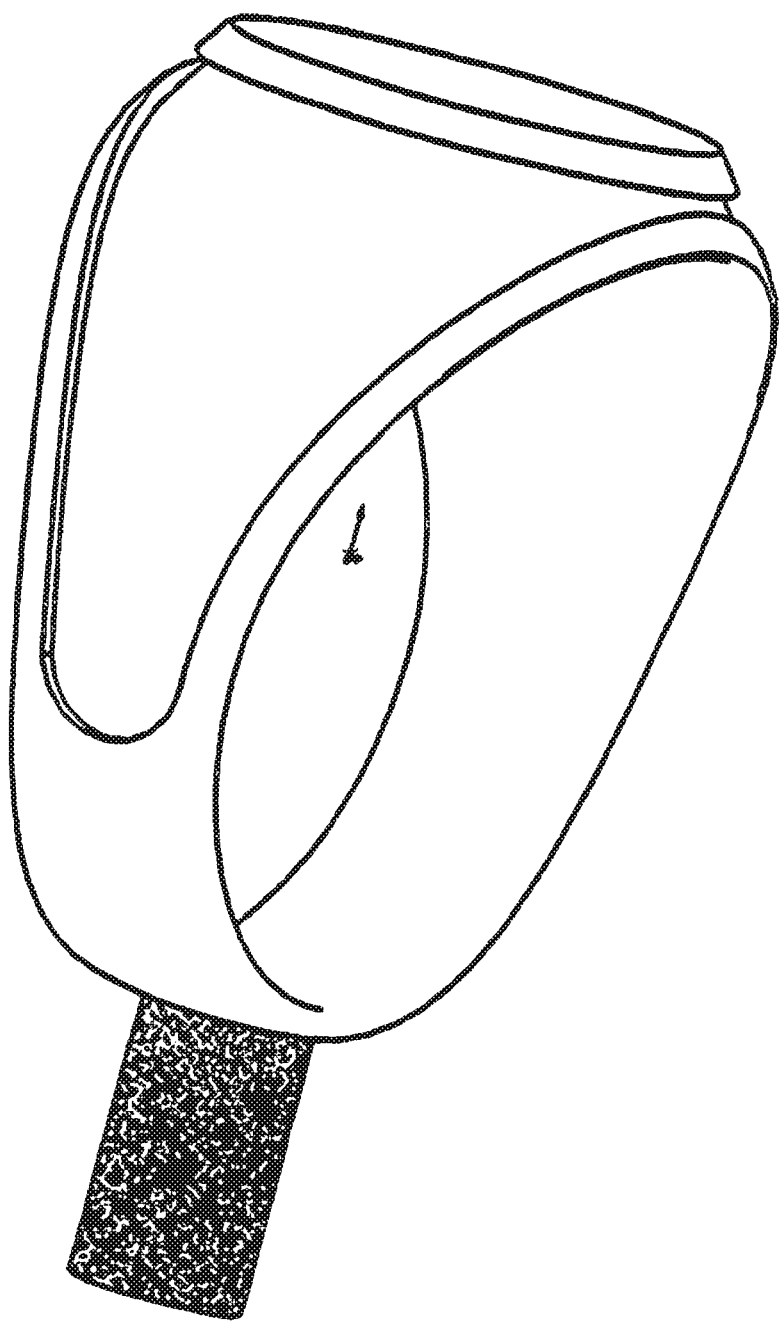

FIG. 11 depicts a product core with a suppressed feature, shown as a sprue.

Figure 12:
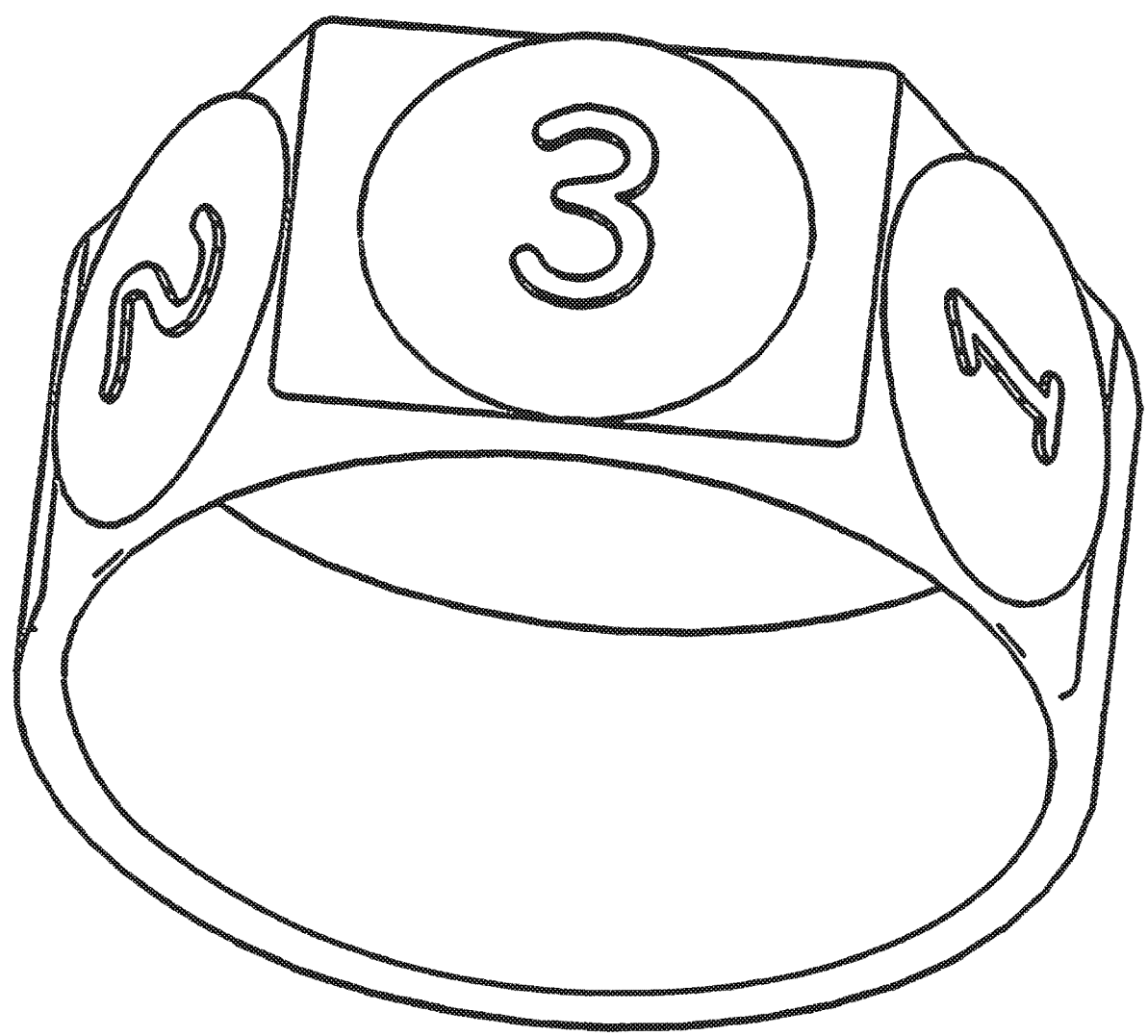

FIG. 12 depicts a product core having modification regions, usable to add 3D art and/or other mating parts to the product by the 3D CAD engine.

Figure 13:
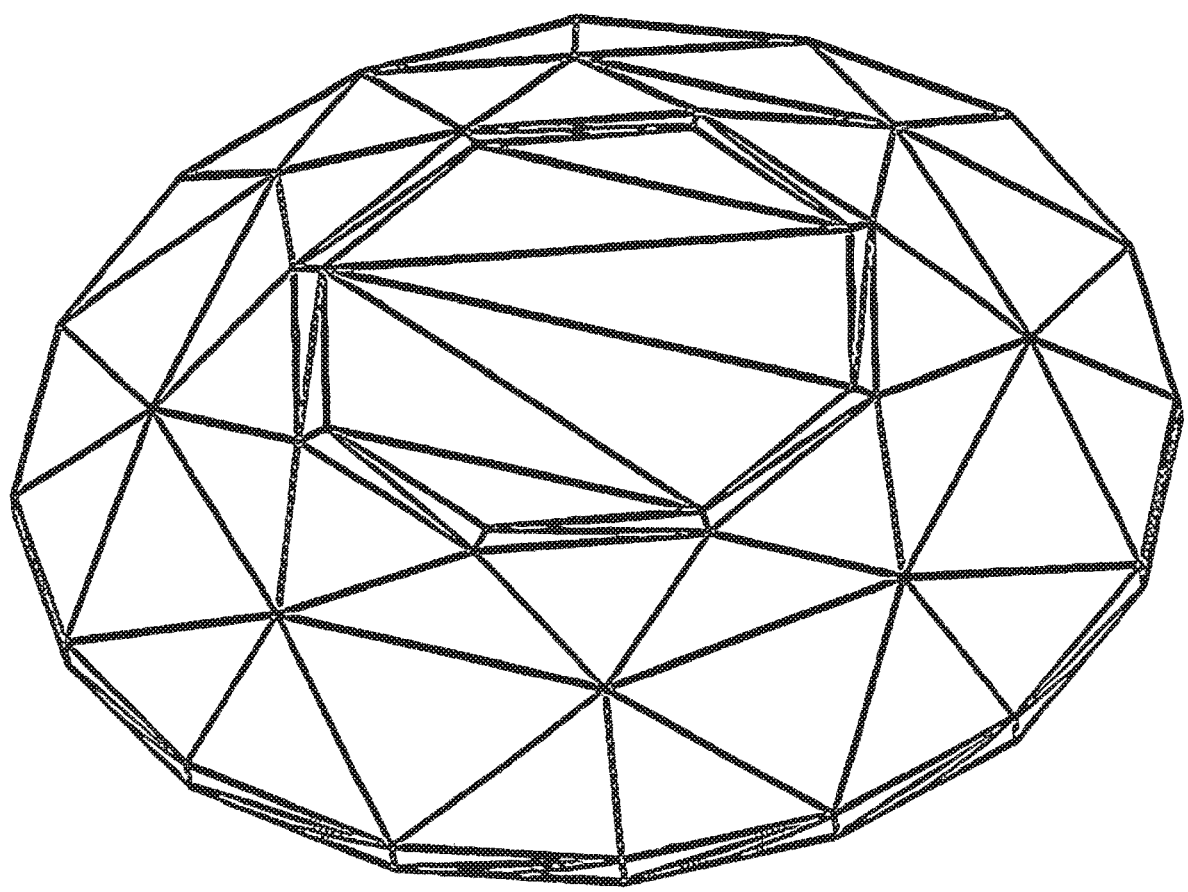

FIG. 13 depicts a 3D model for representative purposes, showing a stone for addition to a top or bezel of a customized ring.

FIG. 14 depicts various modification regions or "panels" of a product showing two-dimensional and three-dimensional text added to the regions by a 3D CAD engine.

Figure 15:
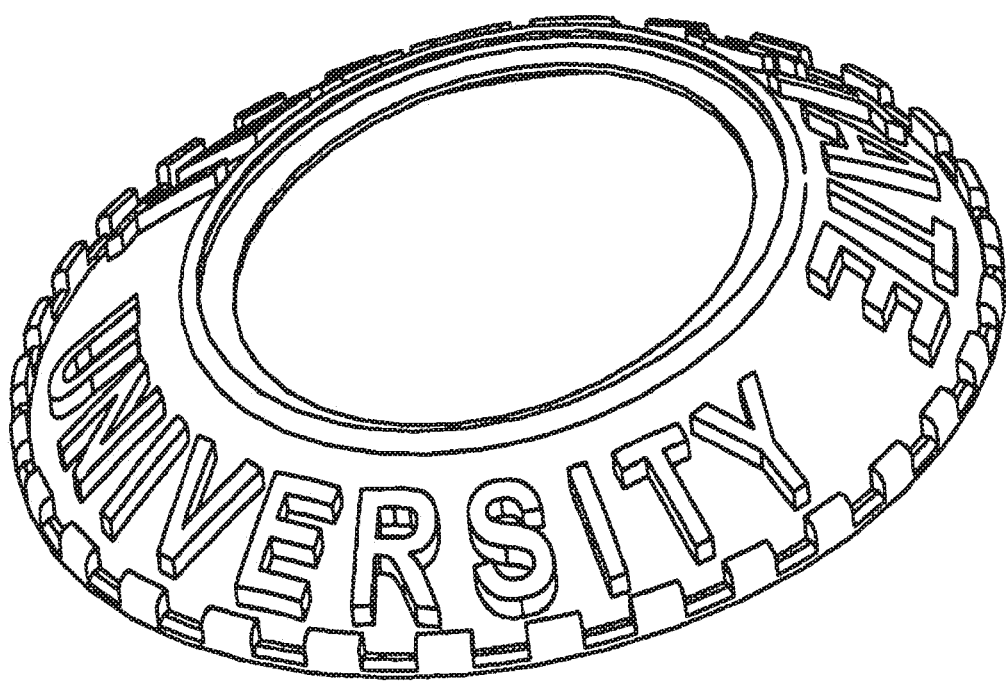

FIG. 15 depicts a 3D model for representative purposes, showing a top or bezel of a customized ring.

Figure 16:
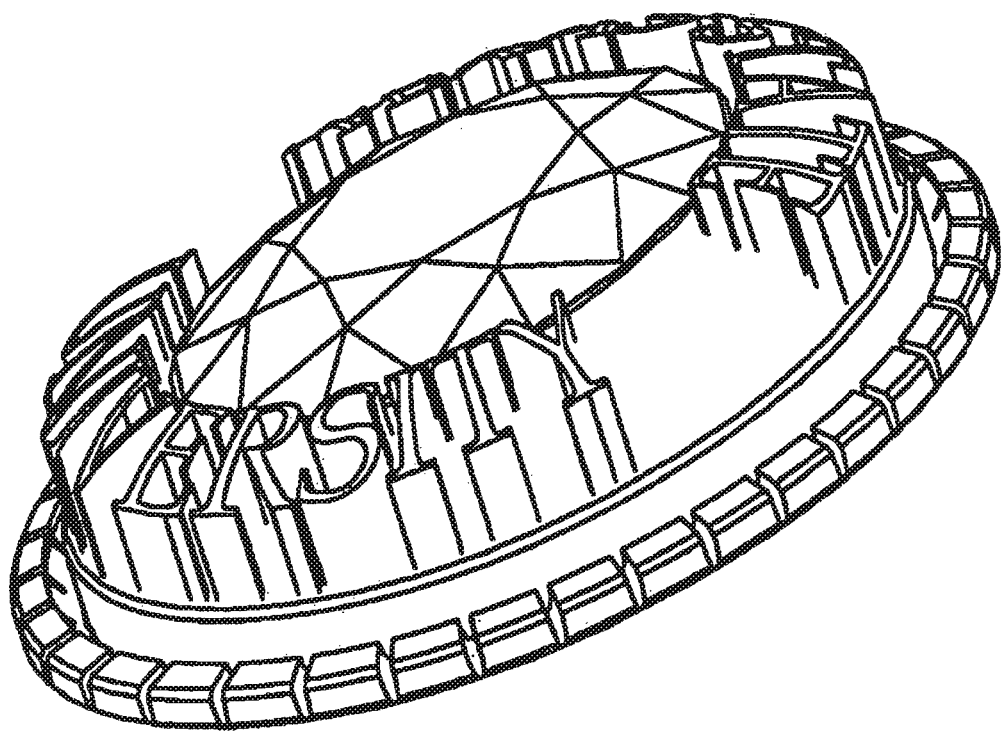

FIG. 16 depicts a stone, such as that shown in FIG. 13 mated with a bezel, such as that shown in FIG. 15.

Figure 17:
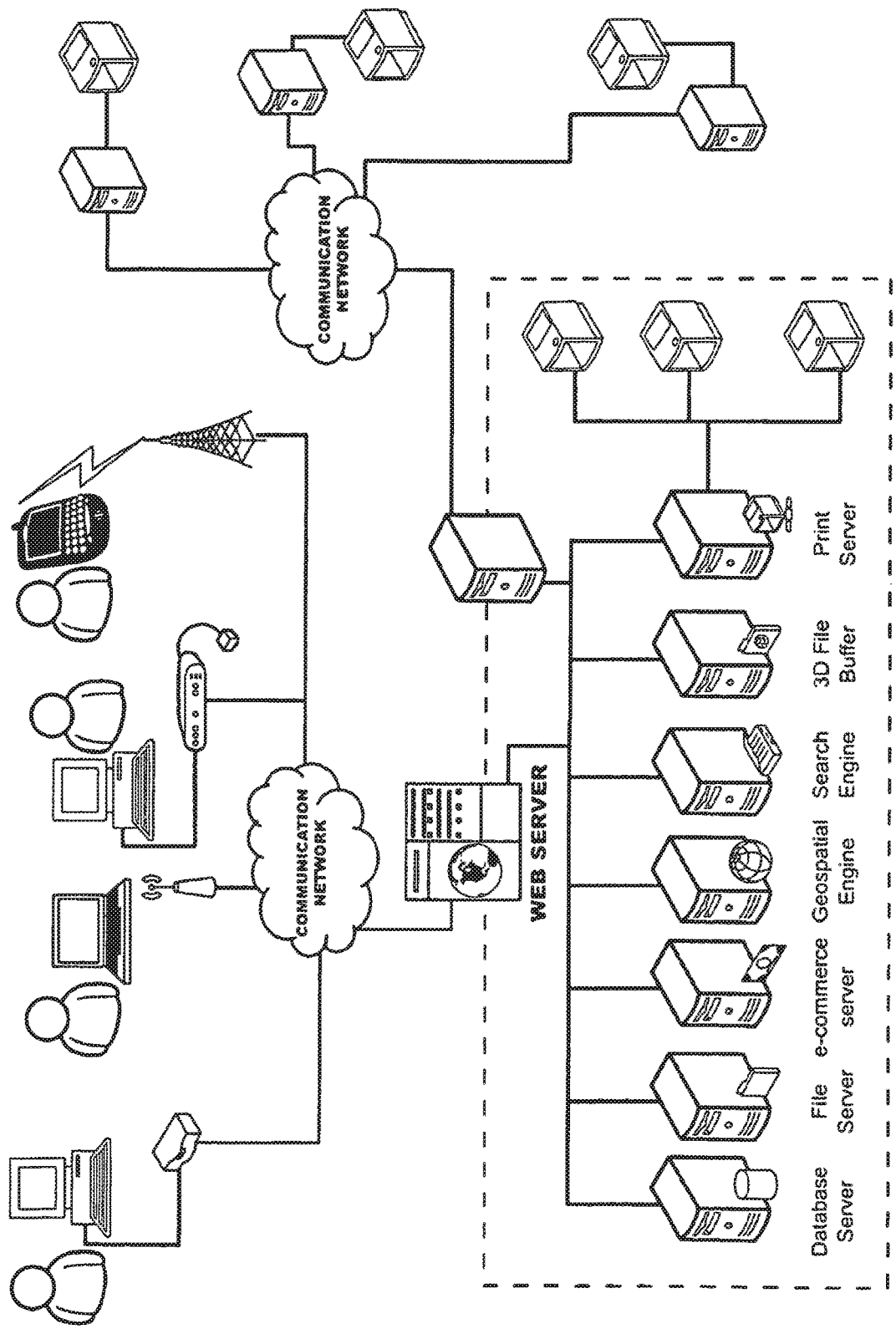
Figure 19:
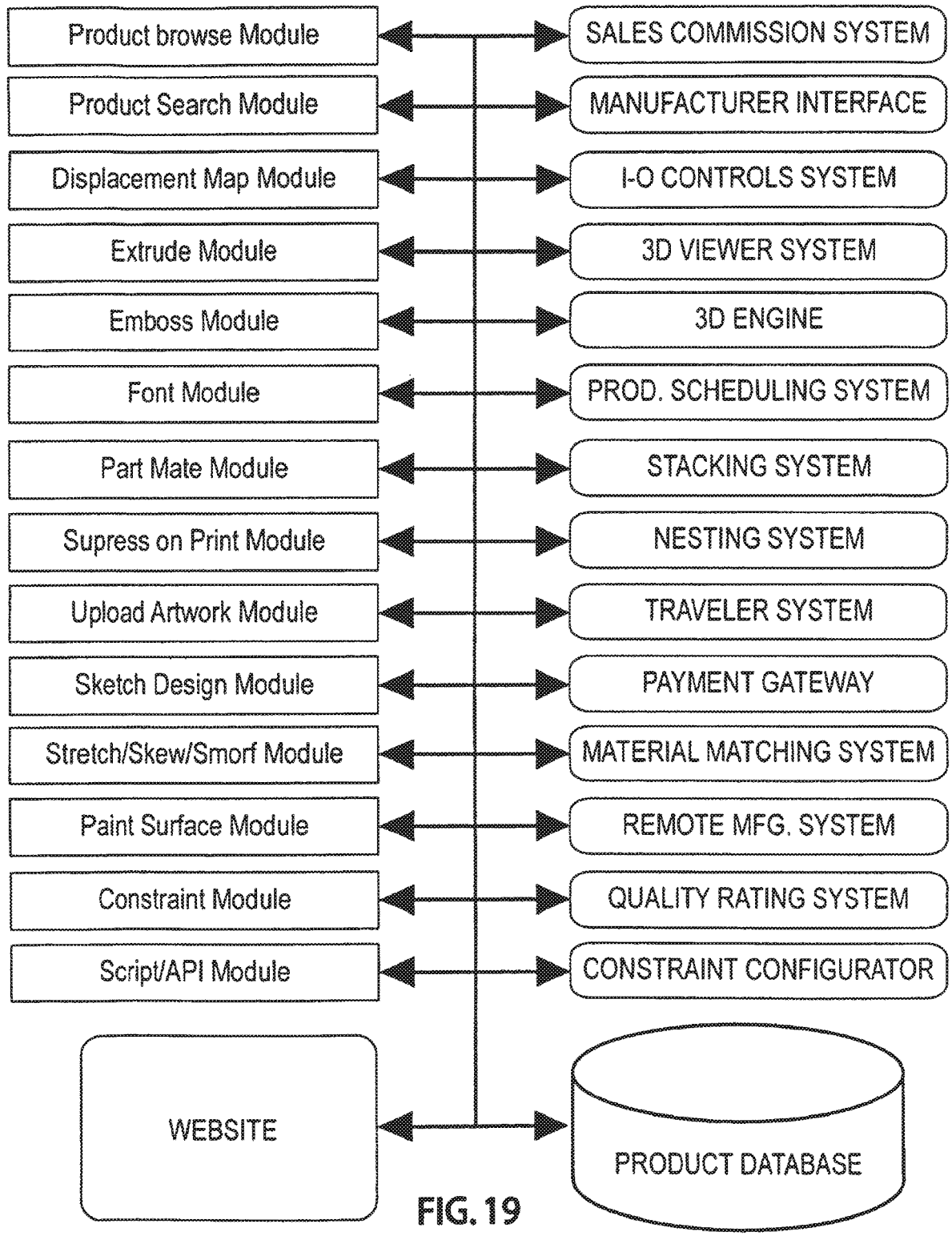

FIGS. 17 and 19 depict network diagrams of embodiments of the present system.

Figure 18:
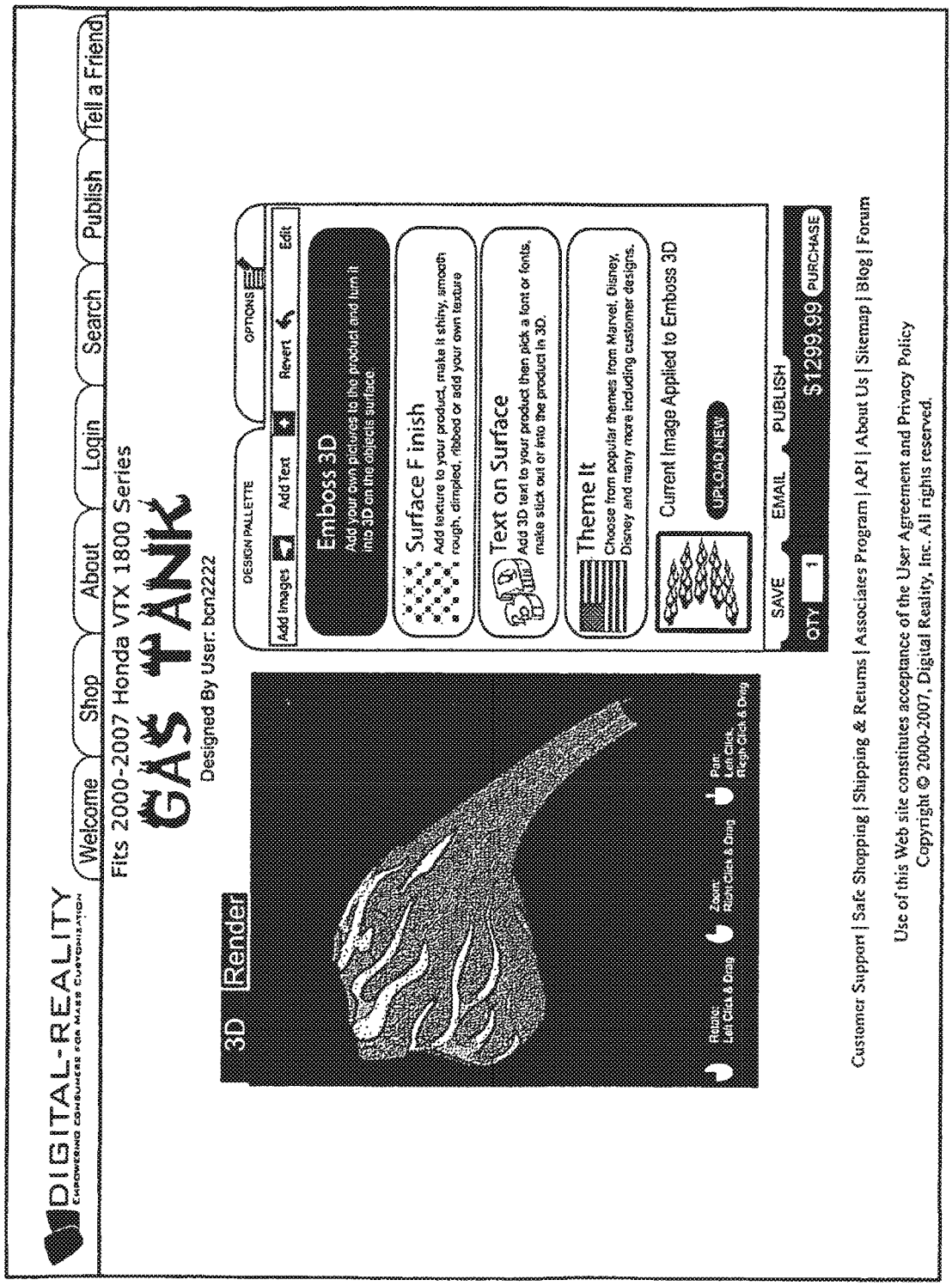

FIG. 18 illustrates a website containing an example of a user interface allowing the design of a custom motorcycle gas tank being embossed, by 3D displacement mapping, with flames.

DETAILED DESCRIPTION OF THE INVENTION AND PREFERRED EMBODIMENTS

Embodiments of the present invention will now be described in detail with reference to the associated drawings, in which preferred embodiments are shown. This invention may, however, be embodied in varying forms and should not be construed as limited to the embodiments set forth herein; rather, these embodiments are provided so that this disclosure will be complete and thorough, and will fully convey the spirit of the invention.

FIG. 1 represents a geospatial/3D geometry system, commonly referred to by someone skilled in the art as a computer aided design or geospatial design and configuration system or CAD system which for the intent of disclosure, is intended to be defined as a means to design a product which may be made available for customization/personalization within the present invention.

In one embodiment, the system deploying the method of the present invention, shall allow for the input of any geospatial/3D geometry design produced in a plurality of design software tools including but is not limited to Solidworks, Inventor, Rhino, Strata-Studio Pro, Maya, CA TIA, PROE, Alias Wave Front, Alias Sketch, Lightwave 3D, DesignCAD, Enovia Amapi, Carrera 4, Hexagon, Shade 3D, Poser 6, Axel Core, Recon 3D, Anatomica 3D, Adobe Dimensions, DelCAM, Form-Z, Mechanical Desktop, Pilot 3D, Solidthinking, Unigraphics, TouchCAD, etc.

The present invention therefore can accept and utilize geospatial/3D geometry created by of the aforementioned geospatial/3D graphics application because 3D graphics applications export 3D models for cross compatibility purposes into many common 3D file formats. FIG. 1 Further represents a CAD designer or user/customer creating the desired features, including the interaction mechanisms which the consumer will be able to manipulate for the particular product(s).

FIG. 2 illustrates a website providing access to the system deploying the present invention; the example illustration reflects a website making available for sale custom jewelry. This representative website or web portal provides the link between a plurality of customers, the database(s) of product (s) available for customization, the 3D viewer system, the geospatial/3D engine system, the database system and the production system for manufacturing custom jewelry products.

It should become obvious by now that the limitations on what can be manufactured using this method and system as described herein are defined by the materials available to an additive fabrication machine and an ability to adequately define a 3D object to allow for its printing via additive fabrication means.

FIG. 3 represents the computer-based system which deploys the method of the present invention. The computer-based system runs on a computer server or computer servers utilizing an operating system. The software/hardware system is programmed to store and retrieve 3D data from a database, present it to a user/customer via the website or web portal, along with a design interface and a 3D view of the product. Said software system is also responsible for the sorting, scheduling and routing of a plurality of orders processed through the system by a plurality of users/customers. Furthermore the system is responsible for sorting, routing, nesting and scheduling said product(s) for production only after payment is received and customer approval of the 3D product visualized through the web site or web portal. The system provides for iterative design feedback prior to approval and production.

It should be obvious to anyone skilled in the art that the system could be deployed in manners which negate the need for pre-payment prior to production. For example: in delivering an order of a product to a business client who purchases on a purchase order or where no payment is required such as battlefield forward manufacturing or where the order is a repeat-order.

FIG. 4 illustrates an exemplary Additive Freeform Fabrication device. This device or a similar device is usable for the manifestation of a customer's unique product. The illustration is therefore intended to be illustrative of a 3D printer and not inclusive of all usable 3D printing equipment.

FIG. 5 is a process flow diagram illustrating one preferred embodiment of the method of the present invention. The diagram represents the interconnectivity of the various components and processes which together comprise a system and method capable of delivering an overall Made-To-Order Digital Manufacturing Enterprise System within the scope of the present disclosure.

FIG. 5A illustrates an embodiment of a method for using a website or web portal providing connectivity between a user/customer and the system deploying the method of the present invention, wherein the website or web portal provides a means for the user/customer to access the system and for the system to provide feedback to the user/customer, creating an interactive system.

As used herein, the terms "communication network" and "Internet" refer to any networking method that provides a user/customer access to the system described herein from a remote geographical location. The communication network providing two-way data communication between the user/customer accessing a website or web portal located on the World Wide Web which interfaces with said system.

As commonly understood by someone skilled in the art of the internet or e-commerce, a website or web portal refers to one or more web pages that collectively comprise a website, the website being accessible over a communication network from remote geographical locations and transferring data including but not limited to HTML, Java, or any other computer-based data, to and from a user and or user computer from one or more remote computer systems. Said website containing, for example; images, HTML, CGI, JAVA, FLASH, AXAX, ACTIVE X CONTROLS, VIDEO and other computer code to present a useful tool to a user/customer visiting the website. Said data representing content intended for a user/customer to view, interpret, and utilize for a purpose as understood commonly by anyone skilled in accessing and using the internet or World Wide Web.

In one embodiment, the website provides by the current invention includes multiple web pages, collectively comprising a website, with a home page whose meaning is clear to anyone skilled in the art of the internet and e-commerce. The website is accessible by a web browser in response to a user/customer http request resulting in the presentation of the website through its URL by which all web pages are categorized, organized and located on the internet.

A user/customer as described herein can include any person who accesses a website on the internet for the purpose of gathering information, learning, experiencing or purchasing by e-commerce. This description is extended to users who may be involved in collaborative design efforts. The terms described here are provided to represent, rather than limit, the terms describing a user/customer.

The website or web portal depicted in FIG. 5A is designed to provide users desiring to customize for the intent of purchase, personalized or customized products including any product which may be adequately represented by 3D geometry so as to allow 3D printing via Additive Fabrication methods. The website further contains one or methods to browse and or search for products contained in said system to customize or personalize and purchase. Said website or web portal further provides the means by which the user may access the system that provides the user an interface through which they may personalize or customize aspects of a product including but not limited to; color, shape, texture, function, thermal, mechanical, electrical properties, location of appendages or other 3D geometries affixed to a core product, including text, fonts, scale or other parameters of text which may be manipulated whereby said Text becomes manifested as 3D geometry or 2D geometry on the surface of a 3D geometry wherein the ability to see such 2D geometry is meant to include any means which differentiates it from the surrounding material to make it legible including but limited to color or texture.

Product manipulation and design parameters are intended to mean any modification which is feasible via geospatial/3D design modifications to a 3D object which does not violate its fit, form or function. Furthermore; product manipulation and modifications refer to any design detail or modification that augment or enhance the original product to meet an individual or personal need or desire.

Individual or personal enhancements may also include user/customer original design modifications by someone skilled in the art of 3D design and design implementation so as to create undefined enhancements to a product or an entirely new product design having the same purpose or an entirely new purpose.

The website or web portal of FIG. 5A includes the ability to include rendering geospatial/3D models to a user/customer allowing the customer to see the closest approximation of the actual physical product that is superior to all other visualization methods because the 3D entity they visualize is in fact the digital representation of their actual product.

A computer or computers deploying the method and system of the invention may include any computer system as commonly understood by anyone familiar with the common definition of a computer including computer systems with processor(s), temporary & permanent storage mediums, input/output controls, network connectivity and an operating system. Furthermore, said computer(s) contain programming code in any known explicit or implicit method whereby the code described is responsible for, solely, or in combination with hardware, causing the computer(s) to carry out operations to provide the method of the present invention described herein. Said software and or hardware clearly understood to carry out the purpose as defined to anyone skilled in the art of computers and networking.

A distinction is made between a computer or computers carrying out systems and methods usable within the scope of the present invention and a user/customer computer, whereby a user/customer accesses the computer or computers carrying out, by way of computer software and hardware, the methods of the present invention. A user/customer computer can include a PC, Smartphone, home computer, desktop computer, notebook computer, tablet PC or combination thereof.

To further explain the method and system, detailed description is provided for the remaining diagrams and drawings:

FIG. 5B illustrates an embodiment of a method for using a local or remote software or software and hardware-based system providing the set of relational controls that provide a user/customer with interactivity, e.g. through the website or web portal to personalize or customize a product and the 3D CAD system.

FIG. 5C represents a method for using the geospaital/3D viewer system that is responsible for rendering 3D geometry to a user/customer or plurality of users/customers, through the web portal, and hereafter referred to as a 3D viewer. The 3D viewer provides a user/customer, using the system through a website or web portal, with a means to visualize their product and the resulting changes in 3D.

FIG. 5D illustrates an embodiment of a method for using a set of databases and/or file systems which can be used to store and retrieve data during the operation of the computer system. FIG. 5D further represents one embodiment of process flow within the system.

FIG. 5E represents one or more approaches to geospatial/3D design and design implementation responsible for the accurate assembly, deformation or otherwise manipulation of the 3D mathematically-derived geospatial/3D models. The method may utilize but is not limited to the Parasolid or ACIS kernel and may also be a custom-designed 3D kernel system that better meets the needs of the invention if such a pre-made system proves to provide limitations on the systems functionality or scope. This geospatial/3D system accepts input to drive the accurate assembly, deformation or otherwise manipulation of 3D files at the instruction or input of a user/customer such through the design interface accessed through the website or web portal. Furthermore the 3D kernel system may, in one embodiment also be responsible for any post-processing necessary to put the 3D files in the necessary file format required for production according to claim 25.

FIG. 5F illustrates an embodiment of a method for using the portion o the system responsible for Product Data management, Product Life style management, and/or master production scheduling, whereby products represented by 3D model(s) are, by the system, automatically sorted, scheduled and routed as a plurality of individualized or custom-designed products, to a location where the resultant 3D geometry can be manifested via additive fabrication through the system and method described herein.

The system represented in FIG. 5F also provides for automatically sorting, scheduling and routing the plurality of individualized or custom-designed products to a locally available or remotely located Additive Fabrication machine, machines or bureaus.

According to presently understood operations of a manufacturing product lifecycle, product data management, master production scheduling, part routing system described in FIG. 5F shall, in one embodiment, be further capable of conducting intelligent or semi-intelligent decisions on how to best organize individual orders for timely production and delivery to a customer or customers including but not limited to the physical location of the bureau and or the customer.

Furthermore; according to commonly understood terminology used in manufacturing, the system illustrated in FIG. 5F shall be considered to include an automated production scheduling system responsible for automatic or semi-automatic routing and production queuing of the geospatial/3D models hereafter called products, being moved through the system.

FIG. 5G illustrates, according to widely accepted and understood meanings of the word nesting as used in manufacturing, a method or methods to automatically add 3D product(s)s to a single file representing a "batch build" on available Additive Fabrication machine connected to said system.

FIG. 5H illustrates an embodiment of a method for partial nesting that can include 2d and 3D nesting of products in an intelligent or semi-intelligent method, whereby decisions are made by the system to optimize the utilization of the build envelope of a 3D printing additive fabrication machine.

FIG. 5I illustrates an embodiment of a method for the addition of identification markings on a product represented by 3D geometry which are added as a 3D appendage, placard, tab, or directly to a surface of a part or product to convey information, which can be carried digitally, about said part or product into human or machine readable form including information about the part, the date of manufacture, customer information or other pertinent information. The method can be carried out by one or more approaches to 3D geometry manipulation methodologies, the location and content being defined by either a user or customer or automatically by the system, and the geometry being manifested, along with the geometry representing a user/customer product via one or more additive fabrication methodologies at the time of production of the user/customer product at one or more locations.

FIG. 5J illustrates a method for using a payment processing system as part of an e-commerce system. The payment system is responsible for approving orders, based on payments prior to producing products through the system.

FIG. 5K illustrates a method for using a system to intelligently determine what material and therefore what additive fabrication machine is best suited to produce the particular part or product.

FIG. 5L illustrates one preferred embodiment of a method for facilitating the distributed manufacturing of products processed through the system, including remote locations where additive fabricate on equipment resides, such as bureaus. The system may include intelligence to help the system determine how best to distribute the products for manufacturing including, for example, the relative distance from the bureau to the customer's address.

FIG. 5M illustrates one preferred embodiment of a method for facilitating the decision to use a distributed manufacturing location, such as a bureau, by analyzing parameters of the bureaus which may include a subjective rating system to discern the reputation of the facility for producing quality work and/or producing quality work in a timely manner. The system may include many parameters by which a facility, connected to the system, is chosen or not chosen to produce a product for a user/customer through the system.

FIG. 5A through 5M represent collectively, a flowchart depicting the spirit of the present invention and the preferred embodiment thereof such that the system carries out the automated product and processing of customer-designed, customized or personalized products manufactured by additive fabrication.

FIG. 6 represents a flowchart depicting a use scenario for automated production as described above in the manufacture of custom jewelry.

FIG. 7 depicts a nested tray of assorted unique custom products, complete with identification markings affixed to the sprue of the product by the system in an automated fashion. The nested tray depicted is thereby ready for production either locally or remotely. In this case, the products are custom jewelry.

FIG. 8 illustrates one embodiment of the present invention as a commercial product entitled "Digital Factory". The system is a scalable, self contained product integrating all of the various components of the system described, for the purpose of developing, producing and making for sale products to users/customers through the automation of the system, thereby providing a system with productivity advantage, pre-purchase visualization advantage, operational advantage, inventory advantage, order accuracy advantage, and labor productivity advantage.

FIG. 9 depicts an example web portal for accessing the system. The depicted web portal is usable for the custom design of a jewelry product, whereby the customer drives the selection and assembly of the product with chosen options and includes the ability to use the design interface presented to the user/customer to add pictures which are converted to 3D geometry through methods including but not limited to displacement mapping. The interface can also enable the customer to see the resultant of the customization/personalization.

FIG. 10 depicts a database and/or file system containing a plurality of individual products, each depicting a different set of 3D geometry or art. In this representation, the database enables selection of art panels that each are either rigid in design or contain editable parameters such as text or art and can themselves be interchangeable with each other. The products in the database can include any product which is capable of being adequately defined by 3D modeling in which an additive fabrication machine may print said geometry.

FIG. 11 represents a product core with a suppressed feature, in this case a sprue on a class ring. The sprue can be a necessary part of a casting operation. However, the appendage in this case is not an object that the consumer would wish to visualize during the design process. Therefore, the feature may be suppressed so as not to be visible to the user/customer as defined by the entity who devised said product for sale through said system.

FIG. 12 depicts a product core to which art can be attached by the CAD system in response to a customer's request, and to which a "top" or "bezel" can be mated, in this case, to form a class ring. Attaching multiple parts to define a product is within the scope of definable parameters they system may allow users/customers to modify on a product or products.

FIG. 13 depicts a 3D model for representative purposes, showing a stone for addition to a top or bezel of a customized ring. There may be many stones and bezels to choose from in designing a unique product. Each stone or bezel may contain editable features including text, art or other geometry. Editing sub-level fields of each object is applicable to a plethora of products to define their unique characteristics for an individualized or customized order.

FIG. 14 depicts various modification regions or "panels" of a product showing two-dimensional and three-dimensional text added to the regions by a 3D CAD engine.

FIG. 15 depicts a 3D model for representative purposes showing a top or bezel for mating with a stone of a customized ring. While the bezel will often contain editable features, the stone is a part that is often a suppressed feature in the manufacturing operation of additive fabrication since stones may be real or synthetic in nature. However, the stone in this example is an object that would be used for representative visualization of a finalized class ring containing the stone and bezel.

FIG. 16 depicts a stone, such as that shown in FIG. 13 mated with a bezel, such as that shown in FIG. 15. This geometry would be used for visualization by a consumer using the web portal so that the consumer may accurately portray the 3D representation of the final product. Such a feature would be suppressed if necessary, such as in the case of a class ring, by removing its geometry from the overall geometry before the product is manifested via Additive Freeform Fabrication.

FIGS. 17 and 19 illustrate network diagrams of embodiments of the present invention, wherein the illustrations depicts how a user, using a computer of varying forms including a PC, a notebook, or a smart phone or other device can connect to the system of the present invention through a router, a wireless access point, a modem or a wireless network such as a CDMA network. The illustrations of various connectivity methods are intended to be illustrative instead of restrictive in nature. The connectivity methods described thus far allow a plurality of users/customers to access the system through a communication network and connect to a web server. The web server is shown connected to a plurality of servers including a database server, a file server, an e-commerce server, a content management server, a directory server, an FTP server, a print server, and a proxy server with or without a firewall. Said servers are shown collectively connected to a local array of 3D printers. The system is also, in the embodiment presented, connected, through a network connection, to a remote array of servers, wherein each remote location contains 3D additive fabrication hardware. The remote additive fabrication hardware may be contained in a bureau or factory or an individual's home including the home of someone accessing the system such that the printed product is printed in the same geographical location as the user/customer. The various servers are presented in this format to illustrate the system deploying the method and are not intended to be inclusive. Furthermore, the servers presented may be virtual or contained in a single server or servers located in the same location or distributed to multiple locations geographically. The 3D printing hardware in this illustration is strictly intended to be illustrative.

FIG. 18 illustrates a website containing an example of a user interface allowing the design of a custom motorcycle gas tank, wherein the gas tank is being embossed, by 3D displacement mapping, with flames such that the gas tank, which was originally not embossed with the 3D flames, is considered to represent a customized or personalized product. The product can be produced by additive fabrication means, directly from the 3D data after being routed through said made-to-order digital manufacturing system and said resultant product can then be finished and shipped to said customer without molds, tooling or much of the labor required in traditional methods. The product, in this case being a gas tank, can still meet all form, fit and function requirements of said product including mating surfaces and other necessary features and also convey the desired characteristics of the user/customer design session.

In the foregoing specification, embodiments of the present invention, e.g. a Made-To-Order Digital Manufacturing Enterprise System have been described as applicable to an implementation anticipating internet-based ordering or touch-panel Kiosk-based ordering of custom or made-to-order 3D products of the types outlined herein, where the special advantages of the methods and systems are very attractive for both users/customers and manufacturers. However, embodiments of the present invention may be applied to the sale and/or manufacture of many products of a homogeneous or heterogeneous nature and are limited only by the production capabilities of current or future additive fabrication methodologies and equipment, as well as the ability to adequately describe a product or products as 3D models and render such 3D objects for a user/customer so that the manipulation and controls of the system have meaning to the user or customer of the system and clearly defined manufacturability parameters. Furthermore, the preceding specification has described with reference to specific embodiments thereof. However, various modifications and changes may be made thereto without departing from the broader spirit and scope of the invention. The specifications and drawings are, accordingly, to be regarded in an illustrative sense rather than a restrictive sense.

In an exemplary embodiment, a system enabling commercial opportunities for additive manufacturing production planning and scheduling of 3D CAD models, treating each 3D CAD Model as the object being routed and scheduled by the system; comprises: a first network enabled physical computing device having a memory, a processor, and a first non-transitory data storage device, containing processor-executable programming, that when executed, causes the first computing device to electronically; receive, from a first user device, a request to establish, configure or utilize the system, the first user device being associated with a commercial user including a manufacturer and or a merchant; generate and cause to be displayed, on the first user device, in response to the request, at least one display page comprising an input and configuration interface, accessible by the first user at the first user device to establish, configure, or utilize the system from the first users' device; receive and index, from the first user, at least one of: 3D Printer printing device parameters, specifications, quantity of each device, and/or geospatial locations; wherein the received and indexed printer devices represent production capacity resources registered within and utilized by the system for production scheduling; receive and index, from the first user, production planning criteria utilized by the system for organizing and arranging each discrete 3D CAD model received for production; wherein the received production planning and scheduling criteria is utilized by the system to optimize production workloads between indexed production resources and for organizing, nesting and packing tray files; receive, from the first user, or a second user, in an electronic file buffer, configured as a job aggregation device, a first aggregation of 3D CAD model files, each 3D CAD model file of the first aggregation of 3D CAD model files corresponding to and representing at least one order for a product producible as at least one manufacturing job of a plurality of manufacturing jobs; wherein the second user is a customer of the first user; wherein each manufacturing job of the plurality of jobs comprises at least one of: a confirmation to physically obtain the product represented by at least one 3D CAD Model file from the plurality of aggregated 3D CAD model files, a material selection from a plurality of available indexed materials, an address for delivery of the physical product manufactured from one or more of the 3D CAD model files, or a quantity of the product manufactured, at least in part, from one or more of the 3D CAD model files for each respective order; analyze, each discrete 3D CAD model file geometry initial orientation to determine the dimensions of each discrete 3D CAD model file and based on the obtained data, to determine an orientation, minimizing the build time of the product from the received 3D CAD model; apply the previously determined build orientation minimizing the build time of the product from each 3D CAD model file by altering the initial orientation of the 3D CAD model to the computed build orientation minimizing build time and update the 3D CAD Model file representing the order accordingly; transfer each updated 3D CAD model to a production queue, wherein the production queue is associated with at least one of; at least one 3D printing device of a plurality of 3D printing devices or a 3D printing material of a plurality of 3D printing materials, wherein each 3D printing device of the plurality of 3D printing devices is indexed, and wherein each 3D printing material of the plurality of 3D printing materials is indexed; schedule and arrange, in order to optimize production workloads, on available indexed production resources, subset groups of discrete 3D CAD models from the one or more production queues, in the quantities specified for each order, into batches of 3D CAD Model files fitting within at least one of: a printable area or a bounding box of at least one of: one or more previously defined and indexed 3D printing devices from the plurality of defined and indexed 3D printing devices or a 3D printing device associated with a 3D printing material of the plurality of defined and indexed 3D printing materials, until at least one of: the printable area or the bounding box is completely occupied, maximizing the number of 3D CAD models printable in a batch, or a pre-set limit based on the plurality of production criteria received from the first user device is reached; compile a first batch of scheduled, arranged and packed 3D CAD model geometries into a tray file; assign the compiled tray file, prepared by the system, to the production queue of the at least one indexed 3D printer device associated with and corresponding to the plurality of scheduling and packing criteria; instruct the at least one 3D printer device to produce the jobs utilizing the tray file data corresponding directly to the nested 3D CAD Model data, the 3D Printer device communicatively coupled to and arranged to receive the data from the system to do so; and transfer the compiled tray file containing the first batch of 3D CAD Model data to at least one indexed 3D Printer device for production of the geometries in the nested tray file in the material specified in the batch; wherein the at least one computing device is additionally configured to; continuously receive 3D CAD Model files and production criteria, representing production jobs from at least one of: a first user and or a plurality of second users; continuously schedule and arrange batches of received 3D CAD Model files representing production jobs into a plurality of nested and packed tray files; electronically manage the trade-off between throughput and capacity in nesting and scheduling, in order to optimize production workloads, treating each 3D CAD Model as the object being routed and scheduled by the system; collect a plurality of system-generated tray files in one or more electronic production queues, based on at least one of: a first user from a plurality of first users, 3D Printer printing device parameters, specifications, quantity of each device, 3D printer Printing Material and a geospatial location of the 3D Printing device/facility in relation to the physical delivery address of the product; enable, the system to optionally operate utilizing an Application Programming Interface (API) enabling at least one additional computing device to communicate with the first computing device in order to transfer 3D CAD Model files and associated production criteria, representing orders, to the first computing device for production planning, scheduling and nesting into tray files; accept an input of any 3D CAD Model designed in a plurality of design software packages; and convert, as needed, each received 3D CAD Model files into a manufacturable version of the 3D CAD Model file.

The processor-executable computing instructions are further configured to: receive, from the first user, using the user device, an input designating at least two distinct 3D printing materials representing and corresponding to a material capable of conveying the design intent of a product obtainable from the system wherein the materials become registered and indexed in the system; establish, by the system, based on the input from each first user, at least one production queue for each material, for at least one of: 3D printer materials input by each first user or 3D printer materials for each corresponding designated 3D printer device, utilizing the at least one 3D printer material input by each first user of the system; receive and aggregate, by the system, a plurality of 3D CAD model files, each 3D CAD model file of the plurality of 3D CAD model files comprising at least one 3D CAD model representing and corresponding to a printing job and corresponding production criteria associated with the printing job, the plurality of production criteria including at least one 3D printing material from the available 3D printing materials designated in the system; parse, by the system, the received plurality of production criteria of each aggregated 3D CAD model to obtain at least the 3D printing material associated with each printing job; compare, by the system, the parsed 3D Printing material for each job to the at least two previously established material-based production queue capable of conveying the design intent of a product obtainable from the system; sort, by the system, each Job and its' corresponding 3D CAD Models in the aggregation of 3D CAD Models into material-based subset groups of 3D CAD Models based on the determination, assign, by the system, each 3D CAD model in each subset group to a production queue based the 3D printing material specified for the 3D CAD models of each subset group; schedule and continuously arrange together, by the system, the 3D CAD models from at least one queue of the plurality of queues into batches of nested 3D CAD models fitting within at least one of: the printable area and the virtual bounding box of at least one of a 3D printing device of the plurality of 3D printing devices; and compile, by the system, the batches of sorted, scheduled, arranged and nested 3D CAD models into tray files wherein each tray file is associated with at least one printing material and or at least one 3D printer device associated with the at least one 3D printing material.

The processor-executable computing instructions are further configured to: receive, by the system, in an order aggregating device, associated with the system, an aggregation of 3D CAD Model files each containing at least one geometry representing and corresponding to a Job and defined production criteria data corresponding to each Job; analyze, by the system, each 3D CAD model file to obtain the dimensions of the initial orientation of each 3D CAD Model; determine, by the system, an orientation of each 3D CAD Model minimizing the build time of each 3D CAD Model for each job in the order aggregation device and maximize productivity on available production resources; re-orient, by the system, in response to the determination, the geometry of each 3D CAD Model file according to the previously determined orientation minimizing 3D Printer build time; update, by the system, the 3D CAD model file in the system with the new orientation, in a manner maintaining the order/job and any user-defined production criteria linked within the system for downstream processing.

The processor-executable computing instructions are further configured to: receive, by the system, from the plurality of first users, a plurality of production capabilities for each first user, the plurality of production capabilities comprising at least one of: 3D printing device designations, 3D printing material specifications for each designated 3D printing device, a quantity of a designated 3D printing device, a bounding box of the designated 3D printing device, a printable area of each designated 3D printing device, a print speed of each designated printing device, or a process type of each printing device and wherein each first user represents a commercial user having production capabilities; register and index, by the system, the production capabilities of each first user, received by the system, in a profile for each first user; receive, by the system, from a plurality of first users and or second users, using user devices, an aggregation of 3D computer aided design (CAD) files each containing at least one 3D CAD model and corresponding production criteria collectively representing at least one order for a product, wherein each order represents one or more printing jobs; parse, by the system, each 3D CAD model file associated with each order and corresponding production criteria to obtain a plurality of production requirements for each order, the production requirements comprising at least a user-defined material selection; analyze, by the system, the production requirements of each printing job of each order received and the dimensions of each discrete 3D CAD model file associated with each job, wherein the dimensions define the initial orientation of each corresponding 3D CAD model; determine and select, by the system, at least one indexed production resources, from the production capabilities, meeting the production requirements comprising at least one of: the size of each object for each printing job, the second-user-defined material selection and a determination of an orientation, minimizing the build time of a product from each 3D CAD model; apply, by the system, the previously determined build orientation minimizing the build time, to each 3D CAD model file, for each corresponding job, by altering the initial orientation of the 3D CAD model to the computed build orientation minimizing build time and updating the 3D CAD Model file representing the order accordingly; sort, by the system, based on the analysis and selection, each 3D CAD model into subset groups of 3D CAD Models based on indexed printer device specifications meeting the production requirements for each order comprising at least one of: first user or second user specified 3D printing material requirements, the bounding box of indexed 3D printing devices, the printable area of the indexed 3D printing devices, a print speed of indexed 3D printing devices, and a process type of indexed 3D printing devices; schedule and continuously arrange together, by the system, the sorted subset groups of 3D CAD models into batches of 3D CAD Models, wherein each batch fits within at least one of: the printable area or the bounding box of the production resource selected by the system, wherein the scheduling subroutine manages the tradeoff of maximizing production capacity or optimizing delivery time and wherein the arranging subroutine is nesting of 3D CAD Models.

The processor-executable computing instructions are further configured to: receive, from a plurality of commercial users, using user devices, a request to establish, configure, or utilize the system; generate and cause to be displayed, on the plurality of commercial users' devices, at least one display page comprising an input and configuration interface configured to receive inputs from the plurality of commercial users' user devices to establish, configure or utilize the system; receive, from the plurality of commercial users' user devices, a plurality of production capabilities associated with each commercial user, representing one or more production facilities, the plurality of production capabilities comprising at least one of: 3D printing device designations, 3D printing materials for each designated 3D printing device, a quantity of a designated 3D printing devices, a bounding box of each designated 3D printing device, a printable area of each designated 3D printing device, a print speed for each designated printing device, a process type for each designated printing device, a geospatial location for each facility having the production equipment, or an available production capacity at each facility; associate the plurality of production capabilities received, to each commercial user, representing at least one production facility for each commercial user, wherein the production capabilities are further stored and indexed in the system; receive, by the system, from a plurality of first users and or second users, using user devices, an aggregation of 3D computer aided design (CAD) files each containing at least one 3D CAD Model and corresponding production criteria, including an address for physical delivery of the product and collectively representing at least one order for a product; parse, by the system, each 3D CAD model file for each printing job associated with the order and corresponding production criteria to obtain an address for physical delivery of the product; analyze, the production requirements of each 3D CAD Model and corresponding production criteria by parsing the production criteria to obtain the production requirements and then compare the requirements against indexed production resources; select, by the system, based on the analysis, at least one indexed production resource meeting the production requirements and wherein the geospatial location of the production resource is proximal to the physical delivery address of the product; and transfer, by the system, the 3D CAD model files and production criteria corresponding to the jobs determined to be produced remotely, to at least one additional computing device, arranged to receive and accept the data stream for the jobs at the remotely located 3D printer facility.

The processor-executable computing instructions are further configured to: receive, by the system, from a first user, a DMS score threshold and a plurality of DMS score criteria comprising at least one of: previous on-time delivery, a subjective quality of product, defects found after receipt, on-time payment, or previously canceled orders; receive, from a plurality of additional commercial users' user devices, a plurality of production capabilities associated with each commercial user, representing one or more production facilities; establish, by the system, a baseline Distributed Manufacturing Score (DMS) for each of the plurality of additional commercial users establishing use of, and defining production resources within the system; wherein the baseline DMS score established for each commercial user, is utilized by the system to, at least in part, determine if a geospatially located commercial user may receive production jobs from the first commercial user; receive, by the system, from a plurality of first users and or second users, using user devices, an aggregation of 3D computer aided design (CAD) files each containing at least one 3D CAD Model and corresponding production criteria, including an address for physical delivery of the product and collectively representing at least one order for a product; parse, by the system, each 3D CAD model file for each printing job associated with the order and corresponding production criteria to obtain an address for physical delivery of the product and indexed production resources; analyze, the production requirements of each 3D CAD Model and corresponding production criteria by parsing the production criteria to obtain the production requirements and then compare the requirements against potential indexed production resources and the current DMS Scores of potential indexed production resources; select, by the system, based on the determination, at least one indexed production resource meeting the production requirements, the geospatial location of the production resource relative to the physical delivery address of the product and the minimum acceptable current DMS score defined in the system; transfer, in response to a determination that the DMS score of the remotely located printing facility meets or exceeds the DMS threshold, each 3D CAD model and corresponding production criteria associated with the order to the remotely located 3D printing facility to produce the product and make physical delivery; request, from each user having previously submitted production jobs, subjective quality feedback based on the plurality of DMS score criteria defined in the system; receive, from a plurality of user devices, representing customers of the first commercial user, feedback for previous outsourced production jobs produced by the plurality of 3D printing facilities, the feedback comprising responses to the DMS score criteria; update, based on the feedback, the distributed manufacturing score (DMS) for the 3D printing facility receiving the previous production job for which feedback was provided and wherein the revised DMS score affects future orders to the production facility.

The processor-executable computing instructions are further configured to electronically: receive, by the system, from a merchant user device, a request to access an interface in order to establish, configure or utilize the system, the first user device being associated with a merchant user; cause, by the system, at least one display page to be displayed on the merchant user device, the first display page being configured to receive inputs from the first merchant user device in order to configure the system and enabling the system to generate, at least portions of an electronic marketplace, on one or more website domains, the electronic marketplace operated by the first merchant and wherein the electronic marketplace is accessible over a communication network; receive, by the system, from the merchant user device, at least one 3D CAD model file, wherein the 3D CAD Model is intended to be stored in a product catalog, represented by 3D CAD models; generate and cause to be displayed, by the system, on the first user device, a second display page configured to receive inputs associated with product information for the 3D CAD model file, wherein the information comprises at least one of: product details, pricing information, transaction methods, pictures of the product and product shipping arrangements; receive, by the system, from the first user device, product information for the at least one 3D CAD model file; link and store, by the system, the at least one 3D CAD model file and the product information in the system, the 3D CAD Model and associated product information representing a base design for a product physically obtainable from the system; receive, by the system, from a second user consumer device, a request to access the electronic marketplace operated by the first user, at least portions of which are generated by the system; retrieve and cause to be displayed, by the system, a third display page on the second user consumer device, the third display page, displaying a catalog of available products from the first user merchant's marketplace comprising the at least one product defined by product information and the at least one 3D CAD Model file; receive, from the second user, an input of a selection of a product displayed and available from the catalog; retrieve and cause to be displayed, on the second user consumer device, at least portions of a fourth display page comprising information for the selected product and pictures of the product in a manner indicating that the product is available to be obtained from the system; receive, from the second user consumer device, a request to obtain the product and production criteria comprising at least one of: a material selection, a scale of the product, a quantity of copies of the product and an address for physical delivery of the product; generate, by the system, a copy of the 3D CAD Model file stored in the system and transfer the copy of the 3D CAD Model file to an order aggregation device associated with the system and the production criteria in a manner linking and associating the copy of the at least one 3D CAD Model and production criteria as a production job; wherein the at least one computing device is additionally configured to: receive requests from a plurality of first merchant users; generate at least portions of a plurality of electronic marketplaces operated by each first merchant user; enable a plurality of second customer users to access the plurality of electronic marketplaces operated by each first merchant user; and obtain products from the system generated by processing and converting the stored 3D CAD model files representing products, at least in part by additive manufacturing.

The processor-executable computing instructions are further configured to: receive, from a merchant user device or a 3rd party product contributor, at least one 3D CAD Model file representing a base design for a product available from the electronic catalog operated by the merchant user and generated, at least in part, by the system; prepare, by the system, at least one rendering of the at least one received 3D CAD model; link and store, by the system, the rendering in a manner associating the rendering with the product and product information in the catalog; receive, by the system, from a consumer user device, a request to access the electronic marketplace operated by the first user, at least portions of which are generated by the system; retrieve and cause to be displayed, by the system, a first display page on the consumer user device, the first display page, displaying a catalog of available products from the first user merchant's marketplace comprising the at least one product defined by product information, the at least one 3D CAD Model file and the at least one rendering of the product; receive, from the consumer user, an input of a selection of a product displayed and available from the catalog; retrieve and cause to be displayed, on the consumer user device, at least portions of a second display page comprising information for the selected product and a representation of the one or more associated 3D CAD models linked and stored within the system, wherein the representation may include one or more pictures and one or more system generated renderings of the product; and wherein the system is configured to generate a plurality of renderings of each 3D CAD Model file uploaded to the system.

The system further comprises an electronic payment processing device including processor-executable instructions configured to electronically: receive, from a merchant user device, a request to establish, configure or utilize the system; generate and cause to be displayed, on the merchant user device, in response to the request, at least one display page comprising an input and configuration interface, accessible by the first user, at the first user device, enabling the merchant to configure payment options for use with the electronic marketplace portion of the system; receive, by the system, from the merchant user device, payment option configuration information; link and store the payment options associated with the merchant user in the system; receive, from a consumer user device, by a consumer, a request to obtain a product represented by at least one 3D CAD model available in an electronic marketplace, the marketplace generated, at least in part by the system; present, by the system, to the consumer at the consumer user device, a plurality of payment options previously configured by the merchant user; wherein receive, from the consumer user device, a selection of a payment option displayed, of the plurality of displayed payment options, the selection additionally comprising an address for physical delivery of the product; process the selected payment option for approval; receive, from a payment gateway, a notification of successful processing of the payment option; generate, by the system, based on the payment gateway approval, a copy of the 3D CAD Model file stored in the system, representing the product selected; transfer, by the system, the generated copy of the 3D CAD Model file to an order aggregation device associated with the system and the production criteria for the order, in a manner linking and associating the copy of the at least one 3D CAD Model and order production criteria as a production job; generate, by the system, based on at least the payment gateway approval, at least one of: an order acknowledgement for the production job and an estimated time of production for the order; cause, by the system, at least one of: an order acknowledgement for the production job and an estimated time of production for the order to be displayed on the consumer user device.

The processor-executable computing instructions are further configured to: receive, by the system, from a third-party contributor user device, at least one 3D CAD model files representing a base design for a product available from the electronic catalog operated by the first merchant user and wherein the 3D CAD Model is intended to be stored in a product catalog, represented by 3D CAD model; generate and cause to be displayed, by the system, to the third-party contributor user device, a first display page configured to receive inputs associated with product information for the 3D CAD model file, wherein the information comprises at least one of: product details, pricing information, transaction methods, pictures of the product and product shipping arrangements; receive, by the system, from the third-party contributor user device, product information for the at least one 3D CAD model file and a request to publish the product within the system, making the product available to a plurality of customer users of the merchant user; link and store, by the system, the at least one 3D CAD model file and the product information in the system, the 3D CAD Model and associated product information representing a base design for a product physically obtainable from the system, in a manner associating the third-party user to the product; publish, by the system, based on the request to publish, received from the third-party user, the at least one 3D CAD model and the associated product information to the electronic marketplace; receive, from a consumer user device, by a consumer, a request to obtain a product represented by at least one 3D CAD model available in an electronic marketplace, the marketplace generated, at least in part by the system; present, by the system, to the consumer at the consumer user device, a plurality of payment options previously configured by the merchant user; wherein receive, from the consumer user device, a selection of a payment option displayed, of the plurality of displayed payment options, the selection additionally comprising an address for physical delivery of the product; process the selected payment option through the payment gateway for approval; receive, from a payment gateway, a notification of successful processing of the payment option; generate, by the system, based on the payment gateway approval, a copy of the 3D CAD Model file stored in the system, representing the product selected and transmit a commission to a third-party contributor of the crowdsourced content; enabling a plurality of third-party contributor users to upload and publish 3D Cad Models and product information into the electronic marketplace operated by a first merchant user using the system and enabling the first merchant user to crowdsource content into the electronic marketplace for sale to a plurality of second-user customers.

The processor-executable computing instructions are further configured to: receive, by the system, from the first merchant user device, a second user manufacturer device, or a 3rd party contributor device, at least one 3D CAD model file representing a base design for a product; generate and cause to be displayed, by the system, to the first merchant user device, second user manufacturer device or third-party contributor device, at least one display page comprising a traveler input and definition interface and a representation of the at least one 3D CAD model representing a base design for a product; receive, by the system, from the first merchant user device, second user manufacturer device or third-party contributor device, a traveler feature configuration comprising: a designation of a traveler geometry type, a location of the traveler geometry position relative to the base 3D CAD model, an orientation defining the traveler geometry position relative to the base 3D CAD Model, and instructions defining the information to be converted into geometry by the system; wherein the traveler geometry types include at least: a tab, break-away tab, sprue, placard, or direct part marking, wherein the information to be converted into geometry on the traveler feature comprises at least one of: a specific customer, an order number, a lot or batch code, a serial number, lot number, manufacturer's number, part number, location, timestamp, city, state, or zip code, or combinations thereof, wherein the form of the information generated on the traveler feature comprises a human or machine-readable representation of the unique identifier, taking the form at least one of: three-dimensional alphanumeric characters, a three dimensional representation of a barcode, a three-dimensional representation of two-dimensional data matrix, a hieroglyph, a logo, or other geometry; link and store the defined and configured traveler feature for the corresponding 3D CAD model in the first data storage device; receive, by the system, from a consumer user device, a request to obtain a product represented by at least one 3D CAD model physically available in from the system, the at least one 3D CAD Model having a defined and configured traveler feature; convert, by the system, the previously designated traveler requirements into 3D geometry utilizing at least one of a 3D CAD kernel and or one or more approaches to Computer Aided Design; compile, by the system, the 3D CAD model file into a finalized 3D CAD model file containing the traveler geometry and base 3D CAD model geometry; transfer the finalized 3D CAD Model file to an order aggregation device associated with the system and the order production criteria in a manner linking and associating the copy of the at least one 3D CAD Model and production criteria as a production job; and wherein the traveler geometry is suppressed in the consumer user display and not suppressed in the finalized 3D CAD model file generated and routed for production.

The processor-executable computing instructions are further configured to enable a method of co-design to electronically: receive, by the system, from a first merchant user device, or a third-party contributor user device, at least one computer file containing at least one 3D CAD model representing a base design for a product; generate and cause to be displayed, by the system, on the merchant user device, or the third-party contributor user device, at least one display page comprising an input and configuration interface; receive, by the system, from the first merchant user device, or a third-party contributor user device, a plurality of marketplace product information and optionally, at least one selection of a geometric modifier corresponding to an alteration of the geometric features of the base design; receive, by the system, from the first merchant user device, or a third-party contributor user device, at least one of: a plurality of marketplace product information for publication in the electronic marketplace and at least one selection of a geometric modifier and a corresponding set of parameters for the geometric modifier, defining an alteration of the geometric shape of the 3D CAD Model base design; wherein the graphically displayed geometric modifiers, within the interface, and input fields, correspond to system executable functions, using one or more approaches to 3D design or design implementation to alter geometric features of the base design for the product; link and store, by the system, the at least one 3D CAD model file, product information the at least one defined geometric modifier and corresponding parameters, marketplace product information collectively representing a base design for a product physically obtainable from the system; receive, by the system, from a consumer user device, a request to access the electronic marketplace operated by a first merchant user, at least portions of which are generated by the system; retrieve, generate and cause to be displayed, by the system, at least portions of an electronic catalog of available products from the first merchant's user marketplace comprising the at least one product defined by product information, the at least one 3D CAD Model file and at least one defined geometric modifier; receive, by the system, from the consumer user device, an input of a selection of a product displayed and available from the catalog; retrieve, generate and cause to be displayed, on the consumer user device, at least portions of a second display page, indicating that the product is available to be obtained from the system, comprising at least a relational input/output and configuration interface having controls enabling configuration of the at least one previously defined geometric modifier and a representation of the 3D CAD model representing the base design of the product; receive, by the system, from the customer user device, an optional selection of the at least one geometric modifier and corresponding set of options parameters and values defining an alteration of the geometric shape of the 3D CAD Model base design; execute, by the system, any received inputs for the at least one geometric modifier, based on any input received from the consumer user device, generating a modified version of the 3D CAD Model based on the consumer user input, and updating the displayed design representation on the consumer user device; receiving, by the system, from the consumer user device, using the second user device, a request to obtain the current configuration of the product currently displayed on the second user device and at least one of; a geospatial location for delivery of the physical product, a material selection, a scale or a quantity of copies of the product; compiling, by the system, the current configuration of the 3D CAD Model File into a finalized 3D CAD Model File, in a manner linking the modified 3D CAD Model and consumer user-defined production criteria corresponding to the order for the product represented by compiled version of the modified 3D CAD model; transferring, the compiled 3D CAD Model file to an order aggregation device associated with the system and the production criteria in a manner linking and associating the compiled 3D CAD Model and production criteria as a production job, treating the 3D CAD Model as the object being digitally routed for production by the system; enabling the system to provide electronic commerce functionality adapted specifically for providing geometric co-design of products defined by a first merchant user or third-party contributor user and configured by a plurality of second consumer users; and wherein each modifier corresponds to a plurality of functions executable, to alter geometric features of the base design for the products by means of a 3D Kernel/engine.

The processor-executable computing instructions are further configured for electronic 3D view data preparation to electronically: receive, by the system, consumer user device, a selection of at least one product available in the electronic marketplace, the product represented by at least one manufacturable 3D CAD Model previously uploaded, indexed and stored in the system; retrieve, generate and cause to be displayed, by the system, on the consumer user device, a display page comprising, at least in part, a web-compatible representation of the at least one 3D CAD Model representing the base design for the product stored the system; enabling the user/customer, using the user device, to accurately visualize the digital representation of the physical product obtainable, from the system, manufactured, at least in part from the 3D CAD Model previously received, indexed and stored in the system; wherein the at least one generated page may additionally include at least portions of an electronic marketplace, the electronic marketplace being configured for co-design between a first merchant user or third-party contributor and a plurality of second consumer users.

The processor-executable computing instructions are further configured to comprise executable API subroutines definitions, protocols, and tools when invoked by an API-based command comprising; a first network enabled physical computing device, having the Application Programming Interface arranged to listen for communication from a plurality of second physical computing devices, invoking one or more API subroutines to collaboratively perform the method of claim 1 to electronically; receive, by the first physical computing device, from at least one second physical computing device at least one 3D computer aided design (CAD) file, containing at least one 3D CAD Model geometry representing and corresponding to a an order and production criteria data corresponding to the order, the production criteria comprising at least one of: a material selection, a scale of the product, a quantity of copies of the product and an address for physical delivery of the product; link and store, by the first physical computing system, the at least one received 3D CAD model file and corresponding production criteria information in the system; transfer the 3D CAD Model file to an order aggregation device associated with the first physical computing device and the production criteria in a manner linking and associating the at least one 3D CAD Model and production criteria as a production job in the first computing system for further processing; wherein the first physical computing device is configured to receive one or more printing jobs of a plurality of printing jobs from one or more second physical computing devices or a plurality of second computing devices; and wherein the first physical computing device is configured to instruct at least one 3D printer device to produce the jobs utilizing the tray file data corresponding directly to the nested 3D CAD Model data, the 3D Printer device communicatively coupled to and arranged to receive the data from the system to do so.

The processor-executable computing instructions are further configured to: receive, by the system, from a first manufacturer user device, a second merchant user device or a third-party contributor device, at least one 3D CAD Model file containing multiple geometries where each geometry represents a component portion of an assembly; generate and cause to be displayed, by the system, on a first manufacturer user device, a second merchant user device or a third party contributor device, an input and configuration interface comprising relational controls, represented graphically and a web-compatible representation of the 3D CAD Model assembly; wherein the material designations for each geometry represent a sorting parameter for each portion of the 3D CAD Model assembly in downstream processing; receive, by the system, from a first manufacturer user device, a second merchant user device or a third-party contributor device, a material selection for each discrete geometry comprising the assembly, in the 3D CAD model file and a request to physically obtain the product causing the system to initiate a process for manufacturing routines; receive, at an order aggregation device, associated with at least one physical computing device, the 3D CAD file containing at least two distinct 3D CAD Model geometries and corresponding production criteria for the two distinct geometries in the file, the two 3D CAD model geometries each specifying at least a different material production criteria for each geometry; parse, in response to the receiving of the 3D CAD Model at the order aggregation device, the production criteria for each 3D CAD Model geometry representing the order to obtain the production requirements for each component of the product, the production requirements comprising at least two distinct user-defined material selections and, a delivery address for the product; analyzing, in response to the requests to obtain the products, user-defined material selections for each corresponding geometry of the 3D CAD Model received in the order aggregation device, representing a job utilizing the previously parsed user specified order production requirements and available indexed production resources to sort and schedule corresponding 3D CAD Models into groups of 3D CAD Models for production on the available production resources based on the material specification for each geometry; sort and assign, by the system, based on the parsed data and analysis, each discrete 3D CAD Model geometry from the assembly into material-based subset groups of 3D CAD Models based on and corresponding to the type of a 3D printing material specified for use in each corresponding portion of the 3D CAD Model geometry in a manner maintaining the relation of the two or more geometries of the assembly representing a job, making the data available for downstream processing; and wherein where each assembly geometry has defined, a user-defined material specification such that the system may make use of multiple types of Additive Fabrication hardware simultaneously or concurrently to manifest each component geometry of the assembly-based 3D CAD Model that comprise a product that is by design or by desire, necessary to be made of different materials and assembled from the various components, in this situation would be responsible for routing components that must be manifested out of differing materials to several or many local or remote locations for fabrication via Additive Fabrication process that supports fabrication of the desired or required material substance.

The processor-executable computing instructions are further configured to: receive, by the system, from a first manufacturer user device, a second merchant user device or a third-party contributor device, at least one 3D CAD Model file containing at least one 3D geometry, production criteria and a confirmation to process the uploaded 3D CAD model file for manufacturing; wherein the production criteria comprises at least a selection of a previously indexed 3D Printing Material for production of the 3D CAD Model geometry; parse, by the system, the data of the 3D CAD Model file, the production criteria material election and corresponding material properties for the selected material; load, by the system, in a test environment, using at least a 3D CAD Kernel, the 3D CAD Model geometry and material properties; analyze, in the test environment, using at least the 3D CAD Kernel to perform the analysis, the geometry of the 3D CAD Model to simulated responses to environmental factors to determine the performance of the part, produced in the selected 3D Printing material; wherein the environmental factors comprise at least one of: material stress analysis and Finite Element Analysis; generate and cause to be displayed, by the system, on the first manufacturer user device, second merchant user device or third-party contributor device, based on the analysis, an output comprising at least one of: a report of the test results, a first notification that the 3D CAD model is ineligible production, a second notification indicating that the at least one geometry does not meet the performance criteria required to be processed for manufacturing, a third notification that that the 3D CAD Model has been passed the test and a fourth notification that the 3D CAD Model has been routed for production by the system.

The processor executable computing instructions are further configured to comprise executable API subroutines definitions, protocols, and tools when invoked by an API-based command and an encryption engine comprising; the first network enabled physical computing device, having the Application Programming Interface and an encryption engine arranged to listen for communication from a plurality of second physical computing devices, invoking one or more API subroutines and the encryption engine to collaboratively perform the method of claim 1 to electronically; receive, by the first computing device, a request to establish, communication from at least one second computing device, the at least one second computing device having previously established an ability to communicate with and utilize the system; establish, by the first computing device, an encrypted communication link to the at least one second computing device; receive, by the first physical computing device, from at least one second physical computing device at least one 3D computer aided design (CAD) file, containing at least one 3D CAD Model geometry representing and corresponding to an order and production criteria data corresponding to the order, the production criteria comprising at least one of: a material selection, a scale of the product, a quantity of copies of the product and an address for physical delivery of the product; wherein at least some of the plurality of 3D CAD model files are associated with products for distributed manufacturing of wartime assets for forward battlefield manufacturing, shipboard manufacturing, or other military operations; wherein, the first computing device may additionally establish reciprocal encrypted communication to transfer production jobs from the first computing device to the at least one second computing device for remote manufacturing of products; and wherein at least some of the plurality of 3D CAD model files are associated with products for distributed manufacturing of wartime assets for forward battlefield manufacturing, shipboard manufacturing, or other military operations.

The processor-executable computing instructions are further configured to include and adapt an executable Product Lifecycle Management System (PLM) and an executable Product Data Management System (PDM) adapted to electronically; receive, by the system, from a first merchant user device, or a third-party contributor user device, at least one 3D CAD Model file representing a base design for a product; generate and cause to be displayed, by the system, on the merchant user device, or the third-party contributor user device, at least one display page comprising an input and configuration interface; receive, by the system, from the first merchant user device, or the third-party contributor user device, with the intent to publish in the electronic marketplace, at least one of: a plurality of marketplace product information and at least one designation of a geometric modifier and a corresponding set of parameters for the geometric modifier, defining an alteration of the geometric shape of the 3D CAD Model base design; link and store, by the system, the at least one 3D CAD model file in the executable Product Lifecycle Management System (PLM) and the product information in the executable Product Data Management System (PDM), the 3D CAD Model and associated product information representing a base design for a product physically obtainable from the system; receive, by the system, from a second user consumer device, a request to access the electronic marketplace operated by first merchant user, at least portions of which are generated by the system; retrieve, generate and cause to be displayed, by the system, on the second user consumer device, at least one marketplace display page, displaying the merchants' catalog of available products retrieved from the PDM and PLM systems, comprising the at least one product defined by at least one 3D CAD Model file and product information from the PDM and PLM systems; receive, from the second consumer user device, an input of a selection of a product displayed and available from the catalog; retrieve, generate and cause to be displayed, by the system, on the second user consumer device, at least portions of a second marketplace display page, indicating that the product is available to be obtained from the system, comprising at least one of: product information a representation of the 3D CAD Model retrieved from the PDM & PLM systems and a relational input/output and configuration interface based on any previously defined geometric modifiers; receive, by the system, from the second user consumer device, at least one of: a selection and corresponding set of parameters for an alteration of the geometric shape of the base design of the product, a request to obtain the current configuration of the product currently displayed on the second user device, a geospatial location for delivery of the physical product, a material selection, a scale or a quantity of copies of the product; compile, by the system, the current configuration of the 3D CAD Model file into a finalized 3D CAD Model file, in a manner linking the modified 3D CAD Model and second user consumer defined production criteria corresponding to the order for the product; transfer, by the system, based on the request to obtain the product, the compiled 3D CAD Model file to an order aggregation device associated with the system and the production criteria, in a manner linking and associating the compiled 3D CAD Model and production criteria as a production job, treating the 3D CAD Model as the object being routed for production by the system; wherein the first-user defined, second-user editable geometric modification functions available in the marketplace comprise at least: 3D text, on a surface of a base 3D CAD Model, the text being a first user-defined, second-user/editable option for the base product comprising a font selection by a font module, a location performed by a part mate module and a Boolean operation to append the base 3D CAD Model with the text geometry; a library of assembly-based panels or shanks or "clip art" for attaching or appending to the base 3D CAD Model with one or more subordinate components, as an additional feature to the base 3D CAD Model, creating an assembly; a displacement mapping function comprising a first-user defined region for displacement mapping and a second-user editable region converting a second user provided 2D Raster image into 3D Geometry or topology utilizing an upload artwork module, the displacement mapping performed by the system, enabling 3D art to be generated on an area of the base 3D CAD model by 3D Displacement mapping; geometric alteration functions for first-user defined, second-user customer configurable modification to the base 3D CAD Model comprising at least: an extrude function, an emboss function, a surface finish function a stretch/skew/smorf function and a texture map function for altering the geometry of the base 3D CAD model if enabled by the first user/merchant or 3rd party publisher; a surface paint function for second-user customer configurable color application to the 3D CAD model surface within the browser; and a ring sizing function, for altering, by the system, by scaling, the geometry of a first user received and designated base 3D CAD Model of a ring to a second user customer designated ring size to meet the ring size criteria, utilizing the 3D Kernel to do so.

In another exemplary embodiment, a system adapting an electronic marketplace for on-demand fabrication of a product comprises: at least one network enabled physical computing device having a memory, a processor, and at least one physical data storage device, the at least one physical data storage device arranged to store 3D CAD Models, the 3D CAD Models representing and corresponding to the digital representation of a product available from the system and wherein the at least one physical data storage device also contains processor-executable programming, configuring and enabling at least one computing device to electronically; receive, from a first user device, at least one 3D CAD Model file, and product information pertaining to the product represented by the 3D CAD Model, the at least one 3D CAD Model representing a base design for a product available from the system; receive, from a second user device, using a second user device a request to obtain the product, the product represented by the at least one 3D CAD Model stored in the system; In response to a request to obtain the product, received from the second user, initiating a process for manufacturing routine to electronically cause a physical product to be produced, at least in part from the data describing the at least one 3D CAD Model, treating the 3D CAD Model as the object processed by the system; wherein the physical computing device is further programmed to: index and store a catalog of a plurality of 3D CAD models and corresponding product information, received by the system from a first user, in a manner for presentation in the electronic marketplace to plurality of second users; enable a plurality of second users to access the electronic catalog of 3D CAD Model files through a website displaying the products represented by the 3D CAD models in the catalog and offering a means to physically obtain the product; generate, by the system, copies of the at least one 3D CAD model representing each product, based on requests to physically obtain the products, transferring the copies of the 3D CAD Model files to the at least one order aggregation device; analyze and verify the production requirements for each 3D CAD Model received at the order aggregation device; analyze the received 3D CAD models to test for environmental performance based on at least one of: physical properties, part interference, strength of materials, price variations, mass, quantity, thread patterns, surface areas, mating surfaces, thermal properties, electrical properties, balance or other properties; schedule and arrange together, by the system, the plurality of 3D CAD Models, received in the order aggregation device, into tray files, containing nested batches of the plurality of the 3D CAD Models. accept and receive any 3D CAD Model designed in a plurality of design software tools including 3D CAD Models having production criteria associated as meta-data relating to order requirements enabling the use of the information for production planning.

The processor executable computing instructions are further configured to enable the system, treating each 3D CAD Model as the object being processed, to electronically; sort, each Job and its' corresponding 3D CAD Models into material-based subset groups of 3D CAD Models and assigning them to the queue of at least one of: an indexed 3D printer Printing material meeting at least the material requirements or an indexed 3D Printer Printing device having an associated 3D Printer Printing material queue; determine the orientation of each 3D CAD Model minimizing the build time of the 3D CAD Model by instructing, at least the 3D CAD Kernel/Engine to analyze, determine and then to re-orient the geometry of each 3D CAD Model file according to the previously determined orientation minimizing 3D Printer build time in a manner keeping the 3D CAD model and user-defined order criteria linked; schedule and arrange together a plurality of manufacturable 3D CAD Models in the production queues, within at least one of: the printable area or virtual bounding box of at least one of: a specified 3D Printer printing device and/or a 3D Printer printing device having a specified 3D Printing Material, until at least one of: the bounding box is completely occupied, maximizing the number of 3D CAD Models printable in a batch or reaching a pre-set limit based on criteria received from the commercial user; generate batched tray files in an electronic printer queue for each respective 3D Printer Printing device and or material and or facility assigned and/or responsive to a request by at least one remote manufacturer, making the queued tray files available to the at least one remote manufacturer; compile the data of now nested and packed 3D CAD models into a single computer file of re-oriented, arranged and nested 3D CAD Model geometries representing an optimized and scheduled batch of jobs from the queue, the compiled tray file itself being transfer to the at least one 3D Printer Printing Device specified for packing criteria operated by the at least one commercial user; route the various manufacturable 3D CAD models, based on at least one of: production scheduling criteria, materials, geospatial location for physical delivery to the appropriate machines/facilities depending on defined parameters including at least one of: the maximum size (build envelope), available number of machines, printing speed or throughput or material science of the particular process. transmit the tray files containing nested 3D CAD Model data to the respective 3D Printer Printing Device for production of products using and corresponding directly to the 3D CAD Model data by the selected at least one 3D printer printing device; enable optional first-user-defined, second-user-configured co-design of the manufacturable 3D CAD Models, from the catalog in the web-based electronic marketplaces, prior to receiving a request to obtain the product; enable commercial users to configure and utilize the system for local and optionally, remote manufacturing operations to analyze, sort, schedule and continuously arrange the plurality of 3D CAD Models adapted for Additive Manufacturing, treating each received 3D CAD Model as the object processed for manufacturing by the system; generate web-compatible view data of the 3D CAD models for presentation within the marketplace web pages of second users comprising at least one of: a rendering or a rasterized rendering; enable the generation and presentation, by the system, of at least portions of the catalog of 3D CAD Models in an electronic marketplace, accessed on the URL of at least one first merchant user using the electronic marketplaces operated by the commercial users; generate websites operated by the commercial users and to request to obtain the products through the websites the products represented by the 3D CAD models in the cataloged in the system; process payment prior to accepting requests to physically obtain the product represented by the at least one 3D CAD Model from the system; enable optional performance of at least portions of the system through an Application Programming Interface (API); and continuously receive at a job aggregation device a plurality of 3D CAD Model files for production queuing.

What is claimed is:

1. A system enabling commercial opportunities for additive manufacturing production planning and scheduling of 3D CAD models, treating each 3D CAD Model as the object being routed and scheduled by the system; comprising:
   a first network enabled physical computing device having a memory, a processor, and a first non-transitory data storage device, containing processor-executable programming, that when executed, causes the first computing device to electronically;
   receive, from a first user device, a request to establish, configure or utilize the system, the first user device being associated with a commercial user including a manufacturer and or a merchant;
   generate and cause to be displayed, on the first user device, in response to the request, at least one display page comprising an input and configuration interface, accessible by the first user at the first user device to establish, configure, or utilize the system from the first users' device;
   receive and index, from the first user, at least one of: 3D Printer printing device parameters, specifications, quantity of each device, and/or geospatial locations; wherein the received and indexed printer devices represent production capacity resources registered within and utilized by the system for production scheduling;

receive and index, from the first user, production planning criteria utilized by the system for organizing and arranging each discrete 3D CAD model received for production;
   wherein the received production planning and scheduling criteria is utilized by the system to optimize production workloads between indexed production resources and for organizing, nesting and packing tray files;

receive, from the first user, or a second user, in an electronic file buffer, configured as a job aggregation device, a first aggregation of 3D CAD model files, each 3D CAD model file of the first aggregation of 3D CAD model files corresponding to and representing at least one order for a product producible as at least one manufacturing job of a plurality of manufacturing jobs;
   wherein the second user is a customer of the first user;
   wherein each manufacturing job of the plurality of jobs comprises at least one of: a confirmation to physically obtain the product represented by at least one 3D CAD Model file from the plurality of aggregated 3D CAD model files, a material selection from a plurality of available indexed materials, an address for delivery of the physical product manufactured from one or more of the 3D CAD model files, or a quantity of the product manufactured, at least in part, from one or more of the 3D CAD model files for each respective order;

analyze, each discrete 3D CAD model file geometry initial orientation to determine the dimensions of each discrete 3D CAD model file and based on the obtained data, to determine an orientation, minimizing the build time of the product from the received 3D CAD model;

apply the previously determined build orientation minimizing the build time of the product from each 3D CAD model file by altering the initial orientation of the 3D CAD model to the computed build orientation minimizing build time and update the 3D CAD Model file representing the order accordingly;

transfer each updated 3D CAD model to a production queue, wherein the production queue is associated with at least one of; at least one 3D printing device of a plurality of 3D printing devices or a 3D printing material of a plurality of 3D printing materials, wherein each 3D printing device of the plurality of 3D printing devices is indexed, and wherein each 3D printing material of the plurality of 3D printing materials is indexed;

schedule and arrange, in order to optimize production workloads, on available indexed production resources, subset groups of discrete 3D CAD models from the one or more production queues, in the quantities specified for each order, into batches of 3D CAD Model files fitting within at least one of:

a printable area or a bounding box of at least one of:
   one or more previously defined and indexed 3D printing devices from the plurality of defined and indexed 3D printing devices or a 3D printing device associated with a 3D printing material of the plurality of defined and indexed 3D printing materials, until at least one of:
   the printable area or the bounding box is completely occupied, maximizing the number of 3D CAD models printable in a batch, or a pre-set limit based on the plurality of production criteria received from the first user device is reached;

compile a first batch of scheduled, arranged and packed 3D CAD model geometries into a tray file;
   assign the compiled tray file, prepared by the system, to the production queue of the at least one indexed 3D printer device associated with and corresponding to the plurality of scheduling and packing criteria;

instruct the at least one 3D printer device to produce the jobs utilizing the tray file data corresponding directly to the nested 3D CAD Model data, the 3D Printer device communicatively coupled to and arranged to receive the data from the system to do so; and transfer the compiled tray file containing the first batch of 3D CAD Model data to at least one indexed 3D Printer device for production of the geometries in the nested tray file in the material specified in the batch;

wherein the at least one computing device is additionally configured to;

continuously receive 3D CAD Model files and production criteria, representing production jobs from at least one of: a first user and or a plurality of second users;

continuously schedule and arrange batches of received 3D CAD Model files representing production jobs into a plurality of nested and packed tray files;

electronically manage the trade-off between throughput and capacity in nesting and scheduling, in order to optimize production workloads, treating each 3D CAD Model as the object being routed and scheduled by the system;

collect a plurality of system-generated tray files in one or more electronic production queues, based on at least one of: a first user from a plurality of first users, 3D Printer printing device parameters, specifications, quantity of each device, 3D printer Printing Material and a geospatial location of the 3D Printing device/facility in relation to the physical delivery address of the product;

enable, the system to optionally operate utilizing an Application Programming Interface (API) enabling at least one additional computing device to communicate with the first computing device in order to transfer 3D CAD Model files and associated production criteria, representing orders, to the first computing device for production planning, scheduling and nesting into tray files;

accept an input of any 3D CAD Model designed in a plurality of design software packages; and convert, as needed, each received 3D CAD Model files into a manufacturable version of the 3D CAD Model file.

2. The system of claim 1, wherein the processor-executable computing instructions are further configured to:

receive, from the first user, using the user device, an input designating at least two distinct 3D printing materials representing and corresponding to a material capable of conveying the design intent of a product obtainable from the system wherein the materials become registered and indexed in the system;

establish, by the system, based on the input from each first user, at least one production queue for each material, for at least one of: 3D printer materials input by each first user or 3D printer materials for each corresponding designated 3D printer device, utilizing the at least one 3D printer material input by each first user of the system;

receive and aggregate, by the system, a plurality of 3D CAD model files, each 3D CAD model file of the plurality of 3D CAD model files comprising at least one 3D CAD model representing and corresponding to a printing job and corresponding production criteria associated with the printing job, the plurality of production criteria including at least one 3D printing material from the available 3D printing materials designated in the system;

parse, by the system, the received plurality of production criteria of each aggregated 3D CAD model to obtain at least the 3D printing material associated with each printing job;

compare, by the system, the parsed 3D Printing material for each job to the at least two previously established material-based production queue capable of conveying the design intent of a product obtainable from the system;

sort, by the system, each Job and its' corresponding 3D CAD Models in the aggregation of 3D CAD Models into material-based subset groups of 3D CAD Models based on the determination;

assign, by the system, each 3D CAD model in each subset group to a production queue based the 3D printing material specified for the 3D CAD models of each subset group;

schedule and continuously arrange together, by the system, the 3D CAD models from at least one queue of the plurality of queues into batches of nested 3D CAD models fitting within at least one of: the printable area and the virtual bounding box of at least one of a 3D printing device of the plurality of 3D printing devices; and compile, by the system, the batches of sorted, scheduled, arranged and nested 3D CAD models into tray files wherein each tray file is associated with at least one 3D printing material and or at least one 3D printer device associated with the at least one 3D printing material.

3. The system of claim 1, wherein the processor-executable computing instructions are further configured to:

receive, by the system, in an order aggregating device, associated with the system, an aggregation of 3D CAD Model files each containing at least one geometry representing and corresponding to a Job and defined production criteria data corresponding to each Job;

analyze, by the system, each 3D CAD model file to obtain the dimensions of the initial orientation of each 3D CAD Model;

determine, by the system, an orientation of each 3D CAD Model minimizing the build time of each 3D CAD Model for each job in the order aggregation device and maximize productivity on available production resources;

re-orient, by the system, in response to the determination, the geometry of each 3D CAD Model file according to the previously determined orientation minimizing 3D Printer build time;

update, by the system, the 3D CAD model file in the system with the new orientation, in a manner maintaining the order/job and any user-defined production criteria linked within the system for downstream processing.

4. The system of claim 1, wherein the processor-executable computing instructions are further configured to:

receive, by the system, from the plurality of first users, a plurality of production capabilities for each first user, the plurality of production capabilities comprising at least one of: 3D printing device designations, 3D printing material specifications for each designated 3D printing device, a quantity of a designated 3D printing device, a bounding box of the designated 3D printing device, a printable area of each designated 3D printing device, a print speed of each designated printing device, or a process type of each printing device and wherein each first user represents a commercial user having production capabilities;

register and index, by the system, the production capabilities of each first user, received by the system, in a profile for each first user;

receive, by the system, from a plurality of first users and or second users, using user devices, an aggregation of 3D computer aided design (CAD) files each containing at least one 3D CAD model and corresponding production criteria collectively representing at least one order for a product, wherein each order represents one or more printing jobs;

parse, by the system, each 3D CAD model file associated with each order and corresponding production criteria to obtain a plurality of production requirements for each order, the production requirements comprising at least a user-defined material selection;

analyze, by the system, the production requirements of each printing job of each order received and the dimensions of each discrete 3D CAD model file associated with each job, wherein the dimensions define the initial orientation of each corresponding 3D CAD model;

determine and select, by the system, at least one indexed production resources, from the production capabilities, meeting the production requirements comprising at least one of: the size of each object for each printing job, the second-user-defined material selection and a determination of an orientation, minimizing the build time of a product from each 3D CAD model;

apply, by the system, the previously determined build orientation minimizing the build time, to each 3D CAD model file, for each corresponding job, by altering the initial orientation of the 3D CAD model to the computed build orientation minimizing build time and updating the 3D CAD Model file representing the order accordingly;

sort, by the system, based on the analysis and selection, each 3D CAD model into subset groups of 3D CAD Models based on indexed printer device specifications meeting the production requirements for each order comprising at least one of: first user or second user specified 3D printing material requirements, the bounding box of indexed 3D printing devices, the printable area of the indexed 3D printing devices, a print speed of indexed 3D printing devices, and a process type of indexed 3D printing devices;

schedule and continuously arrange together, by the system, the sorted subset groups of 3D CAD models into batches of 3D CAD Models, wherein each batch fits within at least one of: the printable area or the bounding box of the production resource selected by the system, wherein the scheduling subroutine manages the tradeoff of maximizing production capacity or optimizing delivery time and wherein the arranging subroutine is nesting of 3D CAD Models.

5. The system of claim 1, wherein the processor-executable computing instructions are further configured to:

receive, from a plurality of commercial users, using user devices, a request to establish, configure, or utilize the system;

generate and cause to be displayed, on the plurality of commercial users' devices, at least one display page comprising an input and configuration interface configured to receive inputs from the plurality of commercial users' user devices to establish, configure or utilize the system;

receive, from the plurality of commercial users' user devices, a plurality of production capabilities associated with each commercial user, representing one or more production facilities, the plurality of production capabilities comprising at least one of: 3D printing device designations, 3D printing materials for each designated 3D printing device, a quantity of a designated 3D printing devices, a bounding box of each designated 3D printing device, a printable area of each designated 3D printing device, a print speed for each designated printing device, a process type for each designated printing device, a geospatial location for each facility having the production equipment, or an available production capacity at each facility;

associate the plurality of production capabilities received, to each commercial user, representing at least one production facility for each commercial user, wherein the production capabilities are further stored and indexed in the system;

receive, by the system, from a plurality of first users and or second users, using user devices, an aggregation of 3D computer aided design (CAD) files each containing at least one 3D CAD Model and corresponding production criteria, including an address for physical delivery of the product and collectively representing at least one order for a product;

parse, by the system, each 3D CAD model file for each printing job associated with the order and corresponding production criteria to obtain an address for physical delivery of the product;

analyze, the production requirements of each 3D CAD Model and corresponding production criteria by parsing the production criteria to obtain the production requirements and then compare the requirements against indexed production resources;

select, by the system, based on the analysis, at least one indexed production resource meeting the production requirements and wherein the geospatial location of the production resource is proximal to the physical delivery address of the product; and transfer, by the system, the 3D CAD model files and production criteria corresponding to the jobs determined to be produced remotely, to at least one additional computing device, arranged to receive and accept the data stream for the jobs at the remotely located 3D printer facility.

6. The system of claim 5, wherein the processor-executable computing instructions are further configured to:

receive, by the system, from a first user, a DMS score threshold and a plurality of DMS score criteria comprising at least one of: previous on-time delivery, a subjective quality of product, defects found after receipt, on-time payment, or previously canceled orders;

receive, from a plurality of additional commercial users' user devices, a plurality of production capabilities associated with each commercial user, representing one or more production facilities;

establish, by the system, a baseline Distributed Manufacturing Score (DMS) for each of the plurality of additional commercial users establishing use of, and defining production resources within the system;

wherein the baseline DMS score established for each commercial user, is utilized by the system to, at least in part, determine if a geospatially located commercial user may receive production jobs from the first commercial user;

receive, by the system, from a plurality of first users and or second users, using user devices, an aggregation of 3D computer aided design (CAD) files each containing at least one 3D CAD Model and corresponding production criteria, including an address for physical delivery of the product and collectively representing at least one order for a product;

parse, by the system, each 3D CAD model file for each printing job associated with the order and corresponding production criteria to obtain an address for physical delivery of the product and indexed production resources;

analyze, the production requirements of each 3D CAD Model and corresponding production criteria by parsing the production criteria to obtain the production requirements and then compare the requirements against potential indexed production resources and the current DMS Scores of potential indexed production resources;

select, by the system, based on the determination, at least one indexed production resource meeting the production requirements, the geospatial location of the production resource relative to the physical delivery address of the product and the minimum acceptable current DMS score defined in the system;

transfer, in response to a determination that the DMS score of the remotely located printing facility meets or exceeds the DMS threshold, each 3D CAD model and corresponding production criteria associated with the order to the remotely located 3D printing facility to produce the product and make physical delivery;

request, from each user having previously submitted production jobs, subjective quality feedback based on the plurality of DMS score criteria defined in the system;

receive, from a plurality of user devices, representing customers of the first commercial user, feedback for previous outsourced production jobs produced by the plurality of 3D printing facilities, the feedback comprising responses to the DMS score criteria;

update, based on the feedback, the distributed manufacturing score (DMS) for the 3D printing facility receiving the previous production job for which feedback was provided and wherein the revised DMS score affects future orders to the production facility.

7. The system of claim 1, wherein the processor-executable computing instructions are further configured to electronically:

receive, by the system, from a merchant user device, a request to access an interface in order to establish, configure or utilize the system, the first user device being associated with a merchant user;

cause, by the system, at least one display page to be displayed on the merchant user device, the first display page being configured to receive inputs from the first merchant user device in order to configure the system and enabling the system to generate, at least portions of an electronic marketplace, on one or more website domains, the electronic marketplace operated by the first merchant and wherein the electronic marketplace is accessible over a communication network;

receive, by the system, from the merchant user device, at least one 3D CAD model file, wherein the 3D CAD Model is intended to be stored in a product catalog, represented by 3D CAD models;

generate and cause to be displayed, by the system, on the first user device, a second display page configured to receive inputs associated with product information for the 3D CAD model file, wherein the information comprises at least one of: product details, pricing information, transaction methods, pictures of the product and product shipping arrangements;

receive, by the system, from the first user device, product information for the at least one 3D CAD model file;

link and store, by the system, the at least one 3D CAD model file and the product information in the system, the 3D CAD Model and associated product information representing a base design for a product physically obtainable from the system;

receive, by the system, from a second user consumer device, a request to access the electronic marketplace operated by the first user, at least portions of which are generated by the system;

retrieve and cause to be displayed, by the system, a third display page on the second user consumer device, the third display page, displaying a catalog of available products from the first user merchant's marketplace comprising the at least one product defined by product information and the at least one 3D CAD Model file;

receive, from the second user, an input of a selection of a product displayed and available from the catalog;

retrieve and cause to be displayed, on the second user consumer device, at least portions of a fourth display page comprising information for the selected product and pictures of the product in a manner indicating that the product is available to be obtained from the system;

receive, from the second user consumer device, a request to obtain the product and production criteria comprising at least one of: a material selection, a scale of the product, a quantity of copies of the product and an address for physical delivery of the product;

generate, by the system, a copy of the 3D CAD Model file stored in the system and transfer the copy of the 3D CAD Model file to an order aggregation device associated with the system and the production criteria in a manner linking and associating the copy of the at least one 3D CAD Model and production criteria as a production job;

wherein the at least one computing device is additionally configured to:

receive requests from a plurality of first merchant users;

generate at least portions of a plurality of electronic marketplaces operated by each first merchant user;

enable a plurality of second customer users to access the plurality of electronic marketplaces operated by each first merchant user; and obtain products from the system generated by processing and converting the stored 3D CAD model files representing products, at least in part by additive manufacturing.

8. The system of claim 7, wherein the processor-executable computing instructions are further configured to:

receive, from a merchant user device or a $3^{rd}$ party product contributor, at least one 3D CAD Model file representing a base design for a product available from the electronic catalog operated by the merchant user and generated, at least in part, by the system;

prepare, by the system, at least one rendering of the at least one received 3D CAD model;

link and store, by the system, the rendering in a manner associating the rendering with the product and product information in the catalog;

receive, by the system, from a consumer user device, a request to access the electronic marketplace operated by the first user, at least portions of which are generated by the system;

retrieve and cause to be displayed, by the system, a first display page on the consumer user device, the first display page, displaying a catalog of available products from the first user merchant's marketplace comprising the at least one product defined by product information, the at least one 3D CAD Model file and the at least one rendering of the product;

receive, from the consumer user, an input of a selection of a product displayed and available from the catalog;

retrieve and cause to be displayed, on the consumer user device, at least portions of a second display page comprising information for the selected product and a representation of the one or more associated 3D CAD models linked and stored within the system, wherein the representation may include one or more pictures and one or more system generated renderings of the product; and wherein the system is configured to generate a plurality of renderings of each 3D CAD Model file uploaded to the system.

9. The system of claim 7, further comprising an electronic payment processing device including processor-executable instructions configured to electronically:

receive, from a merchant user device, a request to establish, configure or utilize the system;

generate and cause to be displayed, on the merchant user device, in response to the request, at least one display page comprising an input and configuration interface, accessible by the first user, at the first user device, enabling the merchant to configure payment options for use with the electronic marketplace portion of the system;

receive, by the system, from the merchant user device, payment option configuration information;

link and store the payment options associated with the merchant user in the system;

receive, from a consumer user device, by a consumer, a request to obtain a product represented by at least one 3D CAD model available in an electronic marketplace, the marketplace generated, at least in part by the system;

present, by the system, to the consumer at the consumer user device, a plurality of payment options previously configured by the merchant user; wherein receive, from the consumer user device, a selection of a payment option displayed, of the plurality of displayed payment options, the selection additionally comprising an address for physical delivery of the product;

process the selected payment option for approval;

receive, from a payment gateway, a notification of successful processing of the payment option;

generate, by the system, based on the payment gateway approval, a copy of the 3D CAD Model file stored in the system, representing the product selected;

transfer, by the system, the generated copy of the 3D CAD Model file to an order aggregation device associated with the system and the production criteria for the order, in a manner linking and associating the copy of the at least one 3D CAD Model and order production criteria as a production job;

generate, by the system, based on at least the payment gateway approval, at least one of: an order acknowledgement for the production job and an estimated time of production for the order;

cause, by the system, at least one of: an order acknowledgement for the production job and an estimated time of production for the order to be displayed on the consumer user device.

10. The system of claim 7, wherein the processor-executable computing instructions are further configured to:

receive, by the system, from a third-party contributor user device, at least one 3D CAD model files representing a base design for a product available from the electronic catalog operated by the first merchant user and wherein the 3D CAD Model is intended to be stored in a product catalog, represented by 3D CAD model;

generate and cause to be displayed, by the system, to the third-party contributor user device, a first display page configured to receive inputs associated with product information for the 3D CAD model file, wherein the information comprises at least one of: product details, pricing information, transaction methods, pictures of the product and product shipping arrangements;

receive, by the system, from the third-party contributor user device, product information for the at least one 3D CAD model file and a request to publish the product within the system, making the product available to a plurality of customer users of the merchant user;

link and store, by the system, the at least one 3D CAD model file and the product information in the system, the 3D CAD Model and associated product information representing a base design for a product physically obtainable from the system, in a manner associating the third-party user to the product;

publish, by the system, based on the request to publish, received from the third-party user, the at least one 3D CAD model and the associated product information to the electronic marketplace;

receive, from a consumer user device, by a consumer, a request to obtain a product represented by at least one 3D CAD model available in an electronic marketplace, the marketplace generated, at least in part by the system;

present, by the system, to the consumer at the consumer user device, a plurality of payment options previously configured by the merchant user; wherein receive, from the consumer user device, a selection of a payment option displayed, of the plurality of displayed payment options, the selection additionally comprising an address for physical delivery of the product;

process the selected payment option through the payment gateway for approval;

receive, from a payment gateway, a notification of successful processing of the payment option;

generate, by the system, based on the payment gateway approval, a copy of the 3D CAD Model file stored in the system, representing the product selected and transmit a commission to a third-party contributor of the crowdsourced content;

enabling a plurality of third-party contributor users to upload and publish 3D Cad Models and product information into the electronic marketplace operated by a first merchant user using the system and enabling the first merchant user to crowdsource content into the electronic marketplace for sale to a plurality of second-user customers.

11. The system of claim 7, wherein the processor-executable computing instructions are further configured to:

receive, by the system, from the first merchant user device, a second user manufacturer device, or a 3$^{rd}$ party contributor device, at least one 3D CAD model file representing a base design for a product;

generate and cause to be displayed, by the system, to the first merchant user device, second user manufacturer device or third-party contributor device, at least one display page comprising a traveler input and definition interface and a representation of the at least one 3D CAD model representing a base design for a product;

receive, by the system, from the first merchant user device, second user manufacturer device or third-party contributor device, a traveler feature configuration comprising: a designation of a traveler geometry type, a location of the traveler geometry position relative to the base 3D CAD model, an orientation defining the traveler geometry position relative to the base 3D CAD Model, and instructions defining the information to be converted into geometry by the system;

wherein the traveler geometry types include at least: a tab, break-away tab, sprue, placard, or direct part marking, wherein the information to be converted into geometry on the traveler feature comprises at least one of: a specific customer, an order number, a lot or batch code, a serial number, lot number, manufacturer's number, part number, location, timestamp, city, state, or zip code, or combinations thereof, wherein the form of the information generated on the traveler feature comprises a human or machine-readable representation of the unique identifier, taking the form at least one of: three-dimensional alpha-numeric characters, a three-dimensional representation of a barcode, a three-dimensional representation of two-dimensional data matrix, a hieroglyph, a logo, or other geometry;

link and store the defined and configured traveler feature for the corresponding 3D CAD model in the first data storage device;

receive, by the system, from a consumer user device, a request to obtain a product represented by at least one 3D CAD model physically available in from the system, the at least one 3D CAD Model having a defined and configured traveler feature;

convert, by the system, the previously designated traveler requirements into 3D geometry utilizing at least one of a 3D CAD kernel and or one or more approaches to Computer Aided Design;

compile, by the system, the 3D CAD model file into a finalized 3D CAD model file containing the traveler geometry and base 3D CAD model geometry;

transfer the finalized 3D CAD Model file to an order aggregation device associated with the system and the order production criteria in a manner linking and associating the copy of the at least one 3D CAD Model and production criteria as a production job; and wherein the traveler geometry is suppressed in the consumer user display and not suppressed in the finalized 3D CAD model file generated and routed for production.

12. The system of claim 7, wherein the processor-executable computing instructions are further configured to enable a method of co-design to electronically:

receive, by the system, from a first merchant user device, or a third-party contributor user device, at least one computer file containing at least one 3D CAD model representing a base design for a product;

generate and cause to be displayed, by the system, on the merchant user device, or the third-party contributor user device, at least one display page comprising an input and configuration interface, receive, by the system, from the first merchant user device, or a third-party contributor user device, a plurality of marketplace product information and optionally, at least one selection of a geometric modifier corresponding to an alteration of the geometric features of the base design;

receive, by the system, from the first merchant user device, or a third-party contributor user device, at least one of: a plurality of marketplace product information for publication in the electronic marketplace and at least one selection of a geometric modifier and a corresponding set of parameters for the geometric modifier, defining an alteration of the geometric shape of the 3D CAD Model base design;

wherein the graphically displayed geometric modifiers, within the interface, and input fields, correspond to system executable functions, using one or more approaches to 3D design or design implementation to alter geometric features of the base design for the product;

link and store, by the system, the at least one 3D CAD model file, product information the at least one defined geometric modifier and corresponding parameters, marketplace product information collectively representing a base design for a product physically obtainable from the system;

receive, by the system, from a consumer user device, a request to access the electronic marketplace operated by a first merchant user, at least portions of which are generated by the system;

retrieve, generate and cause to be displayed, by the system, at least portions of an electronic catalog of available products from the first merchant's user marketplace comprising the at least one product defined by product information, the at least one 3D CAD Model file and at least one defined geometric modifier;

receive, by the system, from the consumer user device, an input of a selection of a product displayed and available from the catalog;

retrieve, generate and cause to be displayed, on the consumer user device, at least portions of a second display page, indicating that the product is available to be obtained from the system, comprising at least a relational input/output and configuration interface having controls enabling configuration of the at least one previously defined geometric modifier and a representation of the 3D CAD model representing the base design of the product;

receive, by the system, from the customer user device, an optional selection of the at least one geometric modifier and corresponding set of options parameters and values defining an alteration of the geometric shape of the 3D CAD Model base design;

execute, by the system, any received inputs for the at least one geometric modifier, based on any input received from the consumer user device, generating a modified version of the 3D CAD Model based on the consumer user input, and updating the displayed design representation on the consumer user device;

receiving, by the system, from the consumer user device, using the second user device, a request to obtain the current configuration of the product currently displayed on the second user device and at least one of; a geospatial location for delivery of the physical product, a material selection, a scale or a quantity of copies of the product;

compiling, by the system, the current configuration of the 3D CAD Model File into a finalized 3D CAD Model File, in a manner linking the modified 3D CAD Model and consumer user-defined production criteria corresponding to the order for the product represented by compiled version of the modified 3D CAD model;

transferring, the compiled 3D CAD Model file to an order aggregation device associated with the system and the production criteria in a manner linking and associating the compiled 3D CAD Model and production criteria as a production job, treating the 3D CAD Model as the object being digitally routed for production by the system;

enabling the system to provide electronic commerce functionality adapted specifically for providing geometric co-design of products defined by a first merchant user or third-party contributor user and configured by a plurality of second consumer users; and wherein each modifier corresponds to a plurality of functions executable, to alter geometric features of the base design for the products by means of a 3D Kernel/engine.

13. The system of claim 7, wherein the processor-executable computing instructions are further configured for electronic 3D view data preparation to electronically:

receive, by the system, consumer user device, a selection of at least one product available in the electronic marketplace, the product represented by at least one manufacturable 3D CAD Model previously uploaded, indexed and stored in the system;

retrieve, generate and cause to be displayed, by the system, on the consumer user device, a display page comprising, at least in part, a web-compatible representation of the at least one 3D CAD Model representing the base design for the product stored the system;

enabling the user/customer, using the user device, to accurately visualize the digital representation of the physical product obtainable, from the system, manufactured, at least in part from the 3D CAD Model previously received, indexed and stored in the system;

wherein the at least one generated page may additionally include at least portions of an electronic marketplace, the electronic marketplace being configured for co-design between a first merchant user or third-party contributor and a plurality of second consumer users.

14. The system of claim 1, wherein the processor-executable computing instructions are further configured to comprise executable API subroutines definitions, protocols, and tools when invoked by an API-based command comprising;

a first network enabled physical computing device, having the Application Programming Interface arranged to listen for communication from a plurality of second physical computing devices, invoking one or more API subroutines to collaboratively perform the method of claim 1 to electronically;

receive, by the first physical computing device, from at least one second physical computing device at least one 3D computer aided design (CAD) file, containing at least one 3D CAD Model geometry representing and corresponding to a an order and production criteria data corresponding to the order, the production criteria comprising at least one of: a material selection, a scale of the product, a quantity of copies of the product and an address for physical delivery of the product;

link and store, by the first physical computing system, the at least one received 3D CAD model file and corresponding production criteria information in the system;

transfer the 3D CAD Model file to an order aggregation device associated with the first physical computing device and the production criteria in a manner linking and associating the at least one 3D CAD Model and production criteria as a production job in the first computing system for further processing;

wherein the first physical computing device is configured to receive one or more printing jobs of a plurality of printing jobs from one or more second physical computing devices or a plurality of second computing devices; and wherein the first physical computing device is configured to instruct at least one 3D printer device to produce the jobs utilizing the tray file data corresponding directly to the nested 3D CAD Model data, the 3D Printer device communicatively coupled to and arranged to receive the data from the system to do so.

15. The system of claim 1, wherein the processor-executable computing instructions are further configured to:

receive, by the system, from a first manufacturer user device, a second merchant user device or a third-party contributor device, at least one 3D CAD Model file containing multiple geometries where each geometry represents a component portion of an assembly;

generate and cause to be displayed, by the system, on a first manufacturer user device, a second merchant user device or a third party contributor device, an input and configuration interface comprising relational controls, represented graphically and a web-compatible representation of the 3D CAD Model assembly;

wherein the material designations for each geometry represent a sorting parameter for each portion of the 3D CAD Model assembly in downstream processing;

receive, by the system, from a first manufacturer user device, a second merchant user device or a third-party contributor device, a material selection for each discrete geometry comprising the assembly, in the 3D CAD model file and a request to physically obtain the product causing the system to initiate a process for manufacturing routines;

receive, at an order aggregation device, associated with at least one physical computing device, the 3D CAD file containing at least two distinct 3D CAD Model geometries and corresponding production criteria for the two distinct geometries in the file, the two 3D CAD model geometries each specifying at least a different material production criteria for each geometry;

parse, in response to the receiving of the 3D CAD Model at the order aggregation device, the production criteria for each 3D CAD Model geometry representing the order to obtain the production requirements for each component of the product, the production requirements comprising at least two distinct user-defined material selections and, a delivery address for the product;

analyzing, in response to the requests to obtain the products, user-defined material selections for each corresponding geometry of the 3D CAD Model received in the order aggregation device, representing a job utilizing the previously parsed user-specified order production requirements and available indexed production resources to sort and schedule corresponding 3D CAD Models into groups of 3D CAD Models for production on the available production resources based on the material specification for each geometry;

sort and assign, by the system, based on the parsed data and analysis, each discrete 3D CAD Model geometry from the assembly into material-based subset groups of 3D CAD Models based on and corresponding to the type of a 3D printing material specified for use in each corresponding portion of the 3D CAD Model geometry in a manner maintaining the relation of the two or more geometries of the assembly representing a job, making the data available for downstream processing; and wherein where each assembly geometry has defined, a user-defined material specification such that the system may make use of multiple types of Additive Fabrication hardware simultaneously or concurrently to manifest each component geometry of the assembly-based 3D CAD Model that comprise a product that is by design or by desire, necessary to be made of different materials and assembled from the various components, in this situation would be responsible for routing components that must be manifested out of differing materials to several or many local or remote locations for fabrication via Additive Fabrication process that supports fabrication of the desired or required material substance.

16. The system of claim 1, wherein the processor-executable computing instructions are further configured to:

receive, by the system, from a first manufacturer user device, a second merchant user device or a third-party contributor device, at least one 3D CAD Model file containing at least one 3D geometry, production criteria and a confirmation to process the uploaded 3D CAD model file for manufacturing;

wherein the production criteria comprises at least a selection of a previously indexed 3D Printing Material for production of the 3D CAD Model geometry;

parse, by the system, the data of the 3D CAD Model file, the production criteria material election and corresponding material properties for the selected material;

load, by the system, in a test environment, using at least a 3D CAD Kernel, the 3D CAD Model geometry and material properties;

analyze, in the test environment, using at least the 3D CAD Kernel to perform the analysis, the geometry of the 3D CAD Model to simulated responses to environmental factors to determine the performance of the part, produced in the selected 3D Printing material;

wherein the environmental factors comprise at least one of: material stress analysis and Finite Element Analysis;

generate and cause to be displayed, by the system, on the first manufacturer user device, second merchant user device or third-party contributor device, based on the analysis, an output comprising at least one of: a report of the test results, a first notification that the 3D CAD model is ineligible production, a second notification indicating that the at least one geometry does not meet the performance criteria required to be processed for manufacturing, a third notification that that the 3D CAD Model has been passed the test and a fourth notification that the 3D CAD Model has been routed for production by the system.

17. The computer-implemented system of claim 1, wherein the processor-executable computing instructions are further configured to comprise executable API subroutines definitions, protocols, and tools when invoked by an API-based command and an encryption engine comprising;
   the first network enabled physical computing device, having the Application Programming Interface and an encryption engine arranged to listen for communication from a plurality of second physical computing devices, invoking one or more API subroutines and the encryption engine to collaboratively perform the method of claim 1 to electronically;
   receive, by the first computing device, a request to establish, communication from at least one second computing device, the at least one second computing device having previously established an ability to communicate with and utilize the system;
   establish, by the first computing device, an encrypted communication link to the at least one second computing device;
   receive, by the first physical computing device, from at least one second physical computing device at least one 3D computer aided design (CAD) file, containing at least one 3D CAD Model geometry representing and corresponding to an order and production criteria data corresponding to the order, the production criteria comprising at least one of: a material selection, a scale of the product, a quantity of copies of the product and an address for physical delivery of the product;
      wherein at least some of the plurality of 3D CAD model files are associated with products for distributed manufacturing of wartime assets for forward battlefield manufacturing, shipboard manufacturing, or other military operations;
      wherein, the first computing device may additionally establish reciprocal encrypted communication to transfer production jobs from the first computing device to the at least one second computing device for remote manufacturing of products; and
      wherein at least some of the plurality of 3D CAD model files are associated with products for distributed manufacturing of wartime assets for forward battlefield manufacturing, shipboard manufacturing, or other military operations.

18. The system of claim 12, wherein the processor-executable computing instructions are further configured to include and adapt an executable Product Lifecycle Management System (PLM) and an executable Product Data Management System (PDM) adapted to electronically;
   receive, by the system, from a first merchant user device, or a third-party contributor user device, at least one 3D CAD Model file representing a base design for a product;
   generate and cause to be displayed, by the system, on the merchant user device, or the third-party contributor user device, at least one display page comprising an input and configuration interface;
   receive, by the system, from the first merchant user device, or the third-party contributor user device, with the intent to publish in the electronic marketplace, at least one of: a plurality of marketplace product information and at least one designation of a geometric modifier and a corresponding set of parameters for the geometric modifier, defining an alteration of the geometric shape of the 3D CAD Model base design;
   link and store, by the system, the at least one 3D CAD model file in the executable Product Lifecycle Management System (PLM) and the product information in the executable Product Data Management System (PDM), the 3D CAD Model and associated product information representing a base design for a product physically obtainable from the system;
   receive, by the system, from a second user consumer device, a request to access the electronic marketplace operated by first merchant user, at least portions of which are generated by the system;
   retrieve, generate and cause to be displayed, by the system, on the second user consumer device, at least one marketplace display page, displaying the merchants' catalog of available products retrieved from the PDM and PLM systems, comprising the at least one product defined by at least one 3D CAD Model file and product information from the PDM and PLM systems;
   receive, from the second consumer user device, an input of a selection of a product displayed and available from the catalog;
   retrieve, generate and cause to be displayed, by the system, on the second user consumer device, at least portions of a second marketplace display page, indicating that the product is available to be obtained from the system, comprising at least one of: product information a representation of the 3D CAD Model retrieved from the PDM & PLM systems and a relational input/output and configuration interface based on any previously defined geometric modifiers;
   receive, by the system, from the second user consumer device, at least one of: a selection and corresponding set of parameters for an alteration of the geometric shape of the base design of the product, a request to obtain the current configuration of the product currently displayed on the second user device, a geospatial location for delivery of the physical product, a material selection, a scale or a quantity of copies of the product;
   compile, by the system, the current configuration of the 3D CAD Model file into a finalized 3D CAD Model file, in a manner linking the modified 3D CAD Model and second user consumer defined production criteria corresponding to the order for the product;
   transfer, by the system, based on the request to obtain the product, the compiled 3D CAD Model file to an order aggregation device associated with the system and the production criteria, in a manner linking and associating the compiled 3D CAD Model and production criteria as a production job, treating the 3D CAD Model as the object being routed for production by the system;
   wherein the first-user defined, second-user editable geometric modification functions available in the marketplace comprise at least:
      3D text, on a surface of a base 3D CAD Model, the text being a first user-defined, second-user/editable option for the base product comprising a font selection by a font module, a location performed by a part mate module and a Boolean operation to append the base 3D CAD Model with the text geometry;
      a library of assembly-based panels or shanks or "clip art" for attaching or appending to the base 3D CAD Model with one or more subordinate components, as an additional feature to the base 3D CAD Model, creating an assembly;
      a displacement mapping function comprising a first-user defined region for displacement mapping and a second-user editable region converting a second-user provided 2D Raster image into 3D Geometry or topology utilizing an upload artwork module, the displacement mapping performed by the system, enabling 3D art to be generated on an area of the base 3D CAD model by 3D Displacement mapping;

geometric alteration functions for first-user defined, second-user customer configurable modification to the base 3D CAD Model comprising at least: an extrude function, an emboss function, a surface finish function a stretch/skew/smorf function and a texture map function for altering the geometry of the base 3D CAD model if enabled by the first user/merchant or 3$^{rd}$ party publisher;

a surface paint function for second-user customer configurable color application to the 3D CAD model surface within the browser; and a ring sizing function, for altering, by the system, by scaling, the geometry of a first user received and designated base 3D CAD Model of a ring to a second-user customer designated ring size to meet the ring size criteria, utilizing the 3D Kernel to do so.

19. A system adapting an electronic marketplace for on-demand fabrication of a product comprising:

at least one network enabled physical computing device having a memory, a processor, and at least one physical data storage device, the at least one physical data storage device arranged to store 3D CAD Models, the 3D CAD Models representing and corresponding to the digital representation of a product available from the system and wherein the at least one physical data storage device also contains processor-executable programming, configuring and enabling at least one computing device to electronically;

receive, from a first user device, at least one 3D CAD Model file, and product information pertaining to the product represented by the 3D CAD Model, the at least one 3D CAD Model representing a base design for a product available from the system;

receive, from a second user device, using a second user device a request to obtain the product, the product represented by the at least one 3D CAD Model stored in the system;

In response to a request to obtain the product, received from the second user, initiating a process for manufacturing routine to electronically cause a physical product to be produced, at least in part from the data describing the at least one 3D CAD Model, treating the 3D CAD Model as the object processed by the system;

wherein the physical computing device is further programmed to:

index and store a catalog of a plurality of 3D CAD models and corresponding product information, received by the system from a first user, in a manner for presentation in the electronic marketplace to plurality of second users;

enable a plurality of second users to access the electronic catalog of 3D CAD Model files through a website displaying the products represented by the 3D CAD models in the catalog and offering a means to physically obtain the product;

generate, by the system, copies of the at least one 3D CAD model representing each product, based on requests to physically obtain the products, transferring the copies of the 3D CAD Model files to the at least one order aggregation device;

analyze and verify the production requirements for each 3D CAD Model received at the order aggregation device;

analyze the received 3D CAD models to test for environmental performance based on at least one of: physical properties, part interference, strength of materials, price variations, mass, quantity, thread patterns, surface areas, mating surfaces, thermal properties, electrical properties, balance or other properties;

schedule and arrange together, by the system, the plurality of 3D CAD Models, received in the order aggregation device, into tray files, containing nested batches of the plurality of the 3D CAD Models, accept and receive any 3D CAD Model designed in a plurality of design software tools including 3C CAD Models having production criteria associated as meta-data relating to order requirements enabling the use of the information for production planning.

20. The computer-implemented system of claim 19, wherein the processor-executable computing instructions are further configured to enable the system, treating each 3D CAD Model as the object being processed, to electronically;

sort, each Job and its' corresponding 3D CAD Models into material-based subset groups of 3D CAD Models and assigning them to the queue of at least one of: an indexed 3D printer Printing material meeting at least the material requirements or an indexed 3D Printer Printing device having an associated 3D Printer Printing material queue;

determine the orientation of each 3D CAD Model minimizing the build time of the 3D CAD Model by instructing, at least the 3D CAD Kernel/Engine to analyze, determine and then to re-orient the geometry of each 3D CAD Model file according to the previously determined orientation minimizing 3D Printer build time in a manner keeping the 3D CAD model and user-defined order criteria linked;

schedule and arrange together a plurality of manufacturable 3D CAD Models in the production queues, within at least one of: the printable area or virtual bounding box of at least one of: a specified 3D Printer printing device and/or a 3D Printer printing device having a specified 3D Printing Material, until at least one of: the bounding box is completely occupied, maximizing the number of 3D CAD Models printable in a batch or reaching a pre-set limit based on criteria received from the commercial user;

generate batched tray files in an electronic printer queue for each respective 3D Printer Printing device and or material and or facility assigned and/or responsive to a request by at least one remote manufacturer, making the queued tray files available to the at least one remote manufacturer;

compile the data of now nested and packed 3D CAD models into a single computer file of re-oriented, arranged and nested 3D CAD Model geometries representing an optimized and scheduled batch of jobs from the queue, the compiled tray file itself being transfer to the at least one 3D Printer Printing Device specified for packing criteria operated by the at least one commercial user;

route the various manufacturable 3D CAD models, based on at least one of: production scheduling criteria, materials, geospatial location for physical delivery to the appropriate machines/facilities depending on defined parameters including at least one of: the maximum size (build envelope), available number of machines, printing speed or throughput or material science of the particular process;

transmit the tray files containing nested 3D CAD Model data to the respective 3D Printer Printing Device for production of products using and corresponding directly to the 3D CAD Model data by the selected at least one 3D printer printing device;

enable optional first-user-defined, second-user-configured co-design of the manufacturable 3D CAD Models, from the catalog in the web-based electronic marketplaces, prior to receiving a request to obtain the product;

enable commercial users to configure and utilize the system for local and optionally, remote manufacturing operations to analyze, sort, schedule and continuously arrange the plurality of 3D CAD Models adapted for Additive Manufacturing, treating each received 3D CAD Model as the object processed for manufacturing by the system;

generate web-compatible view data of the 3D CAD models for presentation within the marketplace web pages of second users comprising at least one of: a rendering or a rasterized rendering;

enable the generation and presentation, by the system, of at least portions of the catalog of 3D CAD Models in an electronic marketplace, accessed on the URL of at least one first merchant user using the electronic marketplaces operated by the commercial users;

generate websites operated by the commercial users and to request to obtain the products through the websites the products represented by the 3D CAD models in the cataloged in the system;

process payment prior to accepting requests to physically obtain the product represented by the at least one 3D CAD Model from the system;

enable optional performance of at least portions of the system through an Application Programming Interface (API); and continuously receive at a job aggregation device a plurality of 3D CAD Model files for production queuing.

\* \* \* \* \*